(12) United States Patent  
Ono

(10) Patent No.: US 7,098,716 B2  
(45) Date of Patent: Aug. 29, 2006

(54) DC OFFSET CANCELLATION CIRCUIT, DIFFERENTIAL AMPLIFICATION CIRCUIT WITH DC OFFSET CANCELLATION CIRCUIT, PHOTO-ELECTRIC PULSE CONVERSION CIRCUIT, PULSE SHAPING CIRCUIT, AND PULSE GENERATION CIRCUIT

(75) Inventor: Akihiko Ono, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/157,864

(22) Filed: Jun. 22, 2005

(65) Prior Publication Data

US 2005/0258885 A1  Nov. 24, 2005

Related U.S. Application Data

(60) Division of application No. 10/372,941, filed on Feb. 26, 2003, now Pat. No. 6,933,762, which is a continuation of application No. 10/041,593, filed on Jan. 10, 2002, now Pat. No. 6,549,054.

(30) Foreign Application Priority Data

Feb. 1, 2001 (JP) ............................... 2001-25649

(51) Int. Cl.  
*H03L 5/00* (2006.01)

(52) U.S. Cl. ........................................... 327/307; 330/9

(58) Field of Classification Search ............... 327/307, 327/363, 563, 514; 330/9  
See application file for complete search history.

(56) References Cited

U.S. PATENT DOCUMENTS

| 5,182,476 A | 1/1993 | Hanna et al. |
| 5,471,665 A | 11/1995 | Pace et al. |
| 5,648,738 A | 7/1997 | Welland et al. |
| 5,798,664 A | 8/1998 | Nagahori et al. |
| 6,005,431 A | 12/1999 | Mehr et al. |
| 6,288,604 B1 | 9/2001 | Shih et al. |
| 6,429,733 B1 | 8/2002 | Pagliolo et al. |
| 6,549,054 B1 * | 4/2003 | Ono ........................... 327/307 |
| 6,933,762 B1 * | 8/2005 | Ono ........................... 327/307 |

* cited by examiner

*Primary Examiner*—Kenneth B. Wells  
(74) *Attorney, Agent, or Firm*—Arent Fox PLLC

(57) ABSTRACT

A DC offset cancellation circuit that is capable of canceling a DC offset voltage occurring between a pair of differential output signals of a differential amplification circuit, while preventing a signal waveform from being distorted due to accumulation of AC components and a photo-electric pulse conversion circuit that is capable of generating an electrical pulse signal that accurately reproduces a rise timing and a fall timing of an optical pulse signal by canceling the DC offset voltage are provided. A photo-electric pulse conversion circuit is provided with a photodiode, an I–V conversion circuit, a first differential amplification circuit having a DC offset cancellation circuit, a second differential amplification circuit, a reference voltage generation circuit, and a comparison circuit. The DC offset cancellation circuit uses a changeover circuit to change a state of a low-pass filter with a hold function in synchronization with an inversion electrical pulse signal, and performs a negative feedback of a filtered signal which is generated by subjecting third differential signals to low-pass filtration or a hold filtered signal which is a filtered signal held during changeover.

8 Claims, 43 Drawing Sheets

CIRCUIT DIAGRAM SHOWING A PHOTO-ELECTRIC PULSE CONVERSION CIRCUIT ACCORDING TO A FIRST EMBODIMENT

FIG. 1  CIRCUIT DIAGRAM SHOWING A PHOTO-ELECTRIC PULSE CONVERSION CIRCUIT ACCORDING TO A FIRST EMBODIMENT

CIRCUIT DIAGRAM SHOWING A CIRCUIT CONFIGURATION OF A FUNCTION CHANGEOVER FILTER LPHS WITH LOW-PASS CHARACTERISTICS WHICH HAS A LOW-PASS FILTER WITH A HOLD FUNCTION LPH HAVING A HOLD FUNCTION AND A CHANGEOVER CIRCUIT SW

SCHEMATIC DIAGRAM SHOWING A RELATIONSHIP AMONG A NON-INVERSION OUTPUT SIGNAL V3P, AN INVERSION ELECTRICAL PULSE SIGNAL xRX, AND AN OFFSET CANCELLATION SIGNAL VOC ACCORDING TO THE FIRST EMBODIMENT

CIRCUIT DIAGRAM SHOWING A MIXING CIRCUIT THAT GENERATES A PAIR OF MIXED DIFFERENTIAL INPUT SIGNALS BY MIXING AN OFFSET CANCELLATION SIGNAL INTO A PAIR OF DIFFERENTIAL INPUT SIGNALS

SCHEMATIC DIAGRAM SHOWING A LOGIC CIRCUIT OF A LOGIC PROCESSING CIRCUIT HR AND AN OPERATION THEREOF

SCHEMATIC DIAGRAM SHOWING OPERATING STATES OF AN OPTICAL PULSE SIGNAL LT, THE INVERSION ELECTRICAL PULSE SIGNAL xRX, A CHANGEOVER PULSE SIGNAL xVC, AND THE LOW-PASS FILTER WITH A HOLD FUNCTION LPHS WHEN THE INVERSION ELECTRICAL PULSE SIGNAL IS INVERTED BY NOISE OR THE LIKE IN A CIRCUIT PROVIDED WITH THE LOGIC PROCESSING CIRCUIT HR

FIG. 7 CIRCUIT DIAGRAM SHOWING A PHOTO-ELECTRIC PULSE CONVERSION CIRCUIT ACCORDING TO A SECOND EMBODIMENT

CIRCUIT DIAGRAM SHOWING A CIRCUIT CONFIGURATION OF A LOW-PASS FILTER WITH A CHARACTERISTICS CHANGEOVER FUNCTION LPC HAVING LOW-PASS CHARACTERISTICS AND CAPABLE OF CHANGING A CUTOFF FREQUENCY AND A THROUGH RATE OF THE LOW-PASS CHARACTERISTICS

SCHEMATIC DIAGRAM SHOWING THE LOW-PASS
CHARACTERISTICS OF THE LOW-PASS FILTER WITH
THE CHARACTERISTICS CHANGEOVER FUNCTION LPC

SCHEMATIC DIAGRAM SHOWING A RELATIONSHIP AMONG SIGNALS IN DIFFERENT PARTS ACCORDING TO THE SECOND EMBODIMENT

FIG. 11

SCHEMATIC DIAGRAM SHOWING OPERATING STATES OF THE OPTICAL PULSE SIGNAL LT, THE INVERSION ELECTRICAL PULSE SIGNAL xRX, THE CHARACTERISTICS CHANGEOVER PULSE SIGNAL xVC, AND THE LOW-PASS FILTER WITH THE CHARACTERISTICS CHANGEOVER FUNCTION LPC WHEN THE INVERSION ELECTRICAL PULSE SIGNAL IS INVERTED BY NOISE OR THE LIKE IN A CIRCUIT PROVIDED WITH A LOGIC PROCESSING CIRCUIT LG1

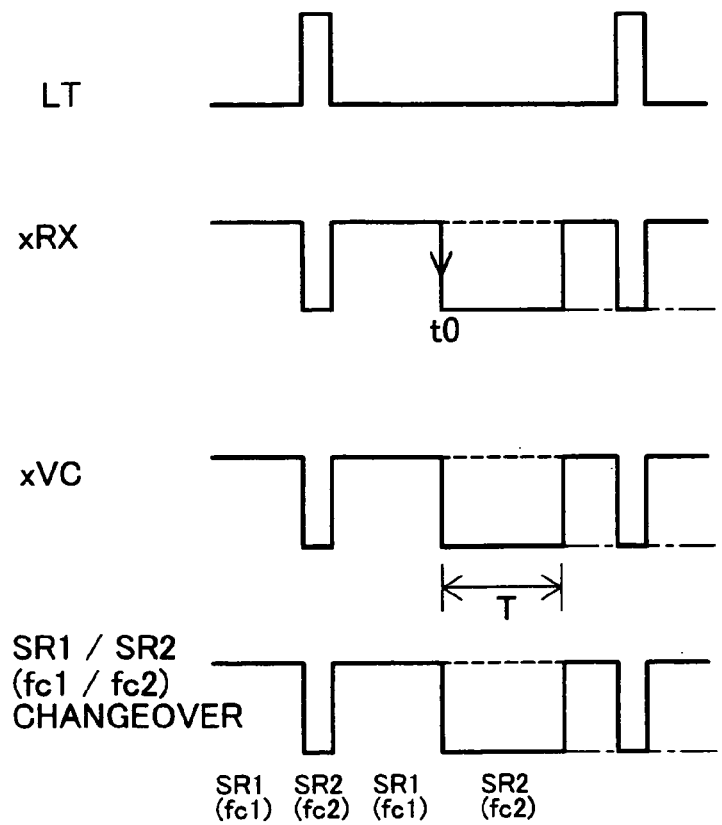

CIRCUIT DIAGRAM SHOWING A PHOTO-ELECTRIC PULSE CONVERSION CIRCUIT EMPLOYING A HIGH-PASS I-V CONVERSION CIRCUIT

FIG. 13 CIRCUIT DIAGRAM OF A PHOTO-ELECTRIC CONVERSION CIRCUIT ACCORDING TO A THIRD EMBODIMENT

CIRCUIT DIAGRAM SHOWING A CIRCUIT CONFIGURATION OF AN OFFSET ADDING SIGNAL GENERATION CIRCUIT OFS ACCORDING TO THE THIRD EMBODIMENT

CIRCUIT DIAGRAM SHOWING A CIRCUIT CONFIGURATION OF A DIFFERENTIATING DIFFERENTIAL AMPLIFICATION CIRCUIT DAMP ACCORDING TO THE THIRD EMBODIMENT

CIRCUIT DIAGRAM SHOWING A CIRCUIT CONFIGURATION OF A FIRST AND A SECOND COMPARISON CIRCUIT ACCORDING TO THE THIRD EMBODIMENT

SCHEMATIC DIAGRAM SHOWING A RELATIONSHIP AMONG A NON-INVERSION THIRD SIGNAL, AN INVERSION FOURTH SIGNAL, A NON-INVERSION FIFTH SIGNAL, AND AN INVERSION SIXTH SIGNAL, AND A RELATIONSHIP AMONG A SEVENTH SIGNAL, AN EIGHTH SIGNAL, AND AN INVERSION ELECTRICAL PULSE SIGNAL xRX WHEN A SMALL SIGNAL IS INPUTTED

SCHEMATIC DIAGRAM SHOWING A RELATIONSHIP AMONG A NON-INVERSION THIRD SIGNAL, AN INVERSION FOURTH SIGNAL, A NON-INVERSION FIFTH SIGNAL, AND AN INVERSION SIXTH SIGNAL, AND A RELATIONSHIP AMONG A SEVENTH SIGNAL, AN EIGHTH SIGNAL, AND AN INVERSION ELECTRICAL PULSE SIGNAL xRX WHEN A LARGE SIGNAL IS INPUTTED

CIRCUIT DIAGRAM SHOWING A LOGIC CIRCUIT OF A LOGIC PROCESSING CIRCUIT LGC

FIG. 20 CIRCUIT DIAGRAM SHOWING A LOGIC CIRCUIT OF AN IMPROVED LOGIC PROCESSING CIRCUIT LGC2

SCHEMATIC DIAGRAM SHOWING A CIRCUIT CONFIGURATION OF A DELAY CIRCUIT IN THE LOGIC PROCESSING CIRCUIT LGC2 AND OPERATIONS THEREOF

SCHEMATIC DIAGRAM SHOWING ANOTHER CIRCUIT CONFIGURATION OF THE DELAY CIRCUIT IN THE LOGIC PROCESSING CIRCUIT LGC2 AND OPERATIONS THEREOF

SCHEMATIC DIAGRAM SHOWING AN OPERATION WHEN AN SR LATCH (FILP - FLOP) INHIBIT LOGIC IS INPUTTED IN THE LOGIC PROCESSING CIRCUIT LGC2

CIRCUIT DIAGRAM SHOWING A LOGIC CIRCUIT OF ANOTHER LOGIC PROCESSING CIRCUIT LGC3, IN WHICH A MEASURE OF THE SR LATCH INHIBIT LOGIC HAS BEEN TAKEN

SCHEMATIC DIAGRAM SHOWING AN OPERATION WHEN A SEVENTH SIGNAL IS INPUTTED DUE TO NOISE OR THE LIKE IN THE LOGIC PROCESSING CIRCUIT LGC2

CIRCUIT DIAGRAM SHOWING A LOGIC CIRCUIT OF ANOTHER LOGIC PROCESSING CIRCUIT LGC4, IN WHICH A MEASURE HAS BEEN TAKEN AGAINST A MALFUNCTION OF THE SEVENTH SIGNAL

CIRCUIT DIAGRAM SHOWING A LOGIC CIRCUIT OF ANOTHER LOGIC PROCESSING CIRCUIT LGC5 THAT ALLOWS AN SR LATCH CIRCUIT (FLIP - FLOP) TO BE RESET

FIG. 28 CIRCUIT DIAGRAM SHOWING A CIRCUIT CONFIGURATION OF AN OFFSET – ADDED SIGNAL GENERATION CIRCUIT OFS2 THAT ALLOWS A RESISTANCE VALUE TO BE CHANGED

FIG. 29 CIRCUIT DIAGRAM SHOWING A CIRCUIT CONFIGURATION OF AN OFFSET – ADDED SIGNAL GENERATION CIRCUIT OFS2 THAT ALLOWS A RESISTANCE VALUE TO BE SELECTED

FIG. 30 CIRCUIT DIAGRAM SHOWING A PHOTO-ELECTRIC PULSE CONVERSION CIRCUIT ACCORDING TO A FOURTH MODIFICATION EMPLOYING CAPACITIVE COUPLING

CIRCUIT DIAGRAM SHOWING A LOGIC CIRCUIT OF A LOGIC PROCESSING CIRCUIT xLGC THAT PERFORMS LOGIC PROCESSING ON THE INVERSION SEVENTH SIGNAL AND THE INVERSION EIGHTH SIGNAL

CIRCUIT DIAGRAM SHOWING A LOGIC CIRCUIT OF A LOGIC PROCESSING CIRCUIT xLGC1, IN WHICH A MEASURE OF THE xSxR LATCH (FLIP - FLOP) INHIBIT LOGIC HAS BEEN TAKEN

CIRCUIT DIAGRAM SHOWING A LOGIC CIRCUIT OF A LOGIC PROCESSING CIRCUIT xLGC2, IN WHICH A MEASURE HAS BEEN TAKEN AGAINST A MALFUNCTION OF THE INVERSION SEVENTH SIGNAL

CIRCUIT DIAGRAM SHOWING A LOGIC CIRCUIT OF A LOGIC PROCESSING CIRCUIT xLGC3 THAT ALLOWS AN xSxR LATCH (FLIP – FLOP) CIRCUIT TO BE RESET

CIRCUIT DIAGRAM SHOWING A PHOTO-ELECTRIC PULSE CONVERSION CIRCUIT ACCORDING TO RELATED ART 1

SCHEMATIC DIAGRAM SHOWING CHANGES IN A NON-INVERSION VOLTAGE SIGNAL V1P OF AN I-V CONVERSION CIRCUIT

SCHEMATIC DIAGRAM SHOWING A RELATIONSHIP AMONG AN OUTPUT VO OF A SECOND DIFFERENTIAL AMPLIFICATION CIRCUIT AMP2, A REFERENCE VOLTAGE REF, AND AN INVERSION ELECTRICAL PULSE SIGNAL xRX

SCHEMATIC DIAGRAM SHOWING CHANGES IN OUTPUTS
OF A FIRST DIFFERENTIAL AMPLIFICATION CIRCUIT AMP1,
OR THIRD DIFFERENTIAL SIGNALS V3P, V3M, AND
AN OFFSET CANCELLATION VOLTAGE VOC

CIRCUIT DIAGRAM SHOWING A PHOTO-ELECTRIC PULSE CONVERSION CIRCUIT ACCORDING TO RELATED ART 2

SCHEMATIC DIAGRAM SHOWING CHANGES IN AN OPTICAL PULSE SIGNAL LT, A CURRENT SIGNAL Iin, AN OUTPUT OF A DIFFERENTIATING I-V CONVERSION CIRCUIT DIV OR A NON-INVERSION VOLTAGE SIGNAL VD1P, OUTPUTS OF A DIFFERENTIAL AMPLIFICATION CIRCUIT AMP OR THIRD DIFFERENTIAL SIGNALS V3P, V3M, AND AN OFFSET CANCELLATION VOLTAGE VOC

CIRCUIT DIAGRAM SHOWING A PHOTO-ELECTRIC PULSE CONVERSION CIRCUIT ACCORDING TO RELATED ART 3

SCHEMATIC DIAGRAM SHOWING A RELATIONSHIP BETWEEN DIFFERENTIAL SIGNALS VD3P, VD3M TO WHICH AN OFFSET VOLTAGE VOS HAS BEEN ADDED AND THE INVERSION ELECTRICAL PULSE SIGNAL xRX

SCHEMATIC DIAGRAM SHOWING A RELATIONSHIP BETWEEN DIFFERENTIAL SIGNALS VD3P, VD3M TO WHICH A HYSTERESIS VOLTAGE Vh HAS BEEN ADDED BY A COMPARISON CIRCUIT CMP AND THE INVERSION ELECTRICAL PULSE SIGNAL xRX

SCHEMATIC DIAGRAM SHOWING A RELATIONSHIP BETWEEN DIFFERENTIAL SIGNALS VD3P, VD3M AND THE INVERSION ELECTRICAL PULSE SIGNAL xRX WHEN THE INVERSION ELECTRICAL PULSE SIGNAL xRX HAS BEEN INVERTED (LOW LEVEL) SINCE THE BEGINNING

DC OFFSET CANCELLATION CIRCUIT, DIFFERENTIAL AMPLIFICATION CIRCUIT WITH DC OFFSET CANCELLATION CIRCUIT, PHOTO-ELECTRIC PULSE CONVERSION CIRCUIT, PULSE SHAPING CIRCUIT, AND PULSE GENERATION CIRCUIT

This is a Division of U.S. Pat. application Ser. No. 10/372,941, now U.S. Pat. No. 6,933,762, filed Feb. 26, 2003, which in turn is a Continuation Application of Parent U.S. patent application Ser. No. 10/041,593, now U.S. Pat. No. 6,549,054, filed Jan. 10, 2002. The disclosure of the prior application(s) is hereby incorporated by reference herein in its entirety.

BACKGROUND OF THE INVENTION

1. Field of the Invention

The present invention relates to a DC offset cancellation circuit that cancels a DC offset voltage occurring between a pair of complementary differential output signals outputted from a differential amplification circuit, a differential amplification circuit with a DC offset cancellation circuit, and a photo-electric pulse conversion circuit that uses the differential amplification circuit capable of DC offset cancellation to convert an optical pulse signal to a corresponding electrical pulse.

Alternatively, it relates to a pulse shaping circuit that generates a shaped pulse signal whose logic changes in a manner similar to a rise and a fall of a base square-wave pulse signal, a pulse generation circuit that uses this pulse shaping circuit, and a photo-electric pulse conversion circuit that uses the pulse shaping circuit to convert an optical pulse signal to a corresponding electrical pulse.

2. Description of Related Art (Related Art 1)

In a differential amplification circuit that amplifies an input signal and outputs a pair of differential output signals, a difference in reference voltages (hereinafter referred to also as a DC offset voltage) occurring between a pair of complementary differential output signals outputted from the differential amplification circuit, namely, between a non-inversion output signal and an inversion output signal presents at times a problem. Therefore, a differential amplification circuit provided with a DC offset cancellation circuit that cancels the DC offset voltage is proposed.

A photo-electric pulse conversion circuit 10 shown in FIG. 35 will be explained as an example. The photo-electric pulse conversion circuit 10 converts an optical pulse signal LT to an electrical pulse signal xRX. For example, it is used as a receiving circuit in IrDA communications and transmits an inversion electrical pulse signal xRX to a demodulator circuit at a later stage.

When it is used in such optical communications, the distance from a transmitter circuit (a light source) to a receiving circuit (photodiode PD) is not constant, and therefore there are various conditions. In some cases, the received optical pulse signal LT is very feeble due to a long distance, and in other cases, the received signal LT is extremely strong due to a short distance. As a result, a current input signal fluctuates from scores of nA to several mA which is several hundred times as large as the scores of nA. Even in such cases, it is necessary to reliably receive the optical pulse signal, to shape the waveform while accurately maintaining a pulse width thereof, and to send the resultant signal to the demodulator circuit at a later stage.

In the photo-electric pulse conversion circuit 10, when the photodiode PD receives the optical pulse signal LT that rises at a second timing t2 and falls at a first timing t1, a pulsating current signal Iin flows according to the intensity of the light. An I–V conversion circuit IV converts this current signal Iin to a pair of complementary differential voltage signals, namely, a non-inversion voltage signal V1P that is in the same phase as the optical pulse signal LT and the current signal Iin and an inversion voltage signal V1M that is complementary thereto and outputs these signals. The waveforms of the differential voltage signals V1P, V1M when a large signal is inputted are slightly different from those when a small signal is inputted as shown in FIG. 36. When a small signal is inputted, the current signal Iin of the photodiode PD having a pulse width tpw that nearly corresponds to the optical pulse signal LT is obtained. When a large signal is inputted, however, the waveform has a dull rising edge and a dull falling edge though it has a generally square shape. This is because the electrical signal fails to accurately follow changes in the optical input. Particularly, since the falling edge after the first timing t1 falls slowly, the non-inversion voltage signal V1P also falls slowly as shown in FIG. 36.

The differential voltage signals V1P, V1M are then amplified by a first differential amplification circuit AMP1 provided with a DC offset cancellation circuit OFC indicated by dashed lines in FIG. 35 and a second differential amplification circuit AMP2. Then, as shown in FIG. 37, a reference voltage VREF according to an output VO of the amplifier is generated by a reference voltage generation circuit REFG and both signals are compared with each other by a comparison circuit CMP to obtain an inversion electrical pulse signal xRX which has the pulse width tpw corresponding to the optical pulse signal LT and which falls at the second timing t2 and rises at the first timing t1.

More specifically, an offset adding circuit (mixing circuit) OFP is used to mix the offset cancellation voltage VOC into the differential voltage signals V1P, V1M such that a negative feedback is performed, thereby generating second differential signals V2P, V2M which are amplified by the first differential amplification circuit AMP1 to output third differential signals V3P, V3M. In the DC offset cancellation circuit OFC, the third differential signals V3P, V3M are filtered by a low-pass filter LPF having characteristics of a cutoff frequency fc1 and a through rate SR1 to obtain the offset cancellation voltage VOC. Since the DC offset voltage occurring between the third differential signals V3P and V3M is negatively fed back in this manner, the DC offset voltage between the differential output terminals of the differential amplification circuit AMP1 can be canceled. If a DC offset voltage exists, an output VO from the second differential amplification circuit AMP2 fluctuates causing the pulse width obtained in the comparison circuit CMP to fluctuate. Thus, the pulse width of the inversion electrical pulse signal xRX obtained may become different from the optical pulse signal. By canceling the DC offset voltage, however, the inversion electrical pulse signal xRX having the pulse width tpw which accurately corresponds to the optical pulse signal can be obtained.

To obtain the inversion electrical pulse signal xRX having the accurate pulse width tpw, it is necessary to give the reference voltage VREF an appropriate time constant according to the magnitude of the output VO.

(Related Art 2)

It is possible to employ a differential amplification circuit provided with a DC offset cancellation circuit in the same manner also in a photo-electric pulse conversion circuit 20 with another configuration (see FIG. 39).

The photodiode PD receives the optical pulse signal LT that rises at the second timing t2 and falls at the first timing t1 to provide the current signal Iin also in this photo-electric pulse conversion circuit 20. However, the photo-electric pulse conversion circuit 20 uses, instead of the I–V conversion circuit IV, a differentiating I–V conversion circuit DIV to convert a waveform of the current signal Iin to a pair of complementary differential voltage signals VD1P, VD1M whose waveforms are similar to a differentiated waveform of the current signal Iin. The differential voltage signals VD1P, VD1M are then amplified by the differential amplification circuit AMP provided with the offset cancellation circuit OFC to output third differential signals VD3P, VD3M. The third differential signals VD3P and VD3M are compared with each other by the comparison circuit CMP and the inversion electrical pulse signal xRX is obtained.

In the photo-electric pulse conversion circuit 20, the differential voltage signals VD1P, VD1M whose waveforms are similar to a differentiated waveform of the current signal Iin are obtained, and are then amplified. A third differential signal VD3P and a third differential signal VD3M that sharply fall or rise at the first or the second timing t1, t2 are compared. It is therefore possible to accurately reproduce the pulse width tpw of the optical pulse signal LT in the obtained inversion electrical pulse signal xRX. In addition, the circuit has the advantage that there is no need of separately using the reference voltage generation circuit REFG to generate the reference voltage VREF according to the output VO as in related art 1 (see FIG. 35).

A DC offset voltage VOS of a small value may be added in the comparison circuit CMP to prevent a malfunction caused by noise.

(Related Art 3)

In the circuit shown in related art 2 (see FIG. 39), the pulse signal is once differentiated to obtain the differential signals, and using these differential signals, a pulse signal having the same pulse width as the original pulse signal is obtained. As a circuit of the same type, a photo-electric pulse conversion circuit 30 shown in FIG. 41 may be configured.

Namely, in the photo-electric pulse conversion circuit 30, the optical pulse signal LT that rises at the second timing t2 and falls at the first timing t1 is received by the photodiode PD and the current signal Iin is obtained. Then, the current signal Iin is converted to the corresponding voltage signal V1 and the resultant voltage signal is outputted by the I–V conversion circuit IV. The voltage signal V1 is then amplified by the differential amplification circuit AMP. Thereafter, a differentiating differential amplification circuit DAMP is used to differentiate and amplify the second differential signals V2P, V2M to output third differential signals VD3P, VD3M. In addition, an offset voltage VOS of a small value is added so that the reference voltage of the third non-inversion signal VD3P is relatively lower than the reference voltage of the third inversion signal VD3M. These third differential signals VD3P, VD3M are then compared with each other by the comparison circuit CMP to obtain the inversion electrical pulse signal xRX that falls at the second timing t2 and rises at the first timing t1. As mentioned above, the purpose of adding the offset voltage VOS is to prevent a malfunction caused by noise.

The current signal Iin and the voltage signal V1 have slightly dull waveforms that gradually fall after the first timing t1 (see FIG. 36) also in the photo-electric pulse conversion circuit 30. However, since the third differential signals VD3P, VD3M that sharply rise or fall at the first or the second timing t1, t2 are compared to obtain the inversion electrical pulse signal xRX, it is possible to accurately reproduce the pulse width tpw of the optical pulse signal LT in the inversion electrical pulse signal xRX. Furthermore, the circuit has the advantage that there is no need of separately using the reference voltage generation circuit REFG to generate the reference voltage VREF according to the output VO as in the circuit 10 shown in related art 1 (FIG. 35).

In the photo-electric pulse conversion circuit 10 of related art 1, however, the low-pass filter LPF with the cutoff frequency fc1 is used to provide a negative feedback control of the DC offset voltage. Therefore, not only DC components, but also low-frequency components of AC components contained in the pulse signal waveform are fed back. Namely, as shown in FIG. 38(a), if the DC offset voltage DCO exists between the third differential signals V3P and V3M of the first differential amplification circuit AMP1 and is negatively fed back, DC cancellation components are contained in the offset cancellation voltage VOC outputted from the low-pass filter LPF as shown in FIG. 38(b) and they function to cancel the DC offset voltage DCO. However, since the low-frequency AC components also pass through the low-pass filter LPF as mentioned above, the low-frequency AC components are also superposed on the offset cancellation voltage VOC as shown in FIG. 38(b).

The magnitude of these AC components contained in the offset cancellation voltage VOC gradually increases during a second period d2 from the second timing t2 to the first timing t1. During a first period d1 from the first timing t1 to the second timing t2, it gradually decreases to return to an original zero level which is maintained. This is because the AC components are contained in the second period d2 as can be easily understood from FIG. 38(a). The gradient of the graph showing the offset cancellation voltage VOC corresponds to the characteristics of the low-pass filter LPF (the cutoff frequency and the through rate), and the increasing gradient and the decreasing gradient become almost the same.

If the second period d2 is longer than the first period d1 as shown in FIG. 38(c), the AC components contained in the offset cancellation voltage VOC cannot decrease in the first period by the amount increased in the second period. As a result, the AC components contained in the offset cancellation voltage VOC gradually accumulate as shown in FIG. 38(d) (in this example, they gradually increase). Therefore, as a result of accumulated AC components being negatively fed back, the waveforms of the third differential signals V3P and V3M as the output from the first differential amplification circuit AMP1 are distorted. This could result in a malfunction or other problem when the inversion electrical pulse signal xRX is obtained in the comparison circuit CMP. Moreover, as AC components accumulate, the waveforms are distorted so as to gradually shift downward, and approach an upper limit value or a lower limit value of the third differential signals V3P, V3M. As a result, the dynamic range may become small and the signal amplitude may become small, and in extreme cases, the third differential signals V3P, V3M may disappear.

On the other hand, in the photo-electric pulse conversion circuit 20 according to related art 2, the current signal Iin as shown in FIG. 40(b) flows through the photodiode PD when receiving the optical pulse signal LT with the pulse width tpw as shown in FIG. 40(a). FIG. 40(b) shows a case in which a large optical pulse signal LT with a high intensity is inputted. In the first period d1, the current signal Iin forms a gradually decreasing long tail. The signal is then subjected to differentiation and I–V conversion performed by the differentiating I–V conversion circuit DIV to obtain the non-inversion voltage signal VD1P shown in FIG. 40(c) and the inversion voltage signal VD1M. These signals are then amplified by the differential amplification circuit AMP to obtain the third differential signals VD3P, VD3M [see FIG. 40(d)]. In this example, the amplitudes of the amplified third differential signals VD3P, VD3M are limited by the upper limit value or the lower limit value in the second period d2 and the first half of the first period d1. As a result, their waveforms are not similar to the waveform of the non-inversion voltage signal VD1P shown in FIG. 40(c). Unlike the photo-electric pulse conversion circuit 10 [see FIGS. 37(a) and (c)], this circuit employs a differentiated waveform and therefore the non-inversion voltage signal VD1P swings to the positive and negative directions (upward and downward) with respect to the reference voltage.

The low-pass filter LPF with the cutoff frequency fc1 (through rate SR1) is used also in the photo-electric pulse conversion circuit 20 according to related art 2. Therefore, not only the DC components but also the low-frequency components of the AC components are fed back. That is, the AC components are superposed on the offset cancellation voltage VOC.

The magnitude of the AC components contained in the offset cancellation voltage VOC gradually increases in the second period d2 from the second timing t2 to the first timing t1 as shown in FIG. 40(e) and gradually decreases in the first period d1 from the first timing t1 to the second timing t2. Unlike the photo-electric pulse conversion circuit 10 [see FIG. 38(b)], however, it continues decreasing in the first period d1. The gradient of the graph showing the offset cancellation voltage VOC corresponds to the characteristics of the low-pass filter LPF (the cutoff frequency and the through rate), and the increasing gradient and decreasing gradients become almost the same.

If the first period d1 is not equal to the second period d2 (if the duty ratio of the pulse is not 50%), the offset cancellation voltage VOC gradually fluctuates. If d1>d2 as shown in FIG. 40, for example, the AC components contained in the offset cancellation voltage VOC gradually accumulate, causing the offset cancellation voltage VOC to gradually diminish as shown in FIG. 40(e).

As a result, the third differential signals VD3P, VD3M of the differential amplification circuit AMP are distorted and the third non-inversion signal VD3P approaches the upper limit value as shown in FIG. 40(f), for example. Therefore, a malfunction may occur when obtaining the inversion electrical pulse signal xRX in the comparison circuit CMP. Moreover, the waveforms approach the upper limit value or the lower limit value of the third differential signals VD3P, VD3M. As a result, the dynamic range may become small and the signal amplitude may become small and, in extreme cases, the third differential signals VD3P, VD3M may become disappear.

In the photo-electric pulse conversion circuit 30 according to related art 3, when the pulse width tpw of the base pulse signal, that is, the optical pulse signal LT becomes long, the gradually downward-going third non-inversion signal VD3P and the gradually upward-going third inversion signal VD3M can cross at a time tx after the second timing t2 as shown in FIG. 42. Then, the inversion electrical pulse signal xRX which is the output of the comparison circuit CMP is inverted. Therefore, as shown in the lower part of FIG. 42, there arises a problem that the pulse width of the inversion electrical pulse signal xRX, which should rise at the first timing t1, becomes shorter. Particularly, the pulse width tends to become shorter when the offset voltage VOS is made greater in an attempt to prevent a malfunction caused by noise.

If the comparison circuit CMP is given hysteresis characteristics (hysteresis voltage Vh) so as to satisfy Vh>VOS as shown in FIG. 43, the third non-inversion signal VD3P and the third inversion signal VD3M do not cross between the second timing t2 and the first timing t1, and thus the correct pulse width tpw is obtained in the inversion electrical pulse signal xRX.

In the case where an arrangement is made to satisfy Vh>VOS as described above and once the third inversion signal VD3M becomes smaller than the third non-inversion signal VD3P when the circuit is started or noise intrudes, the inversion electrical pulse xRX which is the output of the comparison circuit CMP is inverted, that is, the level of the inversion electrical pulse xRX becomes LOW level as shown in FIG. 44. This also causes the same effect as relatively decreasing the third non-inversion signal VD3P by the amount equal to hysteresis voltage Vh. Since the third inversion signal VD3M becomes smaller than the third non-inversion signal VD3P, the inversion electrical pulse signal xRX is fixed to LOW level even after the noise has disappeared and the inversion electrical pulse signal xRX does not fall at the second timing t2. It thereafter returns to HIGH level at the first timing t1. In this case, therefore, the optical pulse signal has not been properly received.

Thus, in the photo-electric pulse conversion circuits 20, 30 according to related arts 2, 3, it is difficult to prevent a malfunction due to noise or the like by setting the offset voltage VOS and the hysteresis voltage Vh to adequate values simultaneously.

SUMMARY OF THE INVENTION

In view of the problems arising from related arts 1, 2, it is an object of the invention to provide a DC offset cancellation circuit which is capable of canceling a DC offset voltage occurring between differential output signals of a differential amplification circuit, while preventing a signal waveform from being distorted due to accumulation of AC components, and a photo-electric pulse conversion circuit which is capable of generating an electrical pulse signal that accurately reproduces a rise and a fall timing of an optical pulse signal by canceling the DC offset voltage occurring between the differential output signals of the differential amplification circuit.

In addition, in view of the problems arising from related arts 2, 3, it is an object of the invention to provide a pulse shaping circuit which is capable of obtaining a non-inversion shaped pulse signal or an inversion shaped pulse signal that sharply rises or falls at a rise timing (a second timing) or a fall timing (a first timing) of a base pulse signal and accurately reproduces a pulse width of the base pulse signal, and in which less malfunctions are caused by noise or the like, and a photo-electric pulse conversion circuit which is capable of generating an electrical pulse signal that accurately reproduces a pulse width of an optical pulse signal.

The means for solving the problems according to a first aspect of the invention is a DC offset cancellation circuit which is inserted between a pair of differential output terminals and a pair of differential input terminals of a differential amplification circuit that amplifies a pair of differential input signals inputted to the differential input terminals and outputs a pair of differential output signals from the differential output terminals, and which cancels a DC offset voltage between the differential output signals. It is provided with a low-pass filter which performs low-pass filtration on the inputted differential output signals to output a filtered signal, a hold circuit which outputs a hold filtered signal instead of the filtered signal of the low-pass filter, and which outputs the hold filtered signal corresponding to the filtered signal of the low-pass filter at the time of changing the filtered signal to the hold filtered signal, a mixing circuit that outputs a pair of mixed differential input signals, which are generated by mixing the filtered signal or the hold filtered signal into the differential input signals such that a negative feedback is performed, to the differential input terminals of the differential amplification circuit, and a changeover circuit that alternately performs changeover to a filtering state in which the differential output signals are inputted to the low-pass filter and the filtered signal is outputted to the mixing circuit, and changeover to a hold state in which an input of the differential output signals to the low-pass filter are cut off and the hold filtered signal is outputted to the mixing circuit.

As explained in related arts 1, 2, when a configuration is made such that the DC offset voltage is negatively fed back using the low-pass, not only the DC offset voltage but also the AC components contained in the differential output signals, particularly the low-frequency components pass through the low-pass filter LPF and are negatively fed back to the differential input terminals. As a result, there may arise a problem that AC components gradually accumulate, the output signals are distorted, and the dynamic range of the output signals become small, and in extreme cases, the output signals disappear depending on the waveform and duty ratio of the input signal.

According to the invention, the hold circuit and the changeover circuit are provided in addition to the low-pass filter and the mixing circuit. By performing changeover between the low-pass filter and the hold circuit at a predetermined timing according to the signal waveform, it is possible to cancel DC offset, while preventing AC components from being accumulated. Specifically, for a period during which no or few AC components are contained in the signal, the low-pass filter is selected to perform DC offset cancellation. For a period during which many AC components are contained in the signal, on the other hand, the input to the low-pass filter is cut off to reduce effects of AC components on the low-pass filter, the negative feedback by the low-pass filter is stopped, and the hold circuit is selected to perform DC offset cancellation at the same level as that before the hold circuit is selected, while preventing AC components from being accumulated. More specifically, in terms of a signal inputted to the non-inversion input terminal of the differential amplifier, if a pulse signal having HIGH level and LOW level alternately or a signal including a train of signals with intermittent no-signal (LOW-level) periods therebetween is inputted, the low-pass filter is selected for the period during which a signal has LOW level or no signals exist, and the hold circuit is selected for the period during which a signal has HIGH level or a train of signals exists. Thus, AC components are effectively prevented from being accumulated.

It is preferable that the DC offset cancellation circuit according to the first aspect of the invention be a differential amplification circuit provided with a DC offset cancellation circuit inserted between the differential output terminal and the differential input terminal of the differential amplification circuit.

According to the differential amplification circuit provided with the DC offset cancellation circuit, since the DC offset cancellation circuit is inserted, the DC offset voltage is canceled and a differential output signal free from distortions due to accumulation of AC components can be obtained.

Furthermore, the photo-electric pulse conversion circuit that converts an optical pulse signal to a corresponding electrical pulse signal is preferably provided with a light-current conversion circuit that converts the optical pulse signal to a corresponding current signal and outputs the current signal, an I–V conversion circuit that converts the current signal to a pair of corresponding differential voltage signals and outputs the differential voltage signals, the differential amplification circuit provided with the DC offset cancellation circuit according to another form of the first aspect of the invention that amplifies the differential voltage signals and outputs the differential output signals, and a pulse generation circuit that outputs the electrical pulse signal based on the differential output signals.

If a DC offset voltage is occurring in the differential amplification circuit used in the photo-electric pulse conversion circuit, the rise and fall timings of the electrical pulse signal generated by the pulse generation circuit do not match the rise and fall timings of the corresponding optical pulse signal, which may result in faulty communications or other problems.

On the other hand, the photo-electric pulse conversion circuit according to the invention employs the differential amplification circuit provided with the DC offset cancellation circuit. More specifically, it uses the differential amplification circuit with the DC offset cancellation circuit inserted between the differential output terminals and the differential input terminals. This ensures that the DC offset voltage is properly canceled to perform differential amplification, eliminating the possibility that the rise and fall timings of the electrical pulse signal may not match those of the optical pulse signal due to accumulation of AC components.

Another means for solving the problems according to a second aspect of the invention is a photo-electric pulse conversion circuit that converts an optical pulse signal of a generally square wave shape to at least either a non-inversion electrical pulse signal that falls at a first timing at which the optical pulse signal falls and rises at a second timing at which the optical pulse signal rises or an inversion electrical pulse signal that rises at the first timing and falls at the second timing. It is provided with a light-current conversion circuit that converts the optical pulse signal to a corresponding current signal and outputs the current signal, an I–V conversion circuit that converts the current signal to a pair of corresponding differential voltage signals and output the differential voltage signals, a differential amplification circuit that amplifies the differential voltage signals and outputs a pair of differential output signals, and a pulse generation circuit that outputs at least either the non-inversion electrical pulse signal or the inversion electrical pulse signal based on the differential output signals. The differential amplification circuit is provided with a low-pass filter which filters the differential output signals to output a filtered signal, a hold circuit which outputs a hold filtered signal instead of the filtered signal of the low-pass filter, and which outputs the hold filtered signal corresponding to the filtered signal of the low-pass filter at the time of changing the filtered signal to the hold filtered signal, a mixing circuit which outputs a pair of mixed differential input signals, which are generated by mixing the filtered signal or the hold filtered signal into the differential voltage signals such that a negative feedback is performed, to the differential input terminals of the differential amplification circuit, and a changeover circuit that performs changeover to a filtering state in which the differential output signals is inputted to the low-pass filter and the filtered signal is outputted to the mixing circuit at the first timing, and performs changeover to a hold state in which an input of the differential output signals to the low-pass filter are cut off and the hold filtered signal is outputted to the mixing circuit at the second timing according to the inputted non-inversion electrical pulse signal or the inversion electrical pulse signal.

This photo-electric pulse conversion circuit is provided with the light-current conversion circuit, the I–V conversion circuit, the differential amplification circuit, and the pulse generation circuit. The differential amplification circuit is provided with the low-pass filter that outputs the filtered signal, the hold circuit that outputs the hold filtered signal, the mixing circuit that outputs the mixed differential input signals, which is generated by mixing the filtered signal or the hold filtered signal into the differential input signals, to the differential amplification circuit, and the changeover circuit that performs changeover between the filtering state and the hold state according to the non-inversion electrical pulse signal or the inversion electrical pulse signal.

In the differential amplification circuit, therefore, the DC offset voltage is canceled and AC components do not accumulate. Therefore, a non-inversion electrical pulse signal or an inversion electrical pulse signal that accurately reproduces the rise and fall timings of the optical pulse signal can be generated.

As the I–V conversion circuit, any circuit may be employed as long as it performs current-to-voltage conversion of a current signal and outputs a pair of corresponding differential voltage signals. Possible circuits therefore include a circuit that performs amplification and current-to-voltage conversion concurrently and a circuit that performs amplification after current-to-voltage conversion.

Still another means for solving the problems according to a third aspect of the invention is a DC offset cancellation circuit which is inserted between a pair of differential output terminals and a pair of differential input terminals of a differential amplification circuit that amplifies a pair of differential input signals inputted to the differential input terminals thereof and output a pair of differential output signals from the differential output terminals thereof, and which cancels a DC offset voltage between the differential output signals. It is provided with a low-pass filter that performs low-pass filtration on the differential output signals to output a filtered signal, a mixing circuit that outputs a pair of mixed differential input signals, which are generated by mixing the filtered signal into the differential input signals such that a negative feedback is performed, to the differential input terminals of the differential amplification circuit, and a characteristics changing circuit that changes a cutoff frequency and a through rate of the low-pass filter.

Since this DC offset cancellation circuit is provided with the low-pass filter and the mixing circuit, low-frequency AC components, in addition to DC components, are negatively fed back through the low-pass filter. Because of the characteristics changing circuit provided therein, however, the DC offset cancellation circuit can change the cutoff frequency and the through rate of the low-pass filter by means of the characteristics changing circuit. By changing the cutoff frequency and the through rate according to the waveform and the like of the input signal, therefore, it is possible to adjust a rate of increase or decrease of AC components, and to eliminate or control accumulation of AC components, thereby preventing a problem that the differential output signals are distorted due to accumulation of AC components or other problems.

The characteristics changing circuit may change the cutoff frequency and the through rate from one value to another value in a step-by-step manner, or may change them continuously.

It is preferable to configure a differential amplification circuit provided with the DC offset cancellation circuit according to the third aspect of the invention inserted between the differential output terminals and the differential input terminals of the differential amplification circuit.

According to the differential amplification circuit provided with the DC offset cancellation circuit, since the DC offset cancellation circuit is inserted, the DC offset voltage can be canceled and a pair of differential output signals in which a distortion due to accumulation of AC components is prevented can be obtained.

Furthermore, the photo-electric pulse conversion circuit that converts an optical pulse signal to a corresponding electrical pulse signal is preferably provided with a light-current conversion circuit that converts the optical pulse signal to a corresponding current signal and outputs the current signal, a high-pass I–V conversion circuit that converts the current signal to a pair of corresponding differential voltage signals and outputs the differential voltage signals through a capacitive coupling capacitor or a differentiating I–V conversion circuit that converts the current signal to a pair of differential voltage signals with a waveform similar to that of signals which are obtained by differentiation of the current signal, a differential amplification circuit provided with the DC offset cancellation circuit according to another form of the third aspect of the invention that amplifies the differential voltage signals as the differential input signals and output the differential output signals, and a pulse generation circuit that outputs the electrical pulse signal based on the differential output signals.

If a DC offset voltage is occurring in the differential amplification circuit used in the photo-electric pulse conversion circuit, since the rise and fall timings of the electrical pulse signal generated by the pulse generation circuit do not match the rise and fall timings the corresponding optical pulse signal, it is impossible to obtain an electrical pulse signal having a pulse width corresponding to the pulse width of the optical pulse signal, which may result in faulty communications or other problems.

On the other hand, the photo-electric pulse conversion circuit according to the invention employs the differential amplification circuit provided with the DC offset cancellation circuit. More specifically, it uses the differential amplification circuit with the DC offset cancellation circuit inserted between the differential output terminals and the differential input terminals. This allows the DC offset voltage to be reliably canceled to perform differential amplification and prevents AC components from accumulating, thereby inhibiting mismatch between the rise and fall timings of the electrical pulse signal and those of the optical pulse signals due to accumulation of AC components.

A further means for solving the problems according to a fourth aspect of the invention is a photo-electric pulse conversion circuit that converts an optical pulse signal of a generally square wave shape to at least either a non-inversion electrical pulse signal that falls at a first timing at which the optical pulse signal falls and rises at a second timing at which the optical pulse signal rises or an inversion electrical pulse signal that rises at the first timing and falls at the second timing. It is provided with a light-current conversion circuit that converts the optical pulse signal to a corresponding current signal and outputs the current signal, either a high-pass I–V conversion circuit that converts the current signal to a pair of corresponding differential voltage signals and outputs the differential voltage signals through a capacitive coupling capacitor or outputs the differential voltage signals after passing it through the capacitor and then amplifying it, or a differentiating I–V conversion circuit that converts the current signal to a pair of differential voltage signals with a waveform similar to that of a signal which is obtained by the differentiation of the current signal and outputs the differential voltage signals, a differential amplification circuit that amplifies the differential voltage signals and outputs the differential output signals, and a pulse generation circuit that outputs at least either the non-inversion electrical pulse signal or the inversion electrical pulse signal based on the differential output signals. Furthermore, the differential amplification circuit is provided with a low-pass filter that performs low-pass filtration on the inputted differential output signals to output a filtered signal, a mixing circuit that outputs a pair of mixed differential input signals, which is generated by mixing the filtered signal into the differential voltage signals such that a negative feedback is performed, to a pair of differential input terminals of the differential amplification circuit, and a characteristics changeover circuit that performs changeover to a first state in which the cutoff frequency is a first cutoff frequency fc1 and the through rate is a first through rate SR1 at the first timing, and performs changeover to a second state in which the cutoff frequency is a second cutoff frequency fc2 and the through rate is a second through rate SR2 at the second timing, according to the inputted non-inversion electrical pulse signal or the inversion electrical pulse signal.

This photo-electric pulse conversion circuit is provided with the light-current conversion circuit, the high-pass I–V conversion circuit or the differentiating I–V conversion circuit, the differential amplification circuit, and the pulse generation circuit. Moreover, the differential amplification circuit is provided with the low-pass filter that outputs the filtered signal, the mixing circuit that outputs the mixed differential input signals to the differential amplification circuit, and the characteristics changeover circuit that changes the characteristics of the low-pass filter according to the non-inversion electrical pulse signal or the inversion electrical pulse signal.

In the differential amplification circuit, therefore, the DC offset voltage is canceled and a non-inversion electrical pulse signal or an inversion electrical pulse signal that accurately reproduces the rise and fall timings of the optical pulse signal can be generated.

Examples of the high-pass I–V conversion circuit include a circuit that performs current-to-voltage conversion on a current signal to produce a pair of differential voltage signals and outputs the signals through a capacitive coupling capacitor and a circuit that outputs the signal through the capacitor and further amplification. Also included is a circuit configured so as to perform amplification and conversion concurrently, or to perform amplification following conversion when converting the current signal to the differential voltage signals for outputting the amplified differential voltage signals through the capacitive coupling capacitor.

As the differentiating I–V conversion circuit, any circuit may be employed as long as it is capable of converting the current signal to a pair of differential voltage signals with a waveform similar to that of signals which are obtained by differentiation of the current signal and outputting the differential voltage signals. A circuit that performs amplification and conversion concurrently, or performs amplification following conversion is also included.

A still further means for solving the problems according to a fifth aspect of the invention is a pulse shaping circuit that performs logic processing on a pair of complementary pulse differentiated differential input signals obtained by subjecting a base pulse signal of a generally square wave shape to differentiation or high-pass filtration and obtains at least either a non-inversion shaped pulse signal that falls at a first timing at which the base pulse signal falls and rises at a second timing at which the base pulse signal rises or an inversion shaped pulse signal that rises at the first timing and falls at the second timing. The pulse shaping circuit is provided with an offset-added signal generation circuit that uses the pair of pulse complimentary differentiated differential input signals, that is, a non-inversion first signal and an inversion second signal, to generate a non-inversion fifth signal corresponding to the non-inversion first signal and an inversion fourth signal corresponding to the inversion second signal by adding an offset voltage so that a fourth reference voltage of the inversion fourth signal is relatively higher than a fifth reference voltage of the non-inversion fifth signal by an amount equivalent to a first offset voltage and to generate a non-inversion third signal corresponding to the non-inversion first signal and an inversion sixth signal corresponding to the inversion second signal by adding an offset voltage so that a sixth reference voltage of the inversion sixth signal is relatively lower than a third reference voltage of the non-inversion third signal by an amount equivalent to a second offset voltage. The pulse shaping circuit is also provided with a first comparison circuit that compares the non-inversion fifth signal with the inversion fourth signal to obtain a seventh signal that rises or an inversion seventh signal that falls at the second timing, a second comparison circuit that compares the non-inversion third signal with the inversion sixth signal to obtain an eighth signal that rises or an inversion eighth signal that falls at the first timing, and a logic processing circuit that obtains at least either the non-inversion shaped pulse signal or the inversion shaped pulse signal based on the seventh signal and the eighth signal or the inversion seventh signal and the inversion eighth signal.

The pulse shaping circuit according to the invention is provided with the offset-added signal generation circuit that uses the pair of pulse differentiated differential input signals, that is, the non-inversion first signal and the inversion second signal, to generate the non-inversion third signal, the non-inversion fifth signal, the inversion fourth signal, and the inversion sixth signal by adding the offset voltage equivalent to the first and the second offset voltages ($\Delta$Vof1, $\Delta$Vof2). The pulse shaping circuit according to the invention is also provided with the first comparison circuit that obtains the seventh signal or the inversion seventh signal, the second comparison circuit that obtains the eighth signal or the inversion eighth signal, and the logic processing circuit that obtains at least either the non-inversion shaped pulse signal or the inversion shaped pulse signal. Since the seventh signal that rises at the rise timing of the base pulse signal and the eighth signal that rises at the fall timing of the base pulse signal are separately obtained as described above, it is possible to obtain the non-inversion shaped pulse signal or the inversion shaped pulse signal that sharply rises or falls at the rise timing (the second timing) or the fall timing (the first timing) of the base pulse signal and accurately reproduces the pulse width of the base pulse signal. Furthermore, since the signal processing can be performed by adding the adequate first and second offset voltages ΔVof1, ΔVof2 regardless of the hysteresis voltages of the first and the second comparison circuits, malfunctions due to noise or the like can be reduced.

In addition, it is preferable that a pulse generation circuit for obtaining at least either the non-inversion shaped pulse signal or the inversion pulse signal from the base pulse signal of a generally square wave shape be provided with a differentiated differential signal generation circuit that performs differentiation or high-pass filtration on the base pulse signal of the generally square wave shape to generate the pair of complementary pulse differentiated differential input signals and the pulse shaping circuit according to the fifth aspect of the invention that uses the pulse differentiated differential input signals inputted thereto to obtain at least either the non-inversion shaped pulse signal or the inversion shaped pulse signal.

Since this pulse generation circuit is provided with the differentiated differential signal generation circuit and the pulse shaping circuit, a non-inversion shaped pulse signal or an inversion shaped pulse signal that accurately reproduces a base pulse signal of a generally square wave shape can be obtained. Moreover, malfunctions due to noise or the like can also be reduced.

In addition, it is preferable that a photo-electric pulse conversion circuit that converts an optical pulse signal to a corresponding electrical pulse signal be provided with a light-current conversion circuit that converts the optical pulse signal to a corresponding current signal and outputs the current signal, an I–V conversion circuit that converts the current signal to a corresponding pulse voltage signal of a generally square wave shape, and the pulse generation circuit according to another form of the fifth aspect of the invention that uses the pulse voltage signal as the base pulse signal to obtain at least either the non-inversion shaped pulse signal or the inversion shaped pulse signal.

This photo-electric pulse conversion circuit is provided with the pulse generation circuit, in addition to the light-current conversion circuit and the I–V conversion circuit. It is therefore possible to obtain a non-inversion shaped pulse signal or an inversion shaped pulse signal that accurately reproduces the pulse width of an optical pulse signal.

A yet further means for solving the problems according to a sixth aspect of the invention is a photo-electric pulse conversion circuit that converts an optical pulse signal of a generally square wave shape to at least either a non-inversion electrical pulse signal that falls at a first timing at which the optical pulse signal falls and rises at a second timing at which the optical pulse signal rises or an inversion electrical pulse signal that rises at the first timing and falls at the second timing. It is provided with a light-current conversion circuit that converts the optical pulse signal to a corresponding current signal and outputs the current signal, an I–V conversion circuit that converts the current signal to a corresponding pulse voltage signal of a generally square wave shape and outputs the pulse voltage signal, a differentiated differential signal generation circuit that performs differentiation or high-pass filtration on the pulse voltage signal to generate a pair of complementary pulse differentiated differential input signals, and a pulse shaping circuit that uses the pulse differentiated differential input signals inputted thereto to obtain at least either the non-inversion shaped electrical pulse signal or the inversion shaped electrical pulse signal. The pulse shaping circuit is provided with an offset-added signal generation circuit that uses the pair of pulse differentiated differential input signals, that is, a non-inversion first signal and an inversion second signal, to generate a non-inversion fifth signal corresponding to the non-inversion first signal and an inversion fourth signal corresponding to the inversion second signal by adding an offset voltage so that a fourth reference voltage of the inversion fourth signal is relatively higher than a fifth reference voltage of the non-inversion fifth signal by an amount equivalent to a first offset voltage, and to generate a non-inversion third signal corresponding to the non-inversion first signal and an inversion sixth signal corresponding to the inversion second signal by adding an offset voltage so that a sixth reference voltage of the inversion sixth signal is relatively lower than a third reference voltage of the non-inversion third signal by an amount equivalent to a second offset voltage. The pulse shaping circuit is also provided with a first comparison circuit that compares the non-inversion fifth signal with the inversion fourth signal to obtain a seventh signal that rises or an inversion seventh signal that falls at the second timing, a second comparison circuit that compares the non-inversion third signal with the inversion sixth signal to obtain an eighth signal that rises or an inversion eighth signal that falls at the first timing, and a logic processing circuit that obtains at least either the non-inversion shaped electrical pulse signal or the inversion shaped electrical pulse signal based on the seventh signal and the eighth signal or the inversion seventh signal and the inversion eighth signal.

The photo-electric pulse conversion circuit according to the invention is provided with the light-current conversion circuit, the I–V conversion circuit, the differentiated differential signal generation circuit, and the pulse shaping circuit. The pulse shaping circuit is provided with the offset-added signal generation circuit that uses the pair of pulse differentiated differential input signals, that is, the non-inversion first signal and the inversion second signal, to generate the non-inversion third signal, the non-inversion fifth signal, the inversion fourth signal, and the inversion sixth signal by adding the offset voltage equivalent to the first and the second offset voltages ΔVof1, ΔVof2. The pulse shaping circuit is also provided with the first comparison circuit that obtains the seventh signal or the inversion seventh signal, the second comparison circuit that obtains the eighth signal or the inversion eighth signal, and the logic processing circuit that obtains at least either the non-inversion shaped pulse signal or the inversion shaped pulse signal.

Since the seventh signal that rises at the rise timing of the optical pulse signal and the eighth signal that rises at the fall timing of the optical pulse signal are separately obtained as described above, it is possible to obtain the non-inversion shaped electrical pulse signal or the inversion shaped electrical pulse signal that sharply rises or falls at the rise timing (the second timing) or the fall timing (the first timing) of the optical pulse signal and, in addition, accurately reproduces the pulse width of the optical pulse signal. Furthermore, since the circuit permits signal processing to be performed by adding the adequate first and second offset voltages ΔVof1, ΔVof2 regardless of the hysteresis voltages of the first and the second comparison circuits, malfunctions due to noise or the like can be reduced.

The above and further objects and novel features of the invention will more fully appear from following detailed description when the same is read in connection with the accompanying drawings. It is to be expressly understood, however, that the drawings are for the purpose of illustration only and not intended as a definition of the limits of invention.

BRIEF DESCRIPTION OF DRAWINGS

FIG. 11 is a schematic diagram showing operating states of the optical pulse signal LT, the inversion electrical pulse signal xRX, the characteristics changeover pulse signal xVC, and the low-pass filter with the characteristics changeover function LPC when the inversion electrical pulse signal is inverted by noise or the like in a circuit provided with a logic processing circuit LG1;

DETAILED DESCRIPTION OF THE PREFERRED EMBODIMENTS (First Embodiment)

Figure 1:
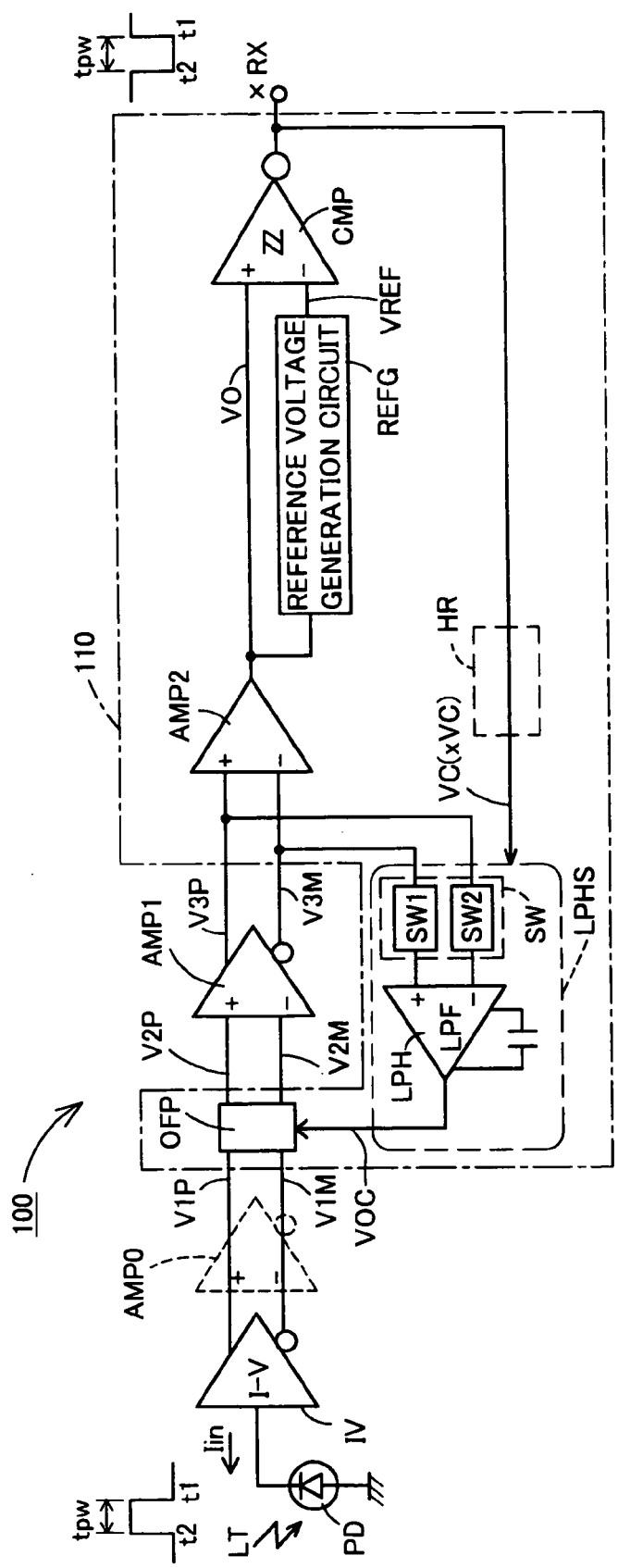
FIG. 1 is a circuit diagram showing a photo-electric pulse conversion circuit according to a first embodiment of the invention.

A first embodiment of the present invention will be explained with reference to FIGS. 1 through 6. A photo-electric pulse conversion circuit 100 according to the first embodiment shown in FIG. 1 is used in a receiving circuit in IrDA or other optical communications. Namely, the photo-electric pulse conversion circuit converts an optical pulse signal LT entering a photodiode PD to a corresponding electrical pulse signal xRX while retaining a pulse tpw. It thereafter performs other types of necessary processing in a demodulator circuit or other circuits at later stages.

The photo-electric pulse conversion circuit 100 has nearly the same configuration as the above-mentioned photo-electric pulse conversion circuit 10, except that a DC offset cancellation circuit 110 for canceling a DC offset voltage occurring in a first differential amplification circuit AMP1 is configured differently.

Figure 36:
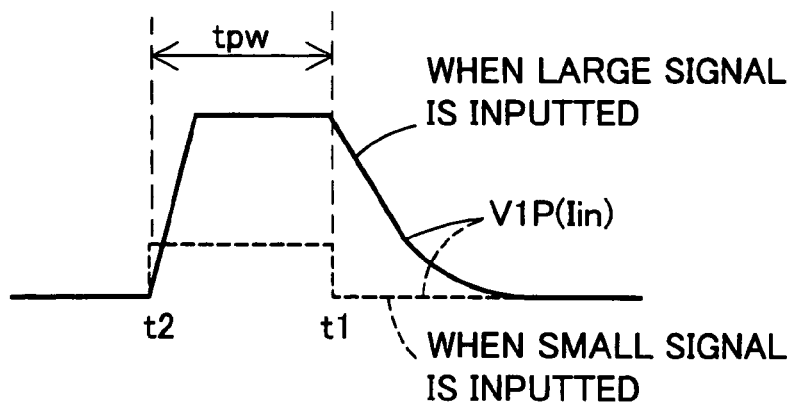
FIG. 36 is a schematic diagram showing changes in a non-inversion voltage signal V1P of an I–V conversion circuit.

In the same manner as in the photo-electric pulse conversion circuit 10, therefore, when the photodiode PD receives the optical pulse signal LT, a pulsating current signal Iin flows according to the intensity of the light. An I–V conversion circuit IV then converts this current signal Iin to a pair of complementary differential voltage signals V1P, V1M and outputs these signals. The waveforms of the differential voltage signals V1P, V1M when a large signal is inputted are slightly different from those when a small signal is inputted (see FIG. 36). Namely, when a small signal is inputted, a square waveform having the pulse width tpw is obtained. When a large signal is inputted, however, the waveform has a dull rising edge and a dull falling edge though it has a generally square wave shape. Particularly, since the falling edge after a first timing t1 falls slowly, the non-inversion voltage signal V1P also falls slowly as shown in FIG. 36.

Figure 37:
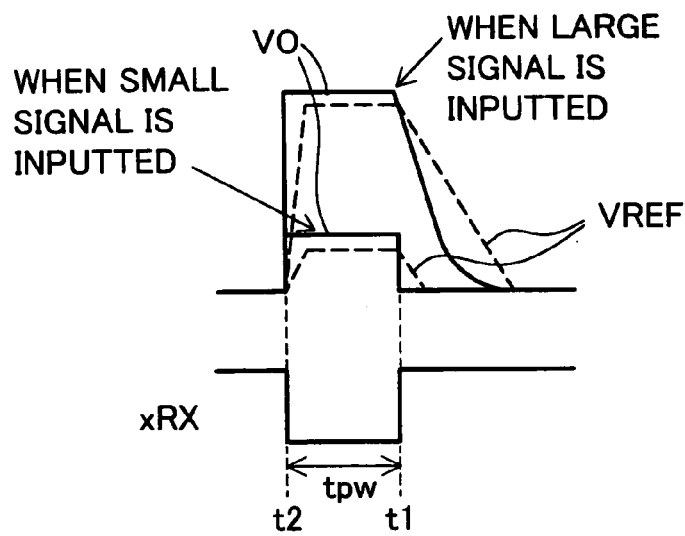
FIG. 37 is a schematic diagram showing a relationship among an output VO of a second differential amplification circuit AMP2, a reference voltage REF, and an inversion electrical pulse signal xRX.

The differential voltage signals V1P, V1M are then amplified by a first differential amplification circuit AMP1 provided with a DC offset cancellation circuit 110 indicated by dashed lines and further by a second differential amplification circuit AMP2. An output VO therefrom is next used to generate a reference signal VREF (as shown in FIG. 37) and the output VO is compared with the reference voltage VREF to obtain an inversion electrical pulse signal xRX having the pulse width tpw corresponding to the optical pulse signal LT.

In the photo-electric pulse conversion circuit 100, the inversion electrical pulse signal xRX is used to cancel a DC offset voltage of the first differential amplification circuit AMP1 to be described later. Namely, as shown by chain lines, the second differential amplification circuit AMP2, a reference voltage generation circuit REFG, and a comparison circuit CMP constitute part of the DC offset cancellation circuit 110, and they are also used to constitute a changeover instruction circuit that generates a changeover pulse signal xVC used for canceling the DC offset voltage.

The DC offset cancellation circuit 110 is provided with a function changeover filter LPHS and third differential signals V3P, V3M are inputted to a low-pass filter with a hold function LPH through a changeover circuit having switches SW1, SW2. The function changeover filter LPHS can turn ON or OFF the changeover circuit SW through the inputted changeover pulse signal xVC, or more specifically, the inversion electrical pulse signal xRX. The input of the third differential signals V3P, V3M are turned ON or OFF by switching of the changeover circuit SW, and during a period in which the third differential signals V3P, V3M are being inputted, the low-pass filter with the hold function LPH outputs a filtered signal generated by subjecting the third differential signals V3P, V3M to low-pass filtration as an offset cancellation signal VOC. When the input of the third differential signals V3P, V3M is cut off by the changeover circuit SW, on the other hand, the low-pass filter with the hold function LPH maintains an output of the offset cancellation signal VOC that has been outputted before changeover (cutoff) even after the completion of the changeover.

Figure 2:
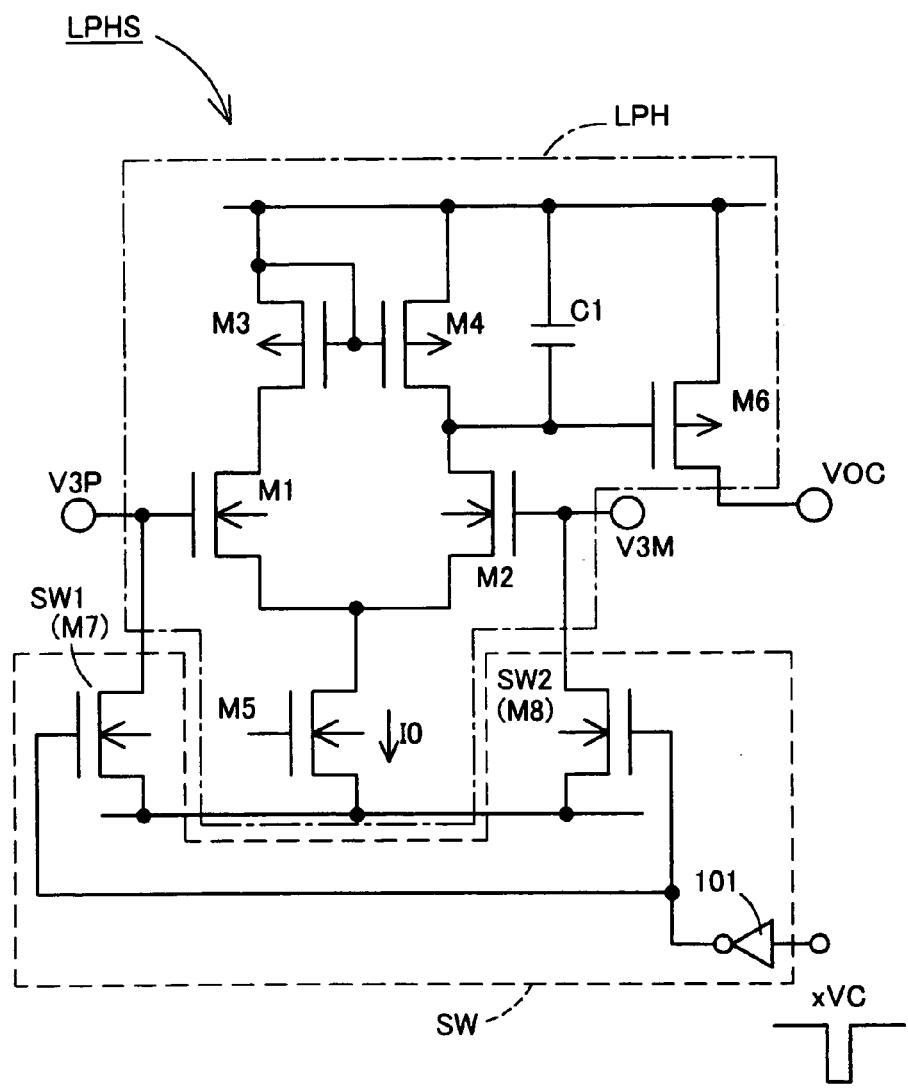
FIG. 2 is a circuit diagram showing a circuit configuration of a function changeover filter LPHS with low-pass characteristics which has a low-pass filter with a hold function LPH having a hold function and a changeover circuit SW.
Figure 3:
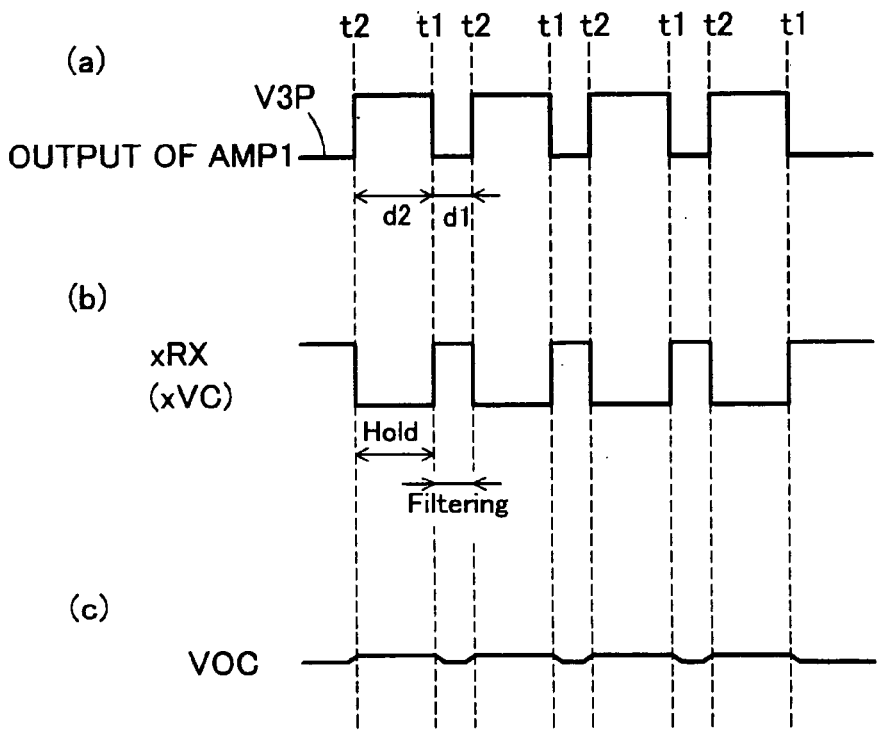
FIG. 3 is a schematic diagram showing a relationship among a non-inversion output signal V3P, an inversion electrical pulse signal xRX, and an offset cancellation signal VOC according to the first embodiment.

The circuit configuration of the function changeover filter LPHS will be explained in details with reference to FIG. 2. The low-pass filter with the hold function LPH enclosed by chain lines is an OP-amp circuit including transistors M1 through M6 and a capacitor C1. Given low-pass characteristics by the capacitor C1, the circuit performs low-pass filtration on the third differential signals V3P, V3M inputted thereto and outputs resultant signals through the transistor M6. The changeover circuit SW enclosed by dashed lines, on the other hand, uses transistors M7, M8 as the changeover switches SW1, SW2, respectively. When a LOW level signal is inputted as the changeover pulse signal xVC to an inverter 101, the transistors M7, M8 are turned ON through the inverter 101. This cuts off the input of the third differential signals V3P, V3M to the transistors M1, M2, turning OFF the transistors M1, M2 and cutting off a current I0. As a result, a charge is retained in the capacitor C1 and thus a voltage develops in the capacitor C1 through the transistor M6.

Since the changeover circuit SW performs changeover between the switch SW1 and SW2 according to the changeover pulse signal xVC in this manner, it is possible to perform changeover between a filtering state in which the third differential signals V3P, V3M are subjected to the low-pass filtration and the resultant filtered signal is outputted as the offset cancellation signal VOC and a hold state in which a hold filtered signal corresponding to a filtered signal when a cutoff state is outputted as the offset cancellation signal VOC. Moreover, since the low-pass filter with the hold function LPH is configured as the OP-amp circuit and the changeover switches SW1, SW2 of the changeover circuit SW are configured with the transistors M7, M8, low-pass characteristics and the hold function can be designed easily, and the low-pass filter with the hold function LPH functioning as a low-pass filter and a hold circuit and the changeover circuit SW can be made integrated circuits easily.

Referring to FIG. 3(a), during a first period d1 (from a first timing t1 to a second timing t2), a third non-inversion signal V3P remains at LOW level, and the inversion electrical pulse signal xRX, that is, the changeover pulse signal xVC remains at HIGH level [see FIG. 3(b)]. During the first period d1, the function changeover filter LPHS is in the filtering state. During a second period d2 (from the timing t2 to the timing t1), on the other hand, the third non-inversion signal V3P remains at HIGH level, and the inversion electrical pulse signal xRX remains at LOW level [see FIG. 3(b)]. During the second period d2, the function changeover filter LPHS is in the hold state.

As can be easily understood from FIG. 3(a), the first period d1 corresponds to a period during which there is no optical pulse signal LT and a DC offset voltage is mainly occurring between the third differential signals V3P, V3M outputted from the first differential amplification circuit AMP1. On the other hand, the second period d2 corresponds to a period during which a pulse signal is being inputted and the amplified pulse signal, i.e., AC components develop, in addition to the DC offset voltage, between the third differential signals V3P, V3M outputted from the first differential amplification circuit AMP1.

The state of the function changeover filter LPHS is changed in synchronization with the inversion electrical pulse signal xRX as described above. During the first period d1, it is in the filtering state and a filtered signal generated by filtering the third differential signals V3P, V3M is negatively fed back as the offset cancellation signal VOC. DC components are mainly contained in the offset cancellation signal VOC during the first period d1. Thus, the DC offset voltage is reliably canceled through the negative feedback. During the second period d2, on the other hand, the third differential signals V3P, V3M are cutoff, and the hold filtered signal before changeover, i.e., corresponding to the filtered signal containing mainly DC components is negatively fed back as the offset cancellation signal VOC. Therefore, the main components in the offset cancellation signal VOC during the second period d2 are DC components and thus AC components are not negatively fed back.

Figure 38:
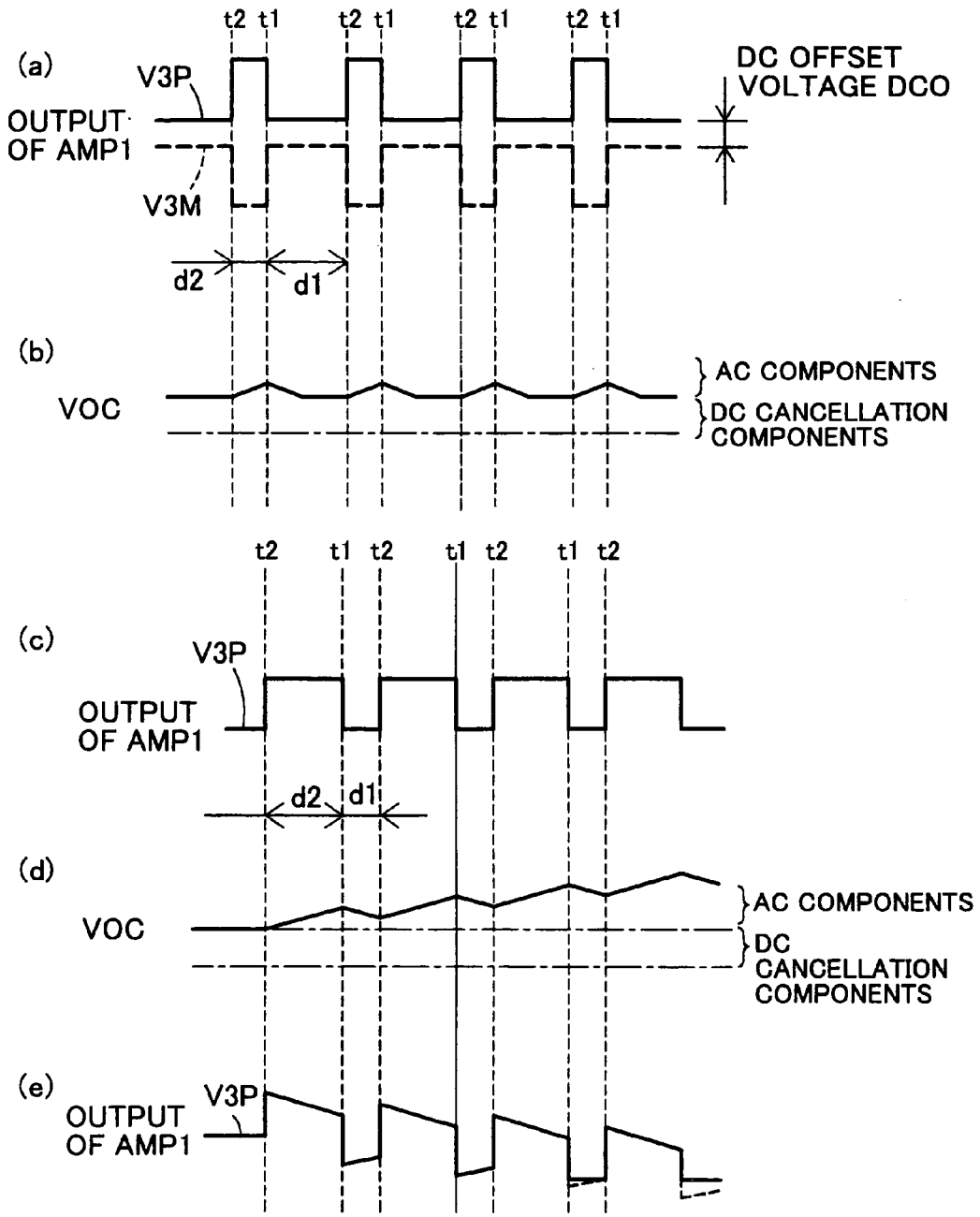
FIG. 38 is a schematic diagram showing changes in outputs of a first differential amplification circuit AMP1, or third differential signals V3P, V3M, and an offset cancellation voltage VOC.
Figure 39:
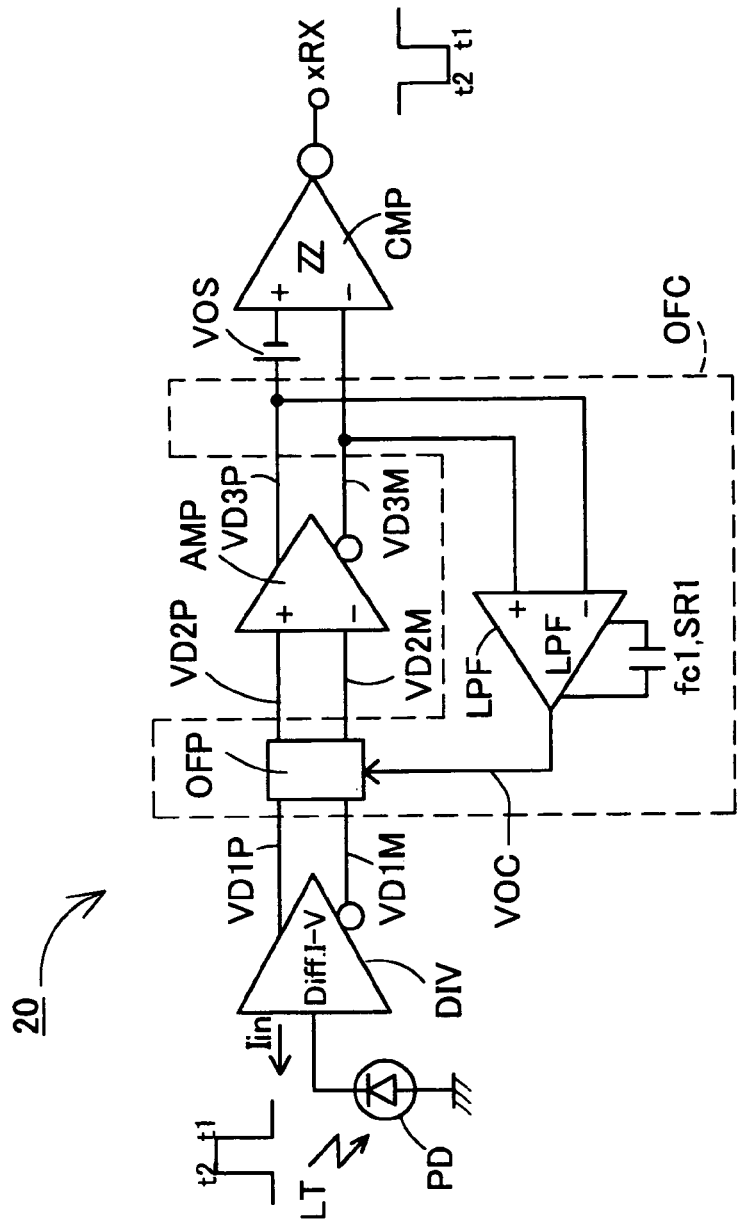
FIG. 39 is a circuit diagram showing a photo-electric pulse conversion circuit according to related art 2.
Figure 40:
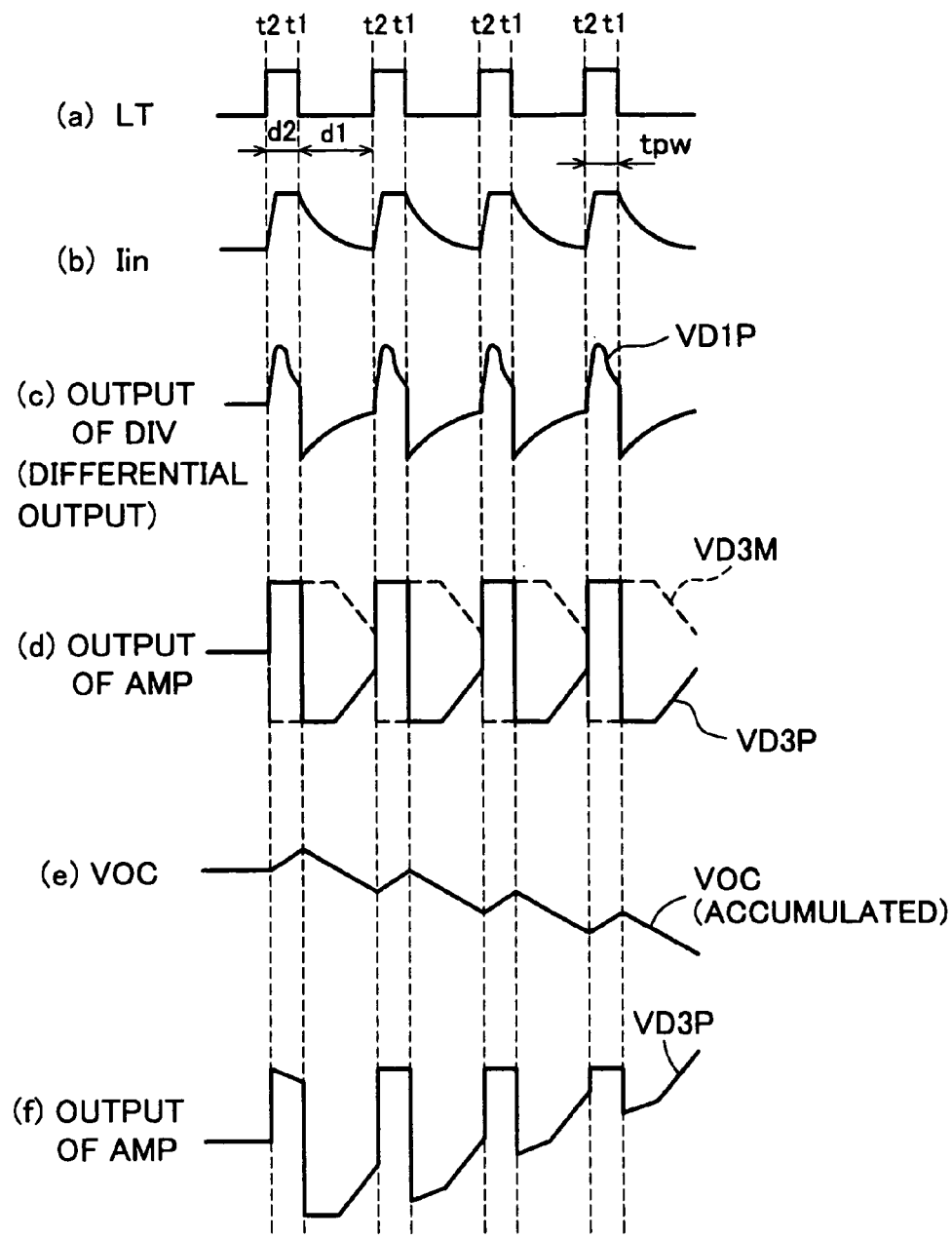
FIG. 40 is a schematic diagram showing changes in an optical pulse signal LT, a current signal Iin, an output of a differentiating I–V conversion circuit DIV or a non-inversion voltage signal VD1P, outputs of a differential amplification circuit AMP or third differential signals V3P, V3M, and an offset cancellation voltage VOC.
Figure 41:
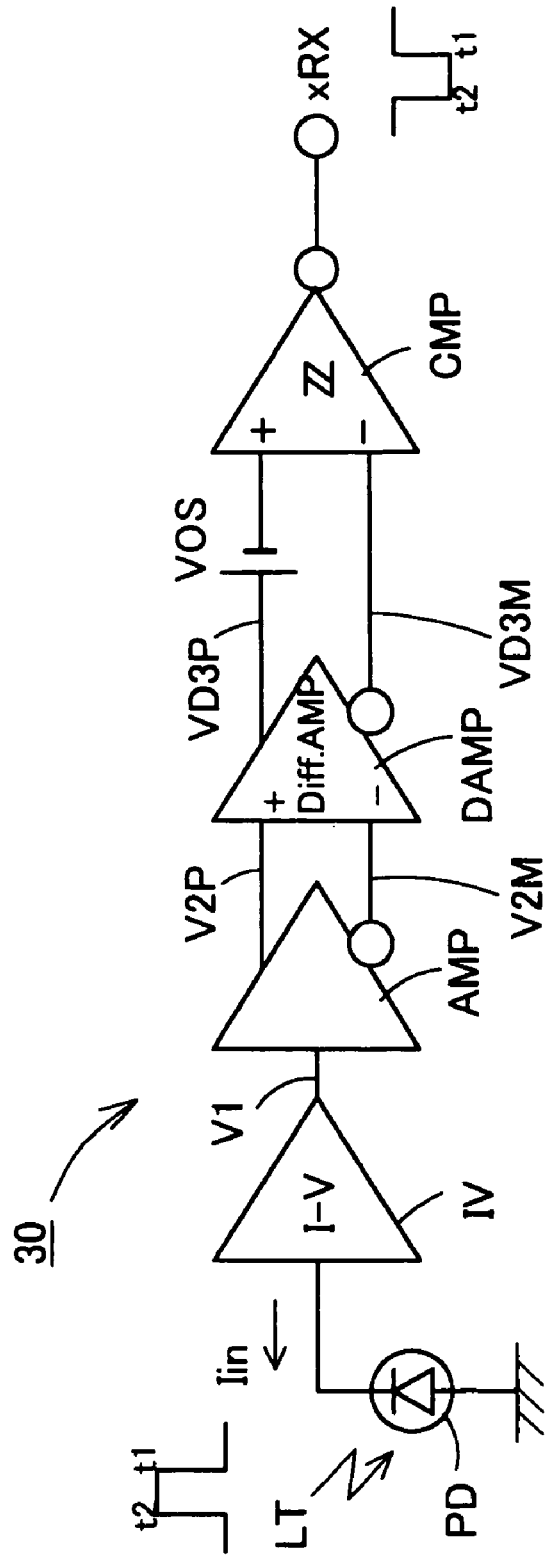
FIG. 41 is a circuit diagram showing a photo-electric pulse conversion circuit according to related art 3.
Figure 42:
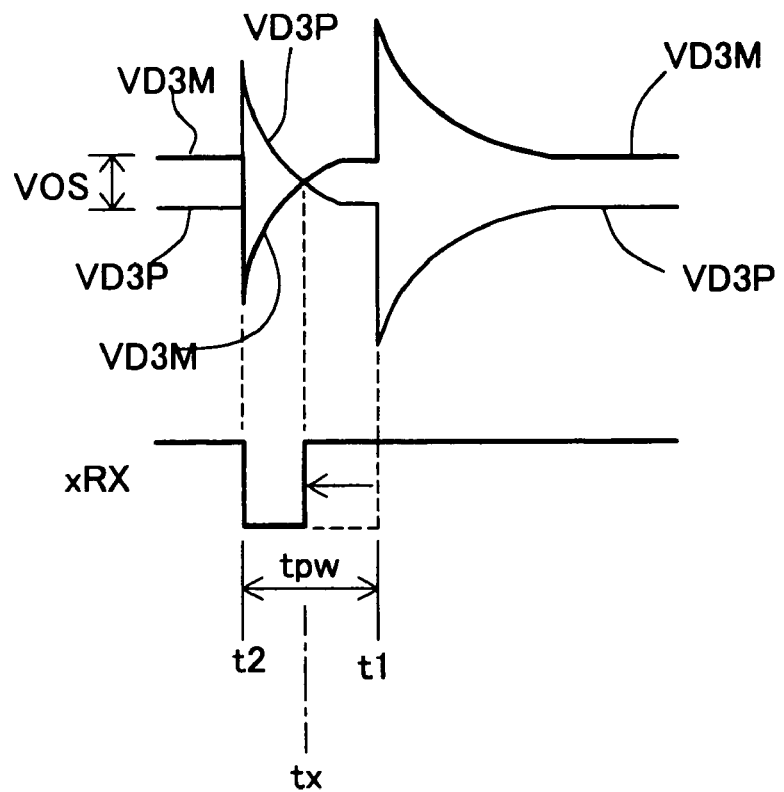
FIG. 42 is a schematic diagram showing a relationship between differential signals VD3P, VD3M to which an offset voltage VOS has been added and the inversion electrical pulse signal xRX.
Figure 43:
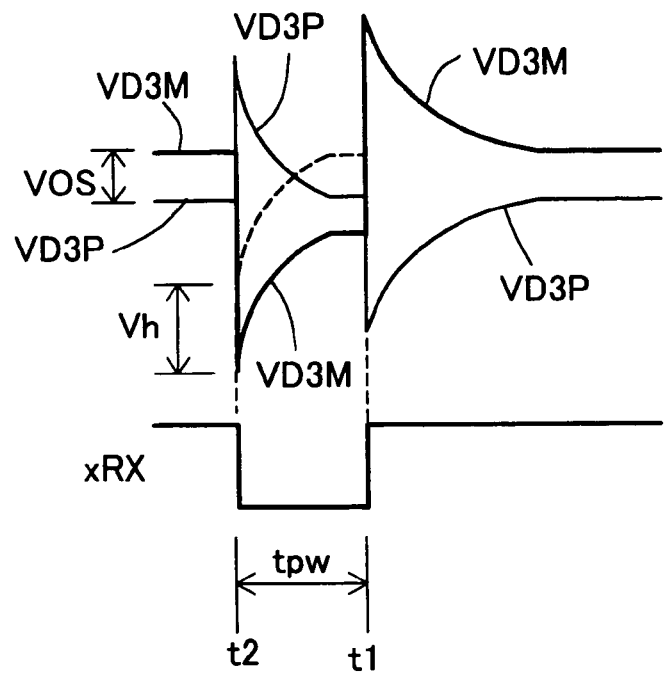
FIG. 43 is a schematic diagram showing a relationship between differential signals VD3P, VD3M to which a hysteresis voltage Vh has been added by a comparison circuit CMP and the inversion electrical pulse signal xRX.
Figure 44:
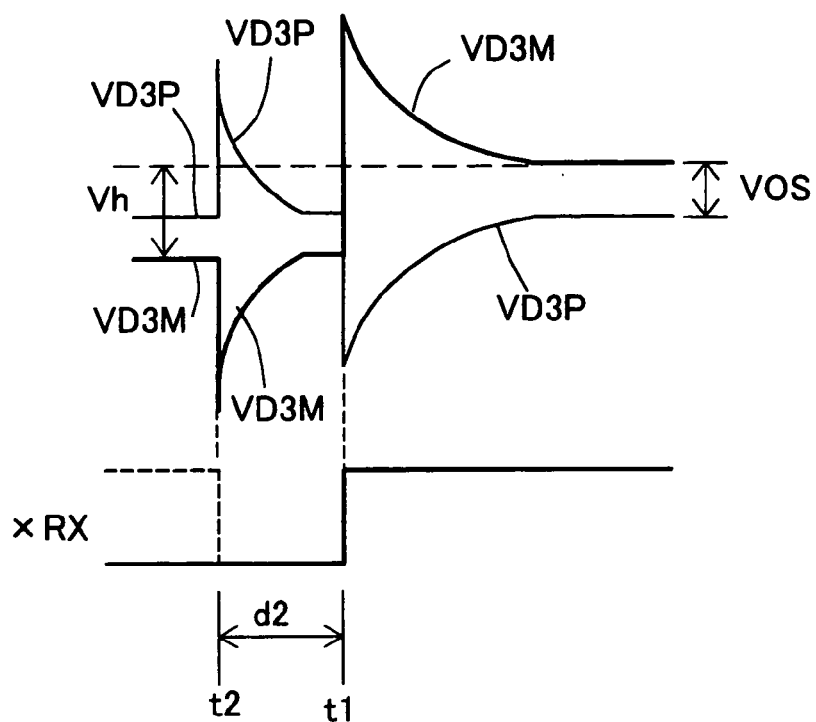
FIG. 44 is a schematic diagram showing a relationship between differential signals VD3P, VD3M and the inversion electrical pulse signal xRX when the inversion electrical pulse signal xRX has been inverted (LOW level) since the beginning.

Owing to such processing, unlike the case of the photo-electric pulse conversion circuit 10 described earlier (see FIG. 38), only very few AC components are included in the offset cancellation signal VOC and AC components are not accumulated as shown in FIG. 3(c). This prevents the third differential signals V3P, V3M from being distorted or lost due to a negative feedback of AC components. It is thought that slight fluctuations shown in FIG. 3(c) are attributable to a delay in feedback during changeover because the negative feedback is performed by the low-pass filter.

Figure 4:
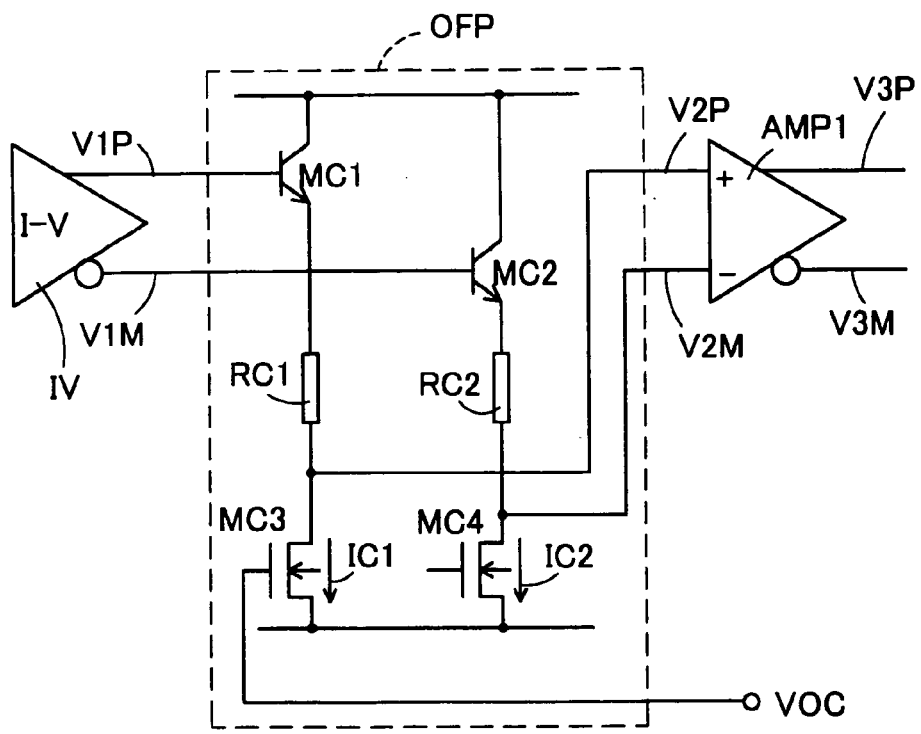
FIG. 4 is a circuit diagram showing a mixing circuit that generates a pair of mixed differential input signals by mixing an offset cancellation signal into a pair of differential input signals.
Figure 5:
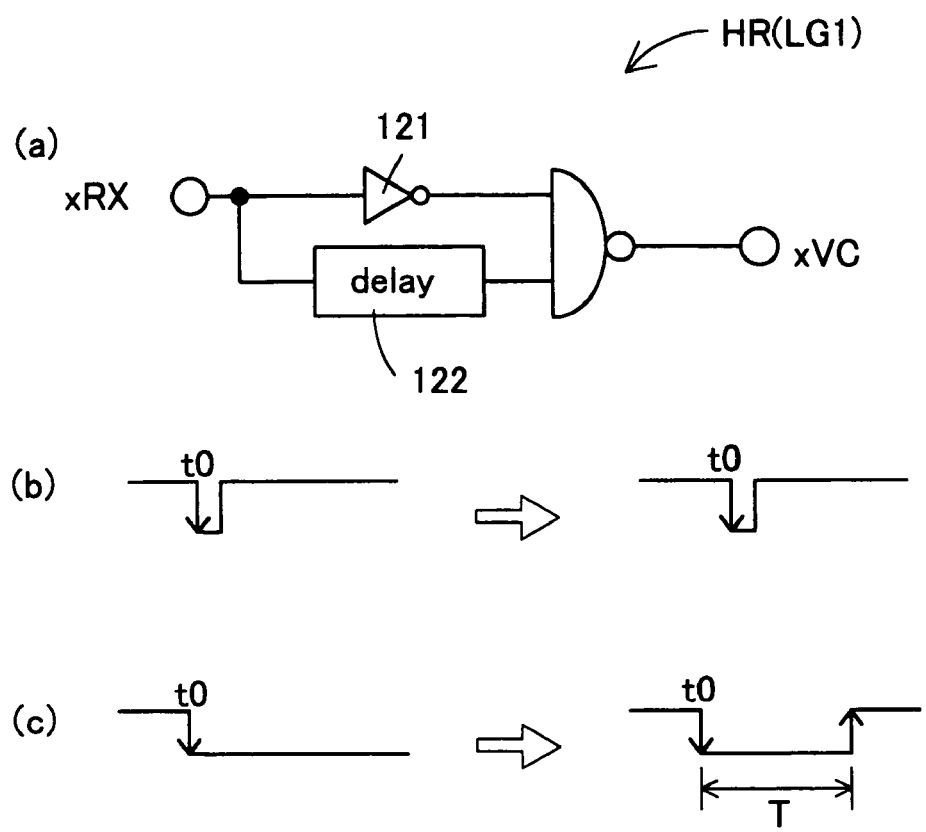
FIG. 5 is a schematic diagram showing a logic circuit of a logic processing circuit HR and an operation thereof.

A mixing circuit (an offset adding circuit) OFP interposed between the I–V conversion circuit IV and the first differential amplification circuit AMP1 is used to generate second differential signals V2P, V2M by mixing such an offset cancellation voltage VOC into the differential voltage signals V1P, V1M such that a negative feedback is performed. More specifically, as shown in FIG. 4, the mixing circuit OFP having a circuit in which a transistor MC1, a resistor RC1, and a transistor MC3 are connected in series, and a circuit in which a transistor MC2, a resistor RC2, and a transistor MC4 are connected in series is used. In the mixing circuit OFP, the offset cancellation signal VOC inputted to a gate of the transistor MC3 is used to modulate the non-inversion voltage signal V1P inputted to the transistor MC1 to obtain a second non-inversion signal V2P. An offset of opposite phase is thus produced between the second differential signals V2P, V2M, thereby canceling the DC offset voltage occurring between the third differential signals V3P, V3M of the first differential amplification circuit AMP1.

Moreover, since AC components are not accumulated in the offset cancellation signal VOC as above mentioned, the third differential output signals V3P, V3M of the first differential amplification circuit AMP1 are not distorted [see FIG. 3(a)].

The signals V3P, and V3M are then amplified by the second differential amplification circuit AMP2. According to an output VO therefrom, the reference voltage VREF is generated by the reference voltage generation circuit REFG (see FIG. 37). Both the signals are then compared by the comparison circuit CMP to generate the inversion electrical pulse signal xRX. According to the embodiment of the invention, distortion-free third differential signals V3P, V3M can be obtained. Therefore, it is possible to obtain the inversion electrical pulse signal xRX which has the pulse width tpw corresponding accurately to the pulse width of the optical pulse signal LT, and which falls at the second timing t2 and rises at the first timing t1.

Since the DC offset cancellation circuit 110 is inserted between the differential input terminals and the differential output terminals of the first differential amplification circuit AMP1 according to this embodiment, the DC offset voltage of the first differential amplification circuit AMP1 is canceled. Moreover, the third differential signals V3P, V3M which are free from distortion due to accumulation of AC components can be obtained. The photo-electric pulse conversion circuit 100 can therefore generate the inversion electrical pulse signal xRX that accurately reproduces the rise and the fall timing of the optical pulse signal.

In the first embodiment, the inversion electrical pulse signal xRX obtained at the comparison circuit CMP is used as the changeover pulse signal xVC. However, it is preferable to provide a hold reset circuit HR which applies logic processing to the inversion electrical pulse signal xRX as shown by dashed lines in FIG. 1. For example, this hold reset circuit HR has a logic circuit configuration as shown in FIG. 5(a). More specifically, the hold reset circuit HR has a configuration in which the inversion electrical pulse signal xRX is inputted to an inverter 121 and a delay circuit 122 that are connected in parallel with each other, and outputs from both are inputted to a NAND circuit.

In the hold reset circuit HR, when the level of the inversion electrical pulse signal xRX becomes LOW level at a time t0, the level of the changeover pulse signal xVC similarly becomes LOW level. When the level of the inversion electrical pulse signal xRX returns to HIGH level thereafter, the level of the changeover pulse signal xVC also returns to HIGH level [see FIG. 5(b)]. If the inversion electrical pulse signal xRX remains at LOW level, however, the changeover pulse signal xVC is set to HIGH level after a lapse of a predetermined period of time T.

Advantages of providing the hold reset circuit HR will be explained with reference to FIG. 6. In the photo-electric conversion circuit 100 according to the first embodiment, the inversion electrical pulse signal xRX corresponding to the optical pulse signal LT can be obtained. If the inversion electrical pulse signal xRX is inverted to LOW level due to intrusion of noise in the circuit or other reasons at the time t0, however, the level of the changeover pulse signal xVC also becomes LOW level, thus setting the function changeover filter LPHS in the hold state. In this case, if such a malfunction occurs when the entire photo-electric pulse conversion circuit 100 has not been stabilized, i.e., when a feedback system including the offset cancellation circuit 110 is unstable or other occasions, the inversion electrical pulse signal xRX may remain permanently fixed to LOW level as shown by chain lines in FIG. 6, depending on the magnitude of the offset cancellation voltage VOC retained in the hold state and the differential voltage signals V1P, V1M, regardless of the optical pulse signal LT.

Figure 6:
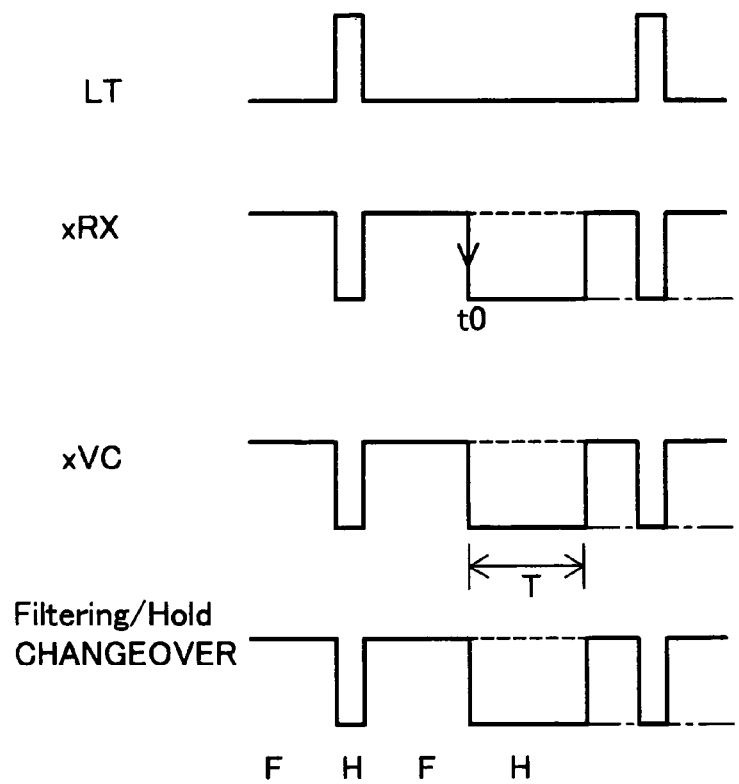
FIG. 6 is a schematic diagram showing operating states of an optical pulse signal LT, the inversion electrical pulse signal xRX, a changeover pulse signal xVC, and the low-pass filter with a hold function LPHS when the inversion electrical pulse signal is inverted by noise or the like in a circuit provided with the logic processing circuit HR.

If the hold reset circuit HR is provided, on the other hand, the level of the changeover pulse signal xVC becomes HIGH level after a lapse of the predetermined period of time T as shown by solid lines in FIG. 6, even if the inversion electrical pulse signal xRX maintains LOW level as described above. The function changeover filter LPHS is therefore set in the filtering state, thus returning the level of the inversion electrical pulse signal xRX to HIGH level. Therefore, it becomes possible to allow the inversion electrical pulse signal xRX to be output properly according to the optical pulse signal LT.

In the first embodiment, the I–V conversion circuit IV and an offset adding circuit OFP are directly connected to each other. However, as shown by dashed lines in FIG. 1, the configuration may be such that a current signal Iin is converted to a corresponding voltage signal by the I–V conversion circuit IV and the resultant voltage signal is amplified by a differential amplifier AMP0 to generate a non-inversion voltage signal V1P and an inversion voltage signal V1M which are inputted to the offset adding circuit OFP. That is, the I–V conversion circuit is acceptable as long as it performs current-to-voltage conversion on a current signal and outputs a voltage signal corresponding to the current signal. Possible circuits that may be used as the I–V conversion circuit include one that performs amplification and current-to-voltage conversion simultaneously and one that performs amplification following current-to-voltage conversion.

(Second Embodiment)

A second embodiment of the invention will be explained with reference to FIGS. 7 through 9. A photo-electric pulse conversion circuit 200 according to the second embodiment shown in FIG. 7 has nearly the same configuration as the above-mentioned photo-electric pulse conversion circuit 20, except for the configuration of a DC offset cancellation circuit 210 for canceling a DC offset voltage occurring in a differential amplification circuit AMP.

Therefore, an optical pulse signal LT that rises at a second timing t2 and falls at a first timing t1 is received by a photodiode PD to obtain a current signal Iin also in the photo-electric pulse conversion circuit 200. Then, a differentiating I–V conversion circuit DIV is used to convert the current signal Iin to a pair of complementary differential voltage signals VD1P, VD1M having waveforms similar to a differentiated waveform of the current signal Iin and outputs the voltage signals. The differential voltage signals VD1P, VD1M are converted to second differential signals VD2P, VD2M through a mixing circuit (an offset adding circuit) OFP, and the second differential signals VD2P, VD2M are amplified by the differential amplification circuit AMP to output third differential signals VD3P, VD3M. The differential amplification circuit AMP is provided with an offset cancellation circuit 210. Further, the third differential signals VD3P, VD3M are compared by a comparison circuit CMP to obtain an inversion electrical pulse signal xRX.

Figure 35:
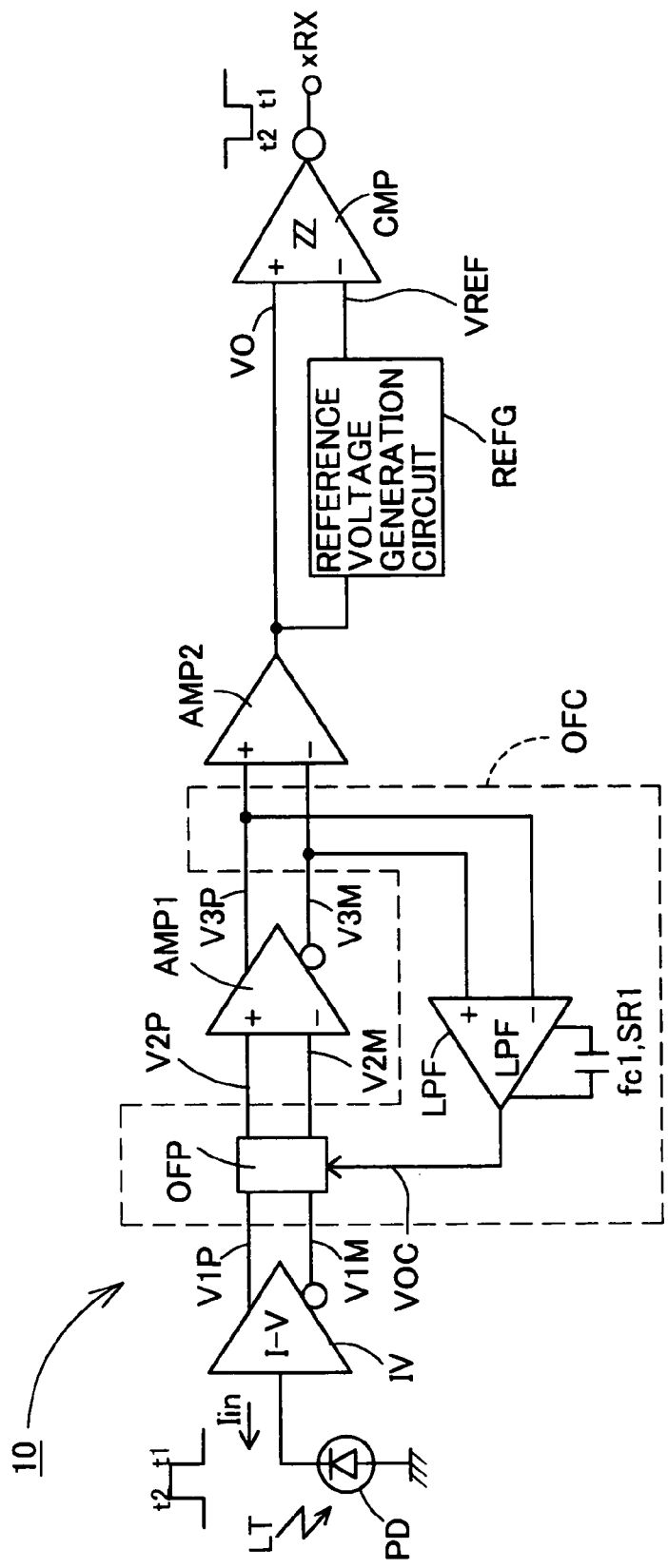
FIG. 35 is a circuit diagram showing a photo-electric pulse conversion circuit according to related art 1.

The differential voltage signals VD1P, VD1M having waveforms similar to that of the differentiated current signal Iin are obtained and then amplified, and the third differential signals VD3P, VD3M that sharply change at the first and the second timings t1, t2 are compared with each other also in this photo-electric pulse conversion circuit 200. As a result, the inversion electrical pulse signal xRX obtained sharply falls or rises at the first or the second timing t1, t2 and can reproduce accurately the pulse width tpw of the optical pulse signal LT. Moreover, the circuit has the advantage that there is no need of separately generating a reference voltage VREF according to an output VO using a reference voltage generation circuit REFG as in related art 1 (see FIG. 35).

As will be described later, the inversion electrical pulse signal xRX is used to cancel the DC offset voltage of the differential amplification circuit AMP in the photo-electric pulse conversion circuit 200. Namely, as shown by the enclosure of chain lines, the comparison circuit CMP also constitutes part of the DC offset cancellation circuit 210 and is also used as a characteristics changeover instruction circuit that generates a characteristics changeover pulse signal xVC for canceling the DC offset voltage. Therefore, the comparison circuit CMP outputs the characteristics changeover pulse signal xVC (xRX) that rises to invert a logic state thereof at the first timing t1 and falls to invert the logic state thereof once again at the second timing t2. As the mixing circuit OFP, one having the same circuit configuration as that used in the first embodiment (see FIG. 4) may be used.

The DC offset cancellation circuit 210 is provided with a low-pass filter with a characteristics changeover function LPC which receives the third differential signals VD3P, VD3M. The low-pass filter with the characteristics changeover function LPC synchronizes with the inputted characteristics changeover pulse signal xVC, or more specifically, the inversion electrical pulse signal xRX, and changes a cutoff frequency fc and a through rate SR of low-pass characteristics thereof in two steps, respectively (fc1<fc2, SR1<SR2).

The circuit configuration of the low-pass filter with the characteristics changeover function LPC will be explained in details with reference to FIG. 8. The low-pass filter with the characteristics changeover function LPC is an OP-amp circuit including transistors M1 through M6 and a capacitor C1. Given low-pass characteristics by the capacitor C1, the circuit performs low-pass filtration on the third differential signals VD3P, VD3M inputted thereto and outputs resultant signals through the transistor M6. The characteristics changeover circuit CH enclosed by dashed lines is provided with an inverter 201 and a transistor M9. When LOW level is inputted to the circuit as a changeover pulse signal xVC, the transistor M9 is turned ON through the inverter 201. Then, as a current flowing through the OP-amp circuit, a current I1 that flows through the transistor M9 is added to a current I0 defined by the transistor M5. As a result, the through rate SR of the OP-amp circuit including the transistor M9 increases from SR1 (=I0/C1) to SR2 [=(I0/I1)/C1].

The cutoff frequency of the low-pass characteristics also changes from fc1 to fc2. Supposing that a transfer conductance of transistors M1 through M4 in a differential input stage is gm (gm1, gm2), gain $G=\Delta Vo/\Delta Vi=gm1\cdot(1/2\pi fC1)$ when the transistor M9 is OFF. If the frequency (gain bandwidth) f=fb1 in the case of G=1, $2\pi fb1=gm1/C1$. However, this is given by transfer conductance $gm1=\sqrt{(I0\cdot\mu\cdot Cox\cdot W/L)}$, where $\mu$ is mobility, Cox is gate capacitance, W is gate width, and L is gate length.

Similarly, gain $G=\Delta Vo/\Delta Vi=gm2\cdot(1/2\pi fC1)$ when the transistor M9 is ON. If the frequency $f=fb2$ in the case of $G=1$, $2\pi fb2=gm2/C1$. However, this is given by transfer conductance $gm2=\sqrt{((I0+I1)\cdot\mu\cdot Cox\cdot W/L)}$.

Figure 9:
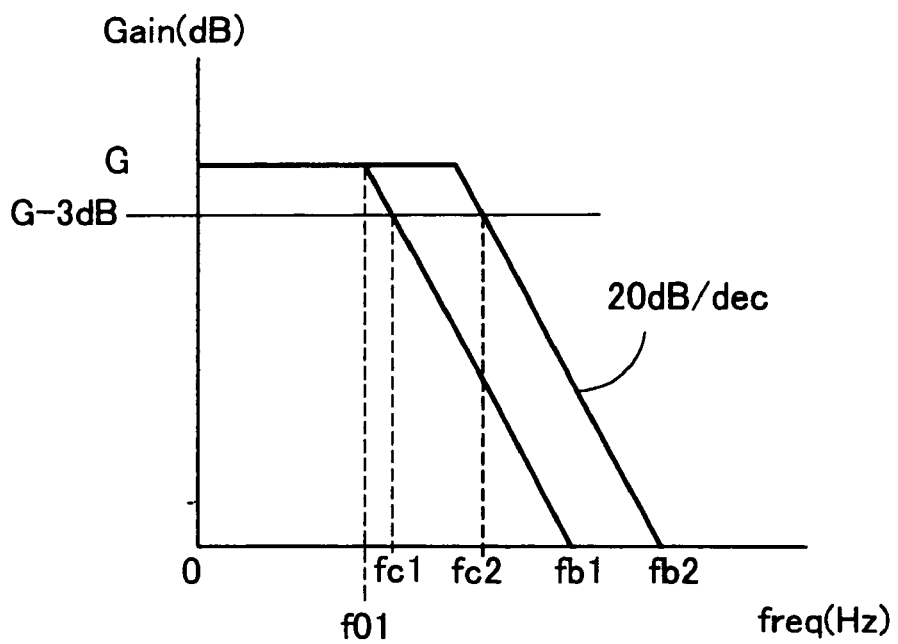
FIG. 9 is a schematic diagram showing the low-pass characteristics of the low-pass filter with the characteristics changeover function LPC.

Referring to FIG. 9, if the low-pass filter with the characteristics changeover function LPC has a first-order lag characteristic as the low-pass characteristics, gains G1, G2 have a gradient of −20 dB/dec in a high-frequency range. Therefore, if fo1 is a gain drop starting frequency, an equation, $\log(fo1)=\log(fc1)-0.15$ is obtained. Thus, an equation, $(\log(fb1)-\log(fc1)+0.15)\times 20=G$ is obtained. Based on this, an equation, $fc1=fb1\times 10^{(3-G)/20}$, and similarly, an equation, $fc2=fb2\times 10^{(3-G)/20}$ are obtained.

On the basis of the above, it is found that $fc1 \propto I0$ and $fc2 \propto (I0+I1)$.

When the transistor M9 of the characteristics changeover circuit CH is turned ON to allow a current I1 to flow with the characteristics changeover pulse signal xVC at LOW level in this manner, the low-pass characteristics are placed in a second state in which both the cutoff frequency and the through rate are increased to fc2 and SR2, respectively. On the other hand, when the characteristics changeover pulse signal xVC is set to HIGH level, the low-pass characteristics are returned to a first state in which both the cutoff frequency and the through rate are decreased to fc1, SR1, respectively. According to the second embodiment, the inversion electrical pulse signal xRX that is inverted to rise at the first timing t1 and re-inverted to fall at the second timing t2 is used as the characteristics changeover pulse signal xVC. Therefore, the configuration of the characteristics changeover circuit CH including the inverter 201 and the transistor M9 can be made simple.

Figure 10:
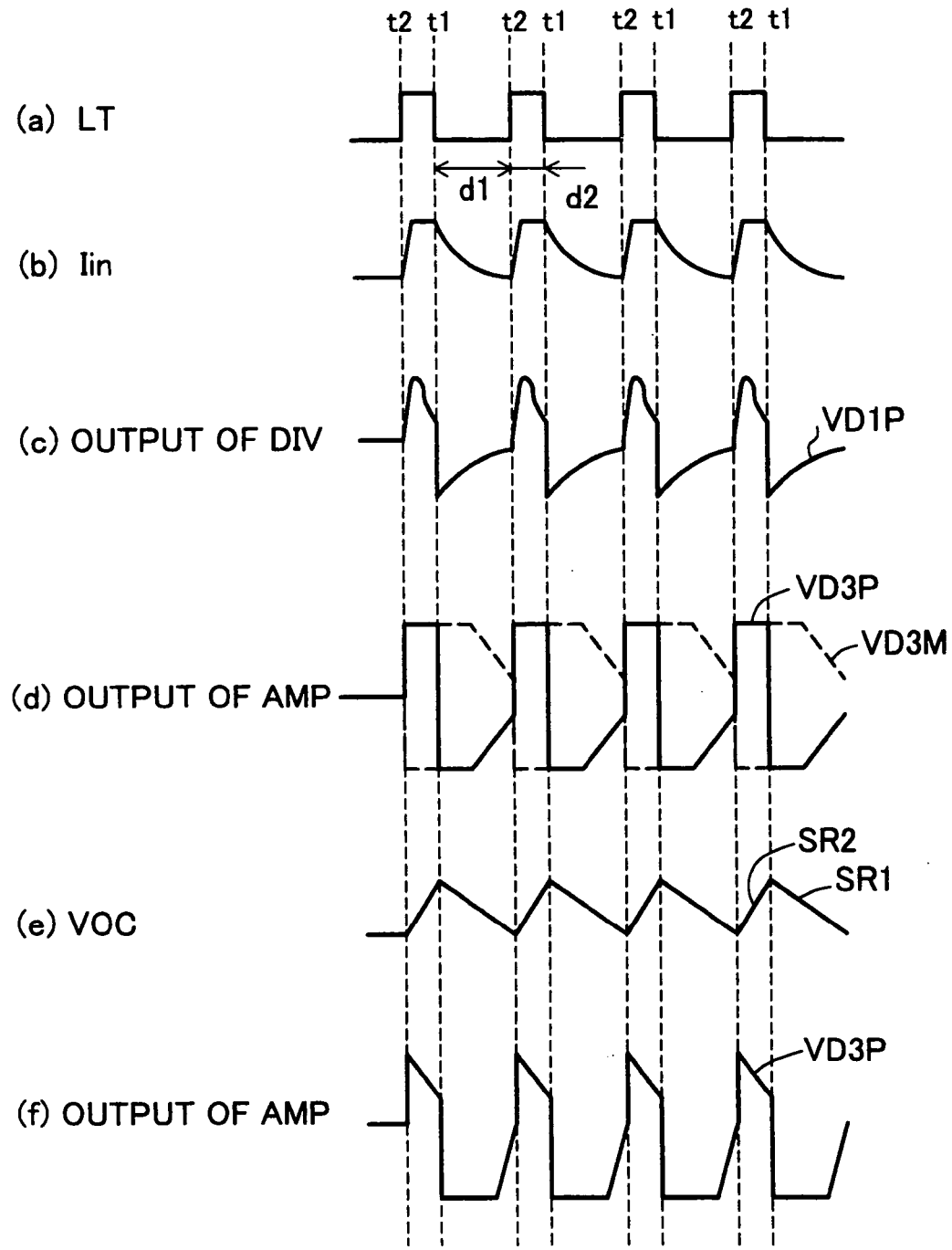
FIG. 10 is a schematic diagram showing a relationship among signals in different parts according to the second embodiment of the invention.

FIG. 10 shows signals at different parts of the photo-electric pulse conversion circuit 200. It is to be noted that the third differential signals VD3P, VD3M that are the outputs from the differential amplification circuit AMP shown in FIG. 10(d) have waveforms different from that before amplification [shown in FIG. 10(c)], since the upper and lower parts of the waveforms are clipped by the upper and lower limits of the amplitude in this example.

The optical pulse signal LT entering the photo-electric pulse conversion circuit 200 rises at the second timing t2 and falls at the first timing t1 as shown in FIG. 10(a). When a period during which the optical pulse signal LT remains at LOW level is a first period d1 (from the timing t1 to t2) and a period during which the optical pulse signal LT remains at HIGH level is a second period d2 (from the timing t2 to t1), a duty ratio D of the optical pulse signal LT is obtained based on the equation, $D=d2/(d1+d2)$. Since an average value Da of the duty ratio D the optical pulse signal LT has is known, the current values I0, I1 of the above-mentioned OP-amp circuit (see FIG. 8) are adjusted so that the relation between the through rates SR1 and SR2 in the low-pass filter with the characteristics changeover function LPC satisfies an equation, $SR2/SR1=(1-Da)/Da$ in the photo-electric pulse conversion circuit 200 according to the second embodiment.

Since the offset cancellation voltage VOC outputted from the low-pass filter with the characteristics changeover function LPC is generated by performing low-pass filtration on the third differential signals VD3P, VD3M [see FIG. 10(d)] outputted from the differential amplification circuit AMP, it contains low-frequency AC components in addition to DC components. Moreover, as shown in FIGS. 10(a) through (d), if the intensity of the optical pulse signal LT entering the photodiode is high (a large signal), changes in the offset cancellation voltage VOC are limited by the through rate of the low-pass filter with the characteristics changeover function LPC, that is, the OP-amp circuit shown in FIG. 8.

Therefore, as shown in FIG. 10(e), AC components of the offset cancellation voltage VOC are represented by the gradient defined by the through rate SR1 during the first period d1 and the gradient defined by the though rate SR2 during the second period d2. That is, the offset cancellation voltage VOC increases at a gradient defined by the though rate SR2 during the second period d2 and decreases at a gradient defined by the through rate SR1 during the first period d1.

Since there is the relation expressed by the equation $SR2/SR1=(1-Da)/Da$ as mentioned above, the amount of increase in the AC components during the second period d2 equals to the amount of decrease in the AC components during the first period d1 on the average. That is, as shown in FIG. 10(e), the offset cancellation voltage VOC remains at nearly the same level, while repeatedly increasing and decreasing due to the AC components. Therefore, AC components are not accumulated.

Even when such an offset cancellation voltage VOC is mixed into the differential voltage signals VD1P, VD1M and is negatively fed back by the mixing circuit OFP, the third differential signals VD3P, VD3M outputted from the differential amplification circuit AMP have only a slight distortion as shown in FIG. 10(f). That is, unlike the photo-electric pulse conversion circuit 20 according to related art 2 described above, the circuit is free from risks of the dynamic range decreasing, the signal amplitude decreasing, and in extreme cases, the third differential signals VD3P, VD3M disappearing. It is therefore possible to obtain the inversion electrical pulse signal xRX that accurately corresponds to the optical pulse signal LT.

In the case described above, fluctuations in AC components of the offset cancellation voltage VOC are limited by the through rate SR, since a large signal is inputted to the low-pass filter with the characteristics changeover function LPC. On the other hand, when a relatively small signal is inputted and fluctuations in AC components are not limited by the through rate, it is preferable to perform the following procedure. Namely, when a relatively small signal is inputted, the fluctuations in AC components are limited by the frequency characteristics of the low-pass filter with the characteristics changeover function LPC, particularly the cutoff frequency fc (fc1, fc2).

If an average duty ratio Da is previously known, the current values I0, I1 of the above-mentioned OP-amp circuit (see FIG. 8) are adjusted so that the relation between the cutoff frequency fc1 and fc2 of the low-pass filter with the characteristics changeover function LPC satisfies an equation, $fc2/fc1=(1-Da)/Da$.

The AC components of the offset cancellation voltage VOC increase at a gradient determined by the cutoff frequency fc2 during the second period d2 and decrease at a gradient determined by the cutoff frequency fc1 during the first period d1.

Since there is the relation expressed by the equation $fc2/fc1=(1-Da)/Da$ as described above, the amount of increase in the AC components during the second period d2 equals to the amount of decrease in the AC components during the first period d1 on the average. Even when a small signal is inputted, the offset cancellation voltage VOC remains at nearly the same level, while repeatedly increasing and decreasing due to the AC components in nearly the same manner as shown in the graph of FIG. 10(e). Therefore, AC components are not accumulated.

The third differential signals VD3P, VD3M therefore have only a slight distortion. There is no risk of the dynamic range decreasing, the signal amplitude decreasing, and in extreme cases, the third differential signals VD3P, VD3M disappearing. It is therefore possible to obtain the inversion electrical pulse signal xRX that accurately corresponds to the optical pulse signal LT.

As can be easily understood, the same results can be obtained when the duty ratio D of the optical pulse signal LT remains constant (D=Da).

According to the second embodiment, since the DC offset circuit 210 is inserted between the differential input terminals and the differential output terminals of the differential amplification circuit AMP as described above, the DC offset voltage of the differential amplification circuit AMP1 is canceled and it is possible to obtain the third differential signals V3P, V3M with a small distortion whose amplitudes do not decrease, and which do not disappear. Therefore, the photo-electric pulse conversion circuit 200 can generate the inversion electric pulse signal xRX that accurately reproduces the rise and fall timings of the optical pulse signal.

Figure 7:
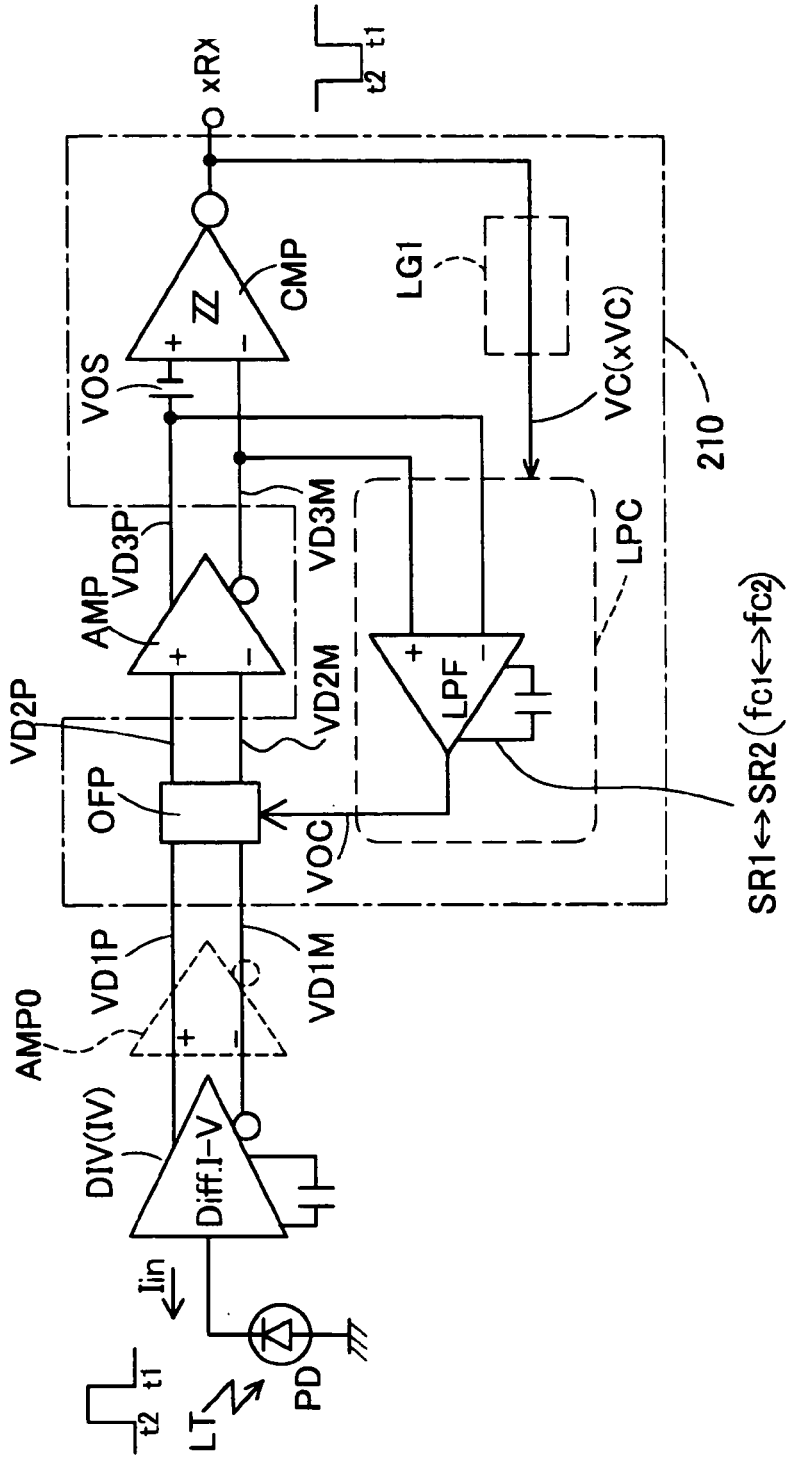
FIG. 7 is a circuit diagram showing a photo-electric pulse conversion circuit according to a second embodiment of the invention.
Figure 8:
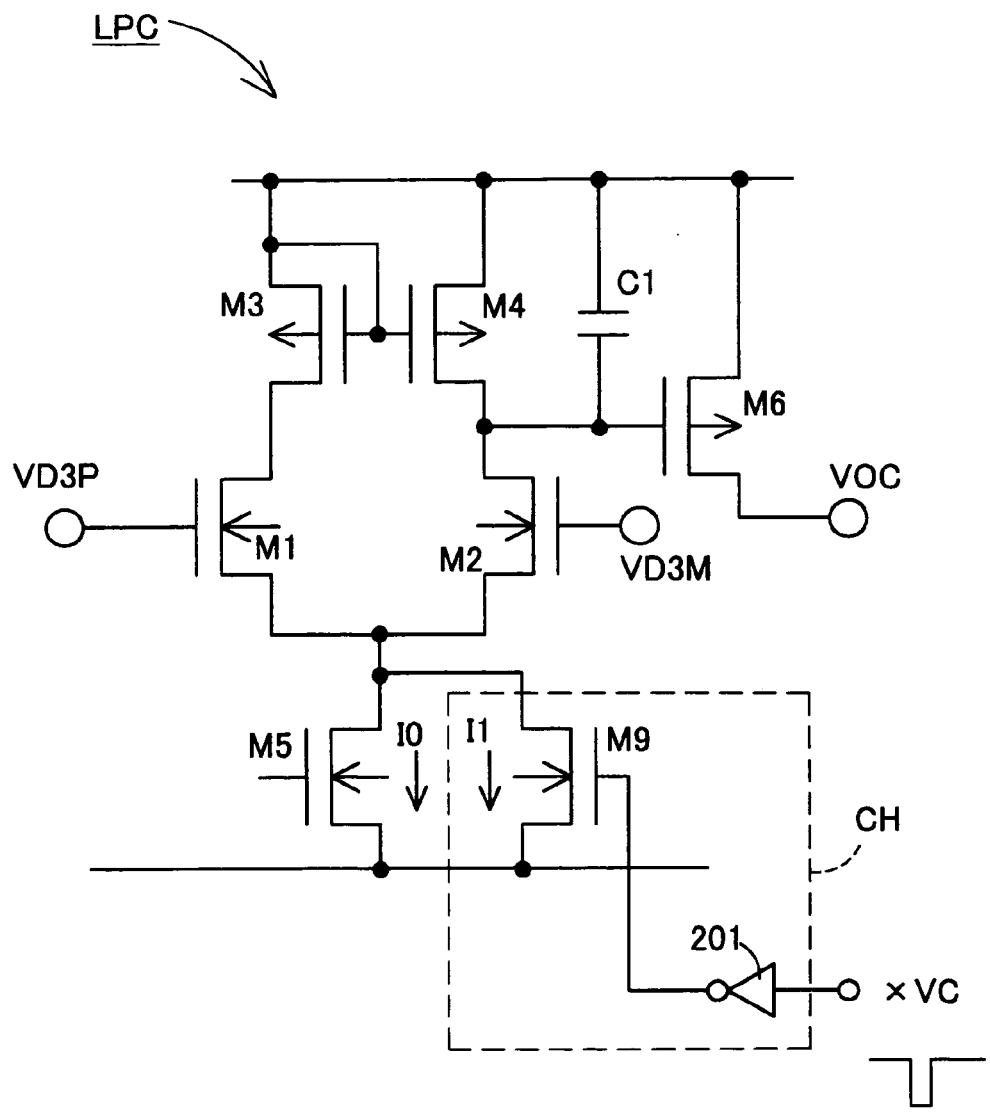
FIG. 8 is a circuit diagram showing a circuit configuration of a low-pass filter with a characteristics changeover function LPC having low-pass characteristics and capable of changing a cutoff frequency and a through rate of the low-pass characteristics.

Furthermore, as in the hold reset circuit HR of the first embodiment, it is preferable to provide a characteristics reset circuit LG1 (see FIGS. 5 and 11) that performs logic processing and outputs the inversion electrical pulse signal xRX as shown in dashed lines in FIG. 7. If the level of the inversion electrical pulse signal xRX is inverted to LOW level due to intrusion of noise in the circuit or other reasons, the inversion electrical pulse signal xRX may be permanently fixed to LOW level as shown by chain lines in FIG. 11, causing the through rate and the cutoff frequency of the low-pass filter with the characteristics changeover function LPC to be fixed to SR2 and fc2, respectively. By providing the characteristics reset circuit LG1, however, the changeover pulse signal xVC is forcibly set to HIGH level after a lapse of a predetermined period of time T as shown by solid lines in FIG. 11, thereby returning the level of the inversion electrical pulse signal xRX to HIGH level. Thereafter, the circuit can properly output the inversion electrical pulse signal xRX according to the optical pulse signal LT, and the through rate and the cutoff frequency of the low-pass filter with the characteristics changeover function LPC become changeable once again.

According to the second embodiment, there is provided the comparison circuit CMP as the characteristics changeover instruction circuit and the characteristics changeover circuit CH performs changeover between a first state and a second state according to the instruction provided by the characteristics changeover instruction circuit. Since the characteristics of the low-pass filter are changed at a first timing and a second timing corresponding to a falling edge and a rising edge, of the pulse signal, respectively, changeover can be performed by the characteristics changeover circuit CH with a simple configuration. According to the second embodiment, the characteristics of the low-pass filter are changed by the characteristics changeover circuit CH in two steps. However, a characteristics changing circuit may be configured so as to change the cutoff frequency and the through rate from one value to another in such a step-by-step manner or to change them continuously.

In the second embodiment, the differentiating I–V conversion circuit DIV and the offset adding circuit OFP are directly connected to each other. However, as shown by dashed lines in FIG. 7, the configuration may be such that the current signal Iin is once converted to a differentiated voltage waveform by the differentiating I–V conversion circuit DIV and is further amplified by the differential amplifier AMP0 to generate differential voltage signals VD1P, VD1M, which are then inputted to the offset adding circuit OFP. As described above, any differentiating I–V conversion circuit DIV is acceptable as long as it converts the current signal to a pair of corresponding differential voltage signals having a waveform similar to a differentiated waveform of the current signal and outputs these differential voltage signals. Thus, a circuit that performs amplification and conversion concurrently, or performs amplification following conversion is also included.

Figure 12:
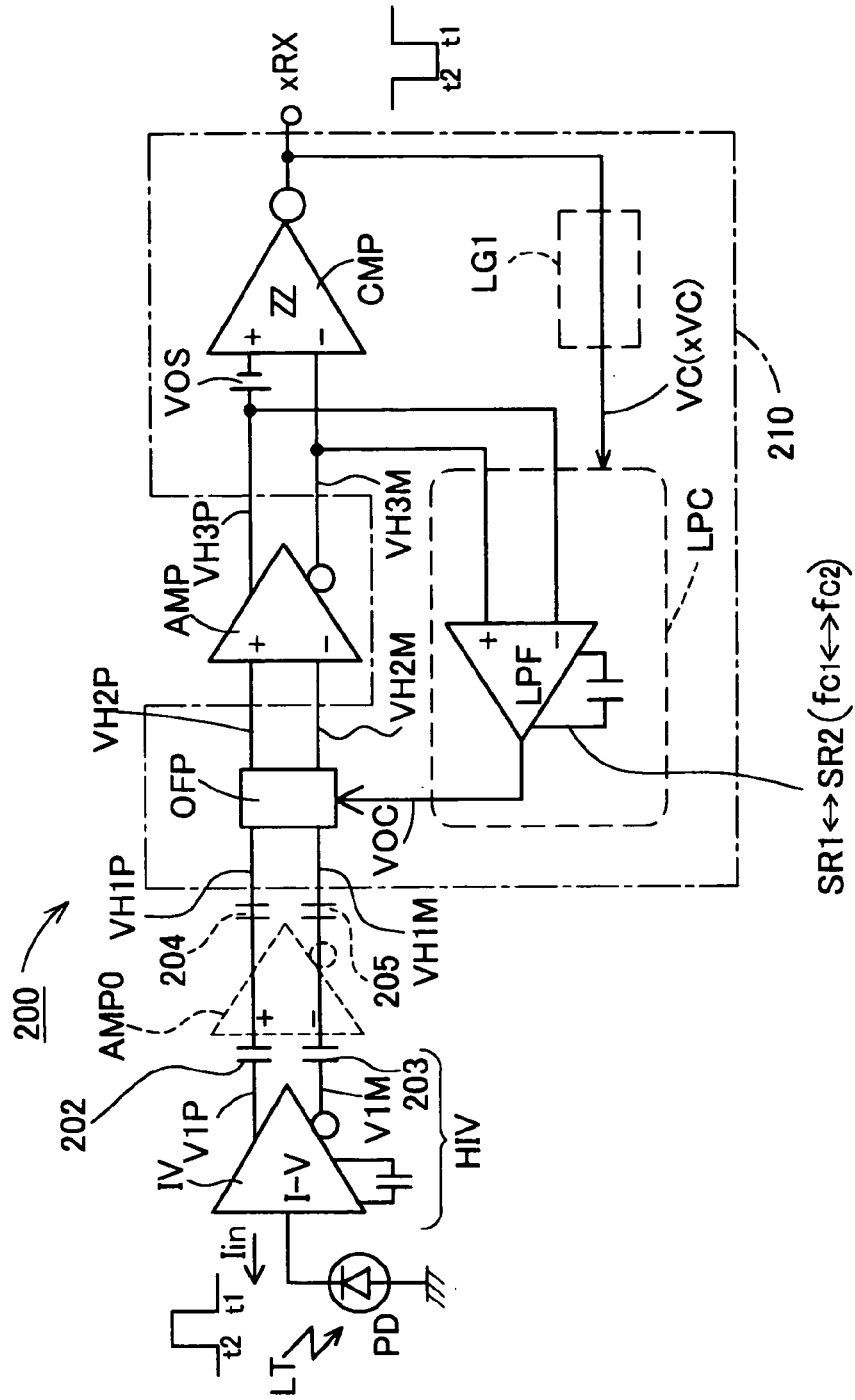
FIG. 12 is a circuit diagram showing a photo-electric pulse conversion circuit employing a high-pass I–V conversion circuit.

Further, referring to FIG. 12, the I–V conversion circuit IV used in the first embodiment and a high-pass I–V conversion circuit HIV provided with capacitive coupling capacitors 202, 203 may be used instead of the differentiating I–V conversion circuit DIV. Namely, the configuration may be such that the differential voltage signals V1P, V1M outputted from the I–V conversion circuit IV are subjected to high-pass filtration through capacitors 202, 203 to generate differential voltage signals VH1P, VH1M having waveforms nearly similar to those of the differential voltage signals VD1P, VD1M in the second embodiment, and the resultant signals are inputted to the mixing circuit OFP.

Subsequently, as in the second embodiment, the signals are mixed with the offset cancellation signal VOC by the offset-added signal generation circuit OFS, and then inputted to the differential amplification circuit AMP. The outputs therefrom, that is, the third differential signals VH3P, VH3M are negatively fed back to the low-pass filter with the characteristics changeover function LPC, while being compared by the comparison circuit CMP to obtain the inversion electrical pulse signal xRX.

When high-pass filtration is performed by means of capacitive coupling, instead of performing differentiation of signal waveforms, it is still possible to generate electrical pulse signals RX, xRX having the pulse width tpw of the optical pulse signal LT in this manner.

Further, as shown by dashed lines in FIG. 12, a differential amplification circuit AMP0 may be disposed at a stage subsequent to capacitors 202, 203 so that the outputs from the capacitors 202, 203 may be amplified before being inputted to the mixing circuit OFP.

On the contrary, instead of the capacitors 202, 203, capacitive coupling capacitors 204, 205 shown by dashed lines may be disposed at a stage subsequent to the differential amplification circuit AMP0 to amplify the differential voltage signals V1P, V1M and these amplified signals may then be inputted to the mixing circuit OFP through capacitors 204, 205.

As described above, possible high-pass I–V conversion circuits include a circuit that performs current-to-voltage conversion on a current signal to produce a differential voltage signal and outputs the differential voltage signals through capacitive coupling capacitors, and a circuit that performs further amplification after passing the signals through the capacitors and then output the signals. Also included is a circuit configured so as to perform amplification and conversion concurrently, or to perform amplification following conversion when converting the current signal to the differential voltage signals for outputting the amplified differential voltage signals through the capacitive coupling capacitors.

(Third Embodiment)

A third embodiment of the invention will be explained with reference to FIGS. 13 through 18. A photo-electric pulse conversion circuit 300 according to the third embodiment shown in FIG. 13 has nearly the same configuration in a first half portion thereof as the above-mentioned photoelectric pulse conversion circuit 30. However, the circuit is different in that a pulse shaping circuit 310 includes an offset-added signal generation circuit OFS that generates a signal to which an offset voltage has been added, two comparison circuits CMP1, CMP2, and a logic processing circuit LGC in stages subsequent to a differentiating differential amplification circuit DAMP.

Therefore, an optical pulse signal LT that rises at a second timing t2 and falls at a first timing t1 is received by a photodiode PD to obtain a current signal Iin also in this photo-electric pulse conversion circuit 300. The current signal Iin is thereafter converted to a corresponding voltage signal V1 and the resultant voltage signal V1 is outputted by the I–V conversion circuit IV. The voltage signal V1 is then amplified by a differential amplification circuit AMP. The differentiating differential amplification circuit DAMP further differentiates and amplifies second differential signals V2P, V2M and then outputs a pair of complementary differentiated differential signals VD1, VD2 (a non-inversion first signal VD1, a non-inversion second signal VD2).

The photo-electric pulse conversion circuit 300 then uses the offset-added signal generation circuit OFS to generate a non-inversion third signal VD3 by adding a first and a second offset voltage Δvof1, Δvof2 to differentiated differential signals VD1, VD2, a non-inversion fourth signal VD4, a non-inversion fifth signal VD5, and an inversion sixth signal VD6. More specifically, each offset voltage is added so that the non-inversion fifth signal is decreased relatively with respect to the non-inversion third signal VD3 by an amount equivalent to the first offset voltage Δvof1 and the inversion sixth signal is decreased relatively with respect to an inversion fourth signal by an amount equivalent to the second offset voltage Δvof2.

Figure 17:
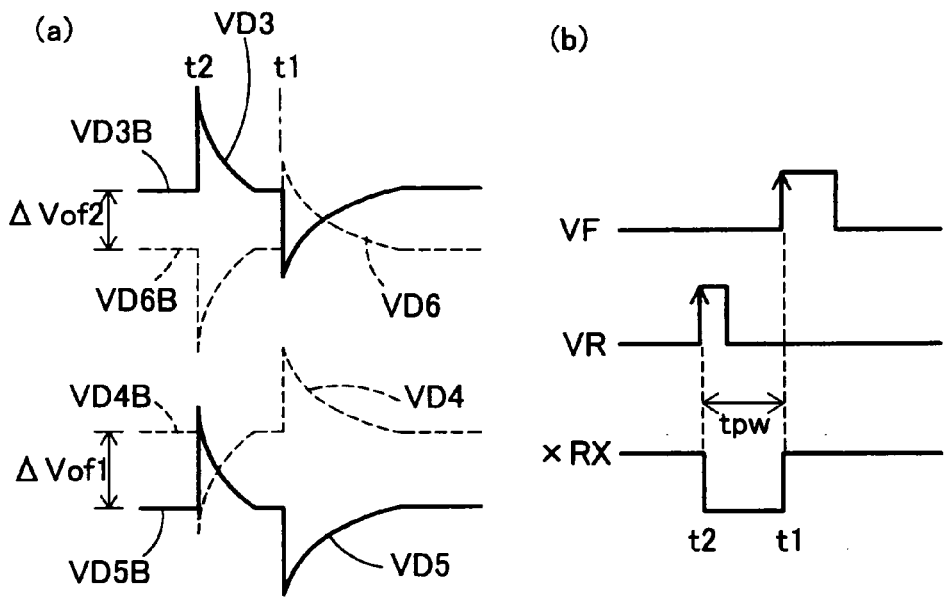
FIG. 17 is a schematic diagram showing a relationship among a non-inversion third signal, an inversion fourth signal, a non-inversion fifth signal, and an inversion sixth signal, and a relationship among a seventh signal, an eighth signal, and an inversion electrical pulse signal xRX when a small signal is inputted.
Figure 18:
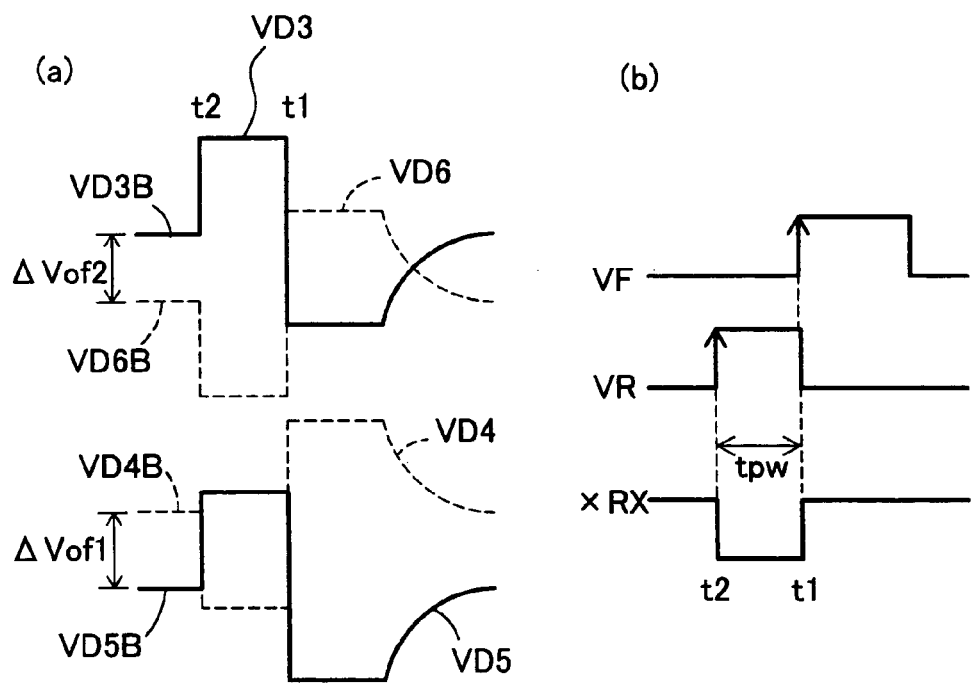
FIG. 18 is a schematic diagram showing a relationship among a non-inversion third signal, an inversion fourth signal, a non-inversion fifth signal, and an inversion sixth signal, and a relationship among a seventh signal, an eighth signal, and an inversion electrical pulse signal xRX when a large signal is inputted.

If the DC offset voltage occurring between the differentiated differential signals VD1 and VD2 is ignored, a first reference voltage VD1B of the non-inversion first signal VD1 equals to a second reference voltage VD2B of the inversion second signal VD2. Therefore, the offset voltage is added as described above so that a fourth reference voltage VD4B of the inversion fourth signal VD4 becomes relatively higher than a third reference voltage VD3B of the non-inversion third. signal VD3 by an amount equivalent to the first offset voltage Δvof1 (see FIGS. 17, 18). Also, the offset voltage is added so that a sixth reference voltage VD6B of the inversion sixth signal VD6 becomes relatively higher than a fifth reference voltage VD5B of the non-inversion fifth signal VD5 by an amount equivalent to the second offset voltage Δvof2. FIG. 17 shows a case where a small signal is inputted, while FIG. 18 shows a case where a large signal is inputted as the optical pulse LT.

Figure 14:
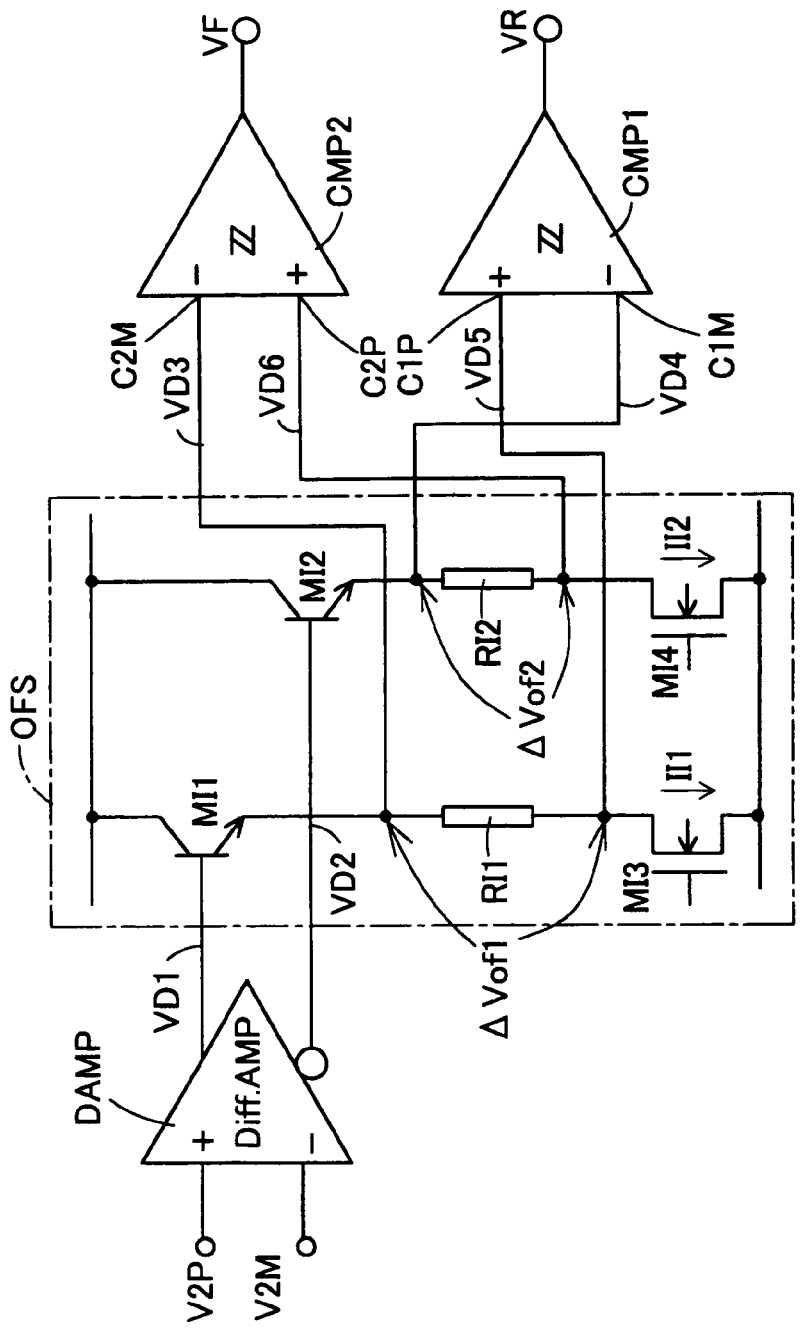
FIG. 14 is a circuit diagram showing a circuit configuration of an offset-added signal generation circuit OFS according to the third embodiment.

FIG. 14 is a circuit diagram showing a typical circuit configuration of the offset-added signal generation circuit OFS. The offset-added signal generation circuit OFS includes a circuit in which a transistor MI1, a resistor RI1, and a transistor MI3 are connected in series and a circuit in which a transistor MI2, a resistor RI2, and a transistor MI4 are connected in series. Since constant currents I1, I2 flow through the transistors MI3, MI4, respectively, the constant first offset voltage Δvof1 and the constant second offset voltage Δvof2 are generated between both ends of the resistors RI1, RI2, respectively. Signals are outputted according to the non-inversion first signal VD1 and the inversion second signal VD2 inputted to bases of the transistors MI1, MI2, respectively. Meanwhile, the non-inversion fifth signal becomes relatively lower than the non-inversion third signal VD3 by an amount equivalent to the first offset voltage Δvof1, and the inversion sixth signal becomes relatively lower than the inversion fourth signal VD4 by an amount equivalent to the second offset voltage Δvof2. The reference levels of the non-inversion first signal VD1 and the inversion second signal VD2 are almost the same if the DC offset voltage occurring in the differentiating differential amplification circuit DAMP. Therefore, it is easy to obtain each of those signals (non-inversion third signal VD3, non-inversion fifth signal VD5, inversion fourth signal VD4, inversion sixth signal VD6) by adding the first and the second offset voltages Δvof1, Δvof2.

The non-inversion fifth signal VD5 and the inversion fourth signal VD4 thus obtained are compared with each other by the first comparison circuit CMP1 to obtain a seventh signal or an inversion seventh signal as will be described later. In addition, the non-inversion third signal VD3 and the inversion sixth signal VD6 thus obtained are compared with each other by the second comparison circuit CMP2 to obtain an eighth signal or an inversion eighth signal as will be described later.

Figure 15:
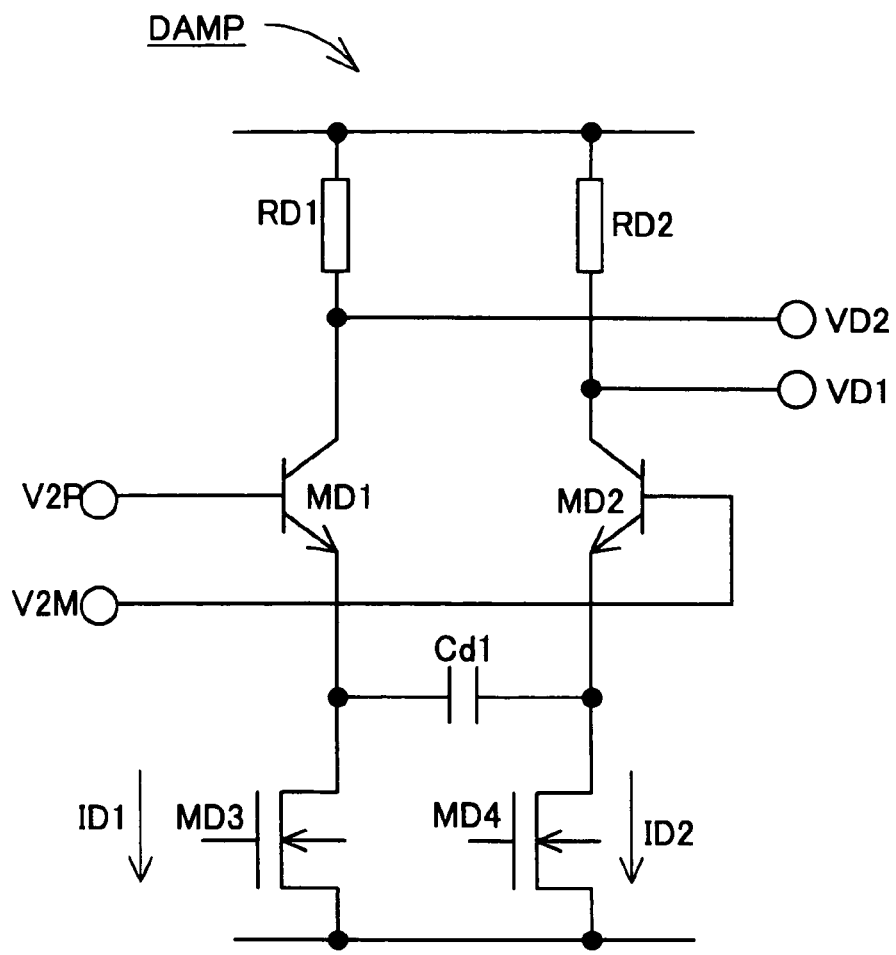
FIG. 15 is a circuit diagram showing a circuit configuration of a differentiating differential amplification circuit DAMP according to the third embodiment of the invention.

FIG. 15 is a circuit diagram showing a typical circuit configuration of the differentiating differential amplification circuit DAMP. There is interposed a capacitor Cd1 between a circuit in which a resistor RD1 and transistors MD1, MD3 are connected in series and a circuit in which a resistor RD2 and transistors MD2, MD4 are connected in series. Therefore, when a pair of complementary second differential signals V2P, V2M are inputted to input terminals, a pair of complementary differentiated differential signals VD1, VD2 generated by differentiating the inputted signals are outputted from output terminals, respectively.

Figure 16:
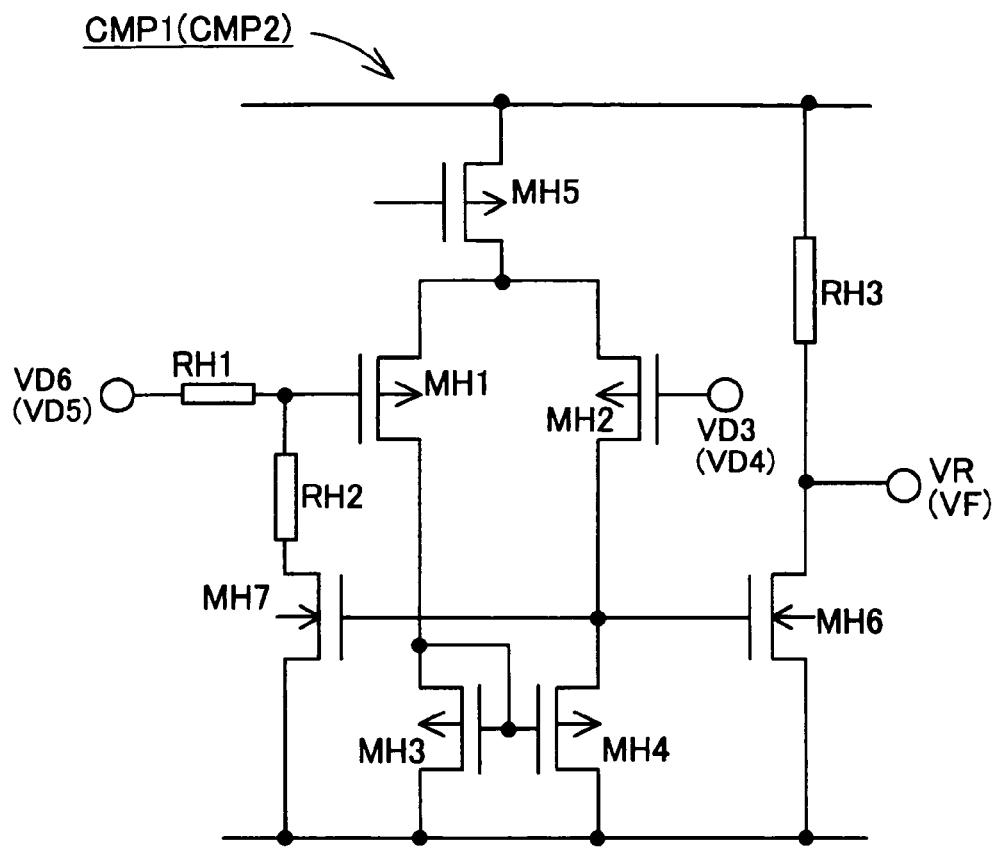
FIG. 16 is a circuit diagram showing a circuit configuration of a first and a second comparison circuit according to the third embodiment of the invention.

FIG. 16 is a circuit diagram showing a typical circuit configuration of the first and the second comparison circuits CMP1, CMP2. They are comparison circuits with hysteresis including transistors MH1 through MH7 and resistors RH1 through RH3.

The operations of the offset-added signal generation circuit OFS and the first and the second comparison circuits CMP1, CMP2 will be explained. The operations in a case where the optical pulse signal LT is a relatively small signal will be first explained. Since the second differential signals V2P, V2M also have relatively small amplitudes in this case, the signals obtained by differentiating these signals, that is, the differentiated differential signals VD1, VD2 have waveforms that sharply rise (fall) at the first and second timings t1, t2 and there after gradually attenuates. Therefore, the non-inversion third signal VD3, the inversion fourth signal VD4, the non-inversion fifth signal VD5, and the inversion sixth signal VD6 to which the offset voltage has been added also have waveforms that sharply rise (fall) at the second timing t2 and thereafter gradually attenuates, and sharply fall (rise) in a reverse direction at the first timing t1 and thereafter gradually attenuates as shown in FIG. 17(a).

When the non-inversion fifth signal VD5 is superimposed on the inversion fourth signal VD4, and the non-inversion third signal VD3 is superimposed on the inversion sixth signal VD6 in a figure as shown in FIG. 17(a), it is revealed that there is a potential difference equivalent to the first offset voltage Δvof1 and the second offset voltage Δvof2 between the reference voltages VD3B etc. of these signals, respectively, because the first offset voltage Δvof1 and the second offset voltage Δvof2 have been added as described above.

Figure 13:
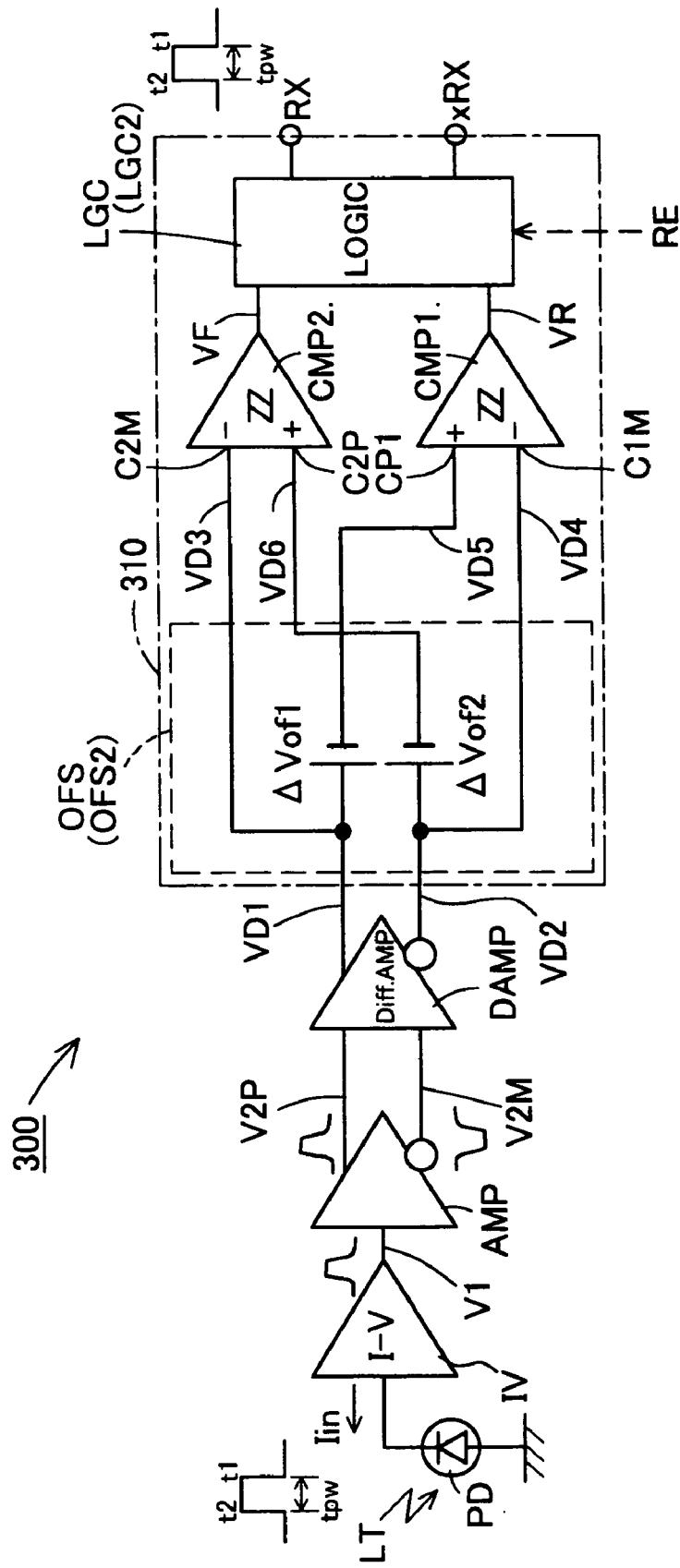
FIG. 13 is a circuit diagram of a photo-electric conversion circuit according to a third embodiment.

Referring to FIGS. 13 and 14, when the non-inversion fifth signal VD5 is inputted to a non-inversion input terminal C1P of the first comparison circuit CMP1 and the inversion fourth signal. VD4 is inputted to an inversion input terminal C1M of the first comparison circuit CMP1, the seventh signal VR that rises at the timing t2 can be obtained [see FIG. 17 (b)]. When the non-inversion third signal VD3 is inputted to an inversion input terminal C2M of the second comparison circuit CMP2 and the inversion sixth signal VD6 is inputted to a non-inversion input terminal C2P of the second comparison circuit CMP2, the eighth signal VF that rises at the timing t1 can be obtained. Namely, in the above-mentioned photo-electric pulse conversion circuit 30, only one comparison circuit CMP is used to generate the inversion electrical pulse signal xRX that falls at the timing t2 and rises at the timing t1. On the other hand, according to the third embodiment, the timing t2 is detected by the first comparison circuit and the timing t1 is detected by the second comparison circuit.

Figure 19:
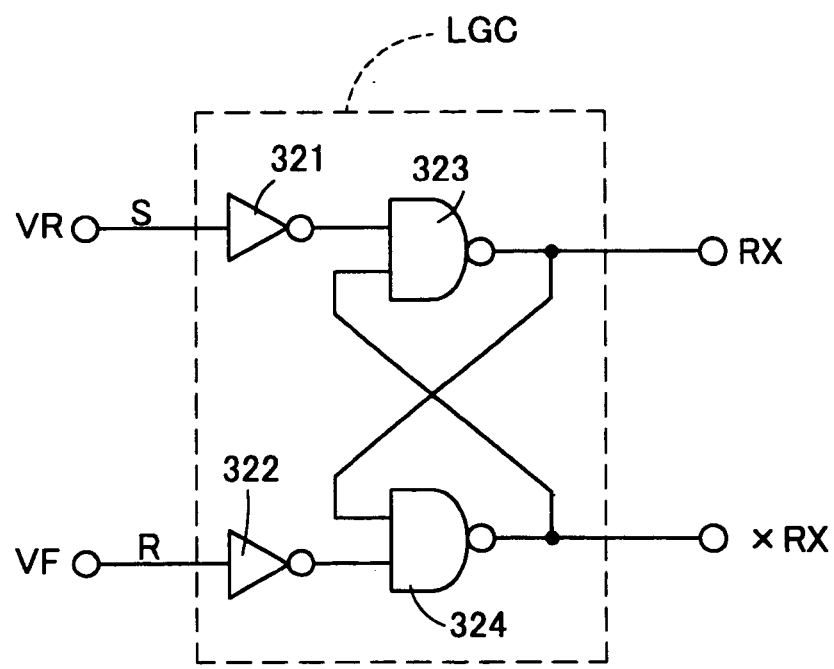
FIG. 19 is a circuit diagram showing a logic circuit of a logic processing circuit LGC.

Thereafter, the seventh signal VR and the eighth signal VF are processed by the logic processing circuit LGC to obtain the non-inversion electrical pulse signal RX and the inversion electrical pulse signal xRX as shown in FIG. 13. As the logic processing circuit LGC, any logic processing is acceptable as long as it is capable of performing logic inversion by using the respective rising edges of the seventh signal VR and the eighth signal VF. For example, it might be appropriate to employ a known SR latch (flip-flop) circuit including inverter devices 321, 322 and NAND devices 323, 324 as shown in FIG. 19 because of ease of the configuration or other reasons. By inputting the seventh signal VR to an S terminal and the eighth signal to an R terminal using such a logic processing circuit (SR latch circuit) LGC, it is possible to obtain the inversion electrical pulse signal xRX that falls at the timing t2, rises at the timing t1, and has the pulse width tpw almost equal to that of the optical pulse signal LT.

The operations in a case where the optical pulse signal LT is a relatively large signal will be next explained. Since the second differential signals V2P, V2M have relatively large amplitudes in this case, the signals obtained by differentiating these signals, namely the differentiated differential signals VD1, VD2 swing to the upper limit value and the lower limit value, exhibiting a waveform that sharply rises (falls) at the timings t2 and t1 and has a top end (a bottom end) clipped so as to be flat. The non-inversion third signal VD3, the inversion fourth signal VD4, the non-inversion fifth signal VD5, and the inversion sixth signal VD6 to which the offset voltage has been added also exhibit waveforms that sharply rise (fall) at the timing t2, have a top end (a bottom end) clipped to be flat, sharply fall (rise) in a reverse direction at the timing t1, and have the bottom end (the top end) clipped to be flat, as shown in FIG. 18(a).

When the non-inversion fifth signal VD5 is superimposed on the inversion fourth signal VD4, and the non-inversion third signal VD3 is superimposed on the inversion sixth signal VD6 in a figure as shown in FIG. 18(a), it is revealed that there is a voltage difference equivalent to the first offset voltage NOR device 334 to be inputted to the xR terminal.

Figure 20:
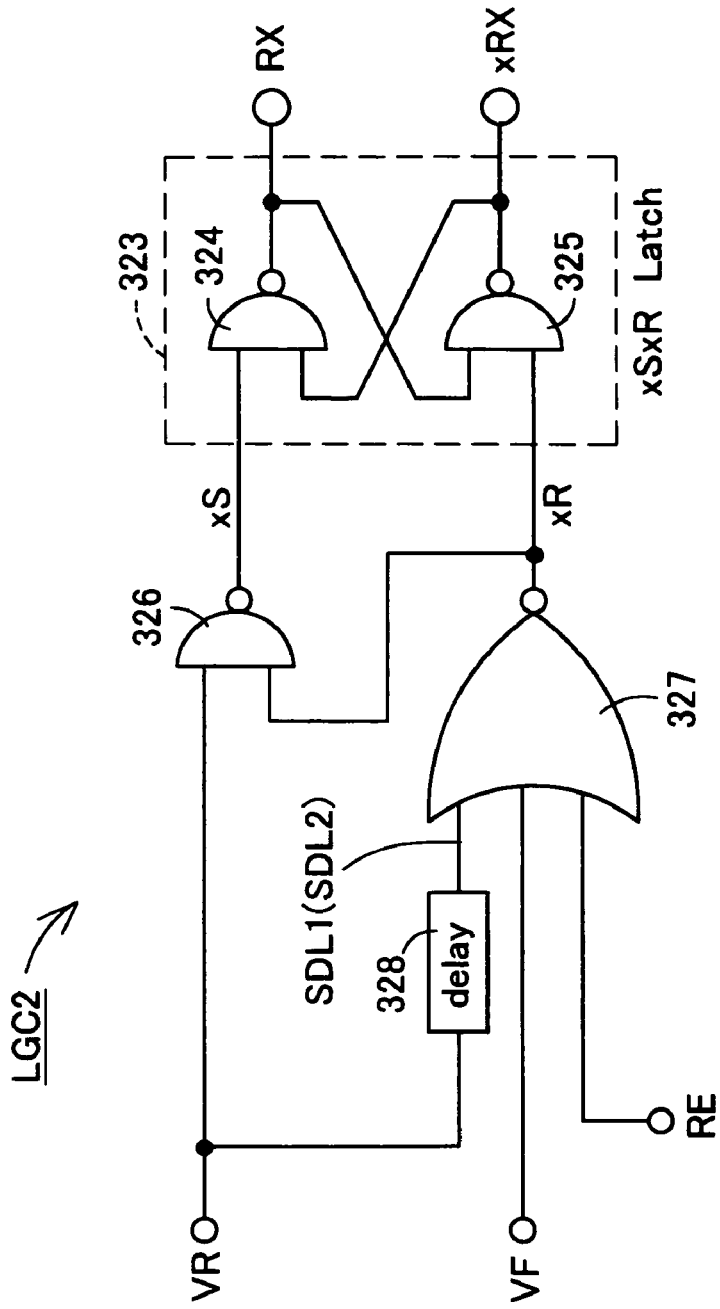
FIG. 20 is a circuit diagram showing a logic circuit of an improved logic processing circuit LGC2.
Figure 21:
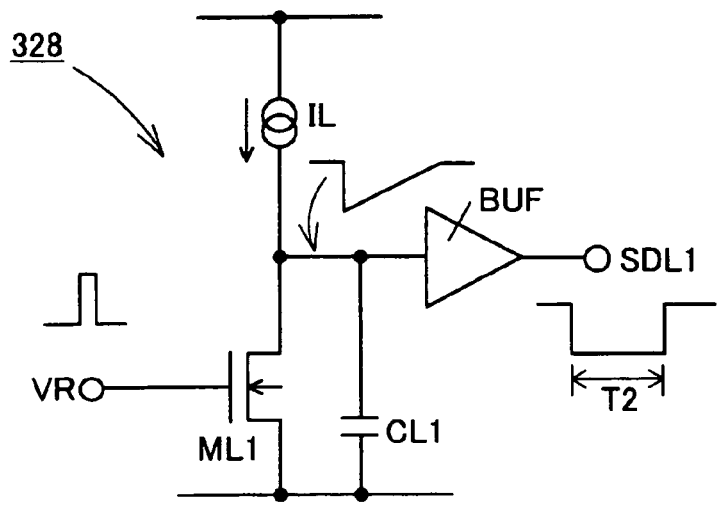
FIG. 21 is a schematic diagram showing a circuit configuration of a delay circuit in the logic processing circuit LGC2 and operations thereof.
Figure 22:
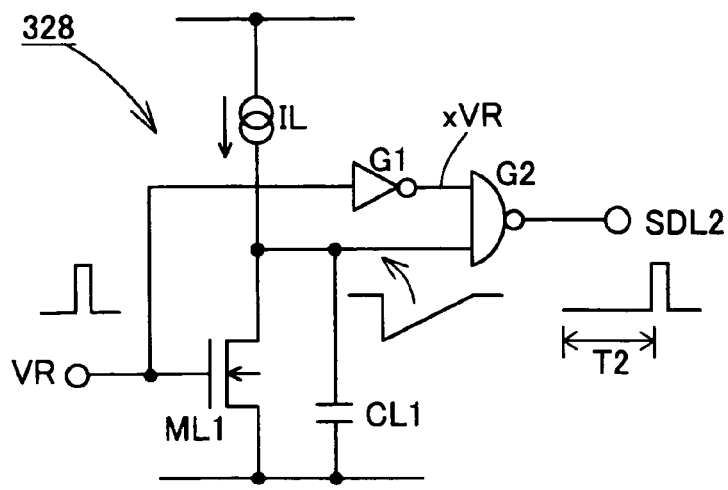
FIG. 22 is a schematic diagram showing another circuit configuration of the delay circuit in the logic processing circuit LGC2 and operations thereof.
Figure 23:
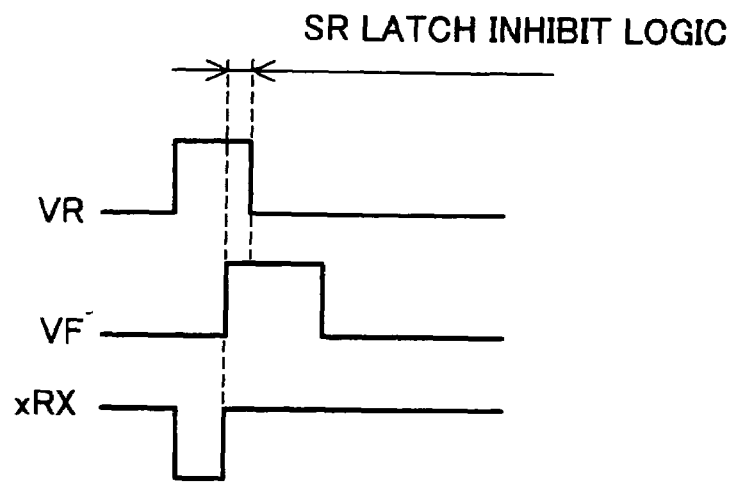
FIG. 23 is a schematic diagram showing an operation when an SR latch (flip-flop) inhibit logic is inputted in the logic processing circuit LGC2.
Figure 24:
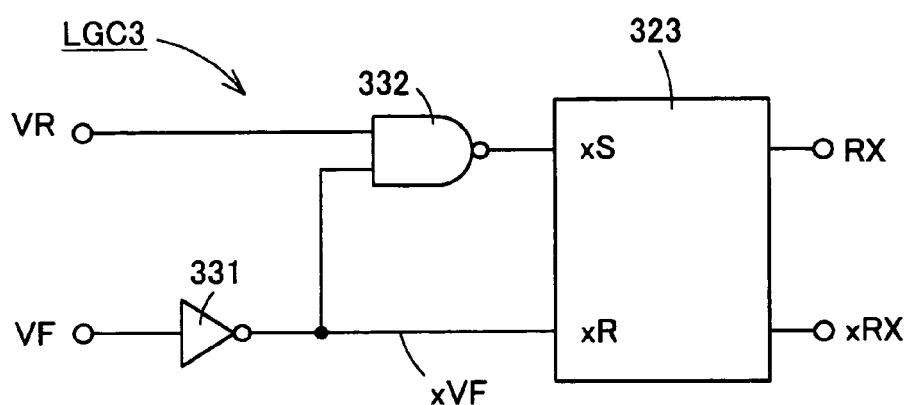
FIG. 24 is a circuit diagram showing a logic circuit of another logic processing circuit LGC3, in which a measure of the SR latch (flip-flop) inhibit logic has been taken.
Figure 25:
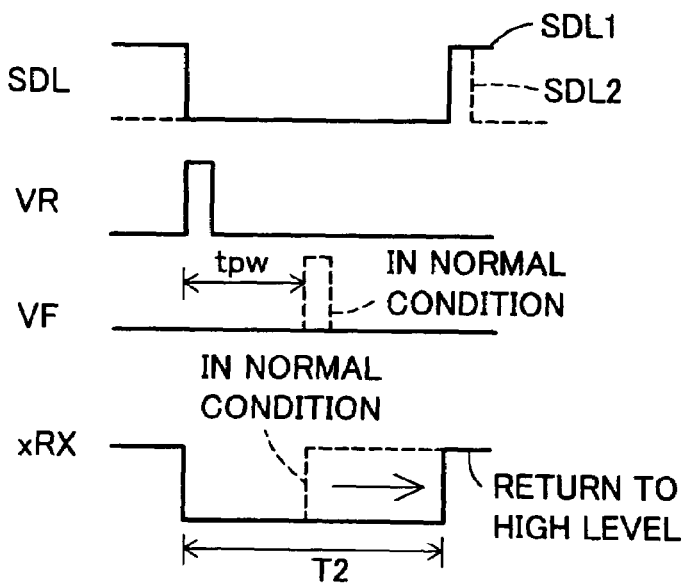
FIG. 25 is a schematic diagram showing an operation when a seventh signal is inputted due to noise or the like in the logic processing circuit LGC2.
Figure 26:
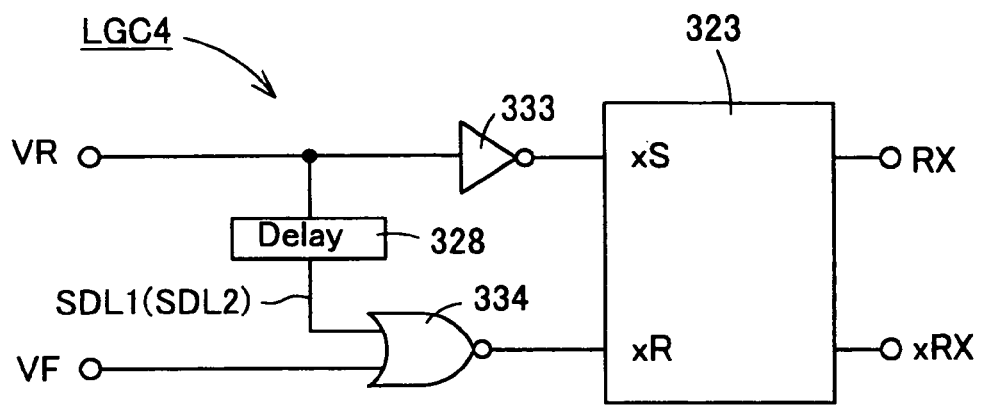
FIG. 26 is a circuit diagram showing a logic circuit of another logic processing circuit LGC4, in which a measure has been taken against a malfunction of the seventh signal.

In addition, in the above-mentioned logic processing circuit LGC2 shown in FIG. 20, the xSxR latch (flip-flop) circuit 323 can be reset by setting the reset signal RE to HIGH level. For example, the xSxR latch (flip-flop) circuit 323 may be reset when the circuit is started to prevent a malfunction thereof.

Figure 27:
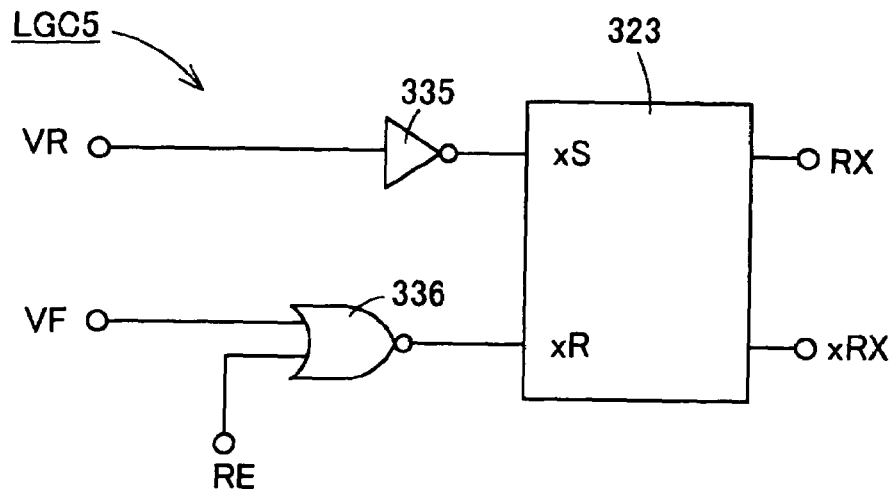
FIG. 27 is a circuit diagram showing a logic circuit of another logic processing circuit LGC5 that allows an SR latch (flip-flop) circuit to be reset.

A logic processing circuit LGC5 shown in FIG. 27 may be employed to realize this function. That is, in the logic processing-circuit LGC5, the seventh signal VR is inverted using an inverter device 335 and inputted to the xS terminal of the xSxR latch (flip-flop) circuit 323, while the eighth signal VF and the reset signal RE are subjected to NOR processing performed by the NOR device 336 to be inputted to the xR terminal.

(Second Modification)

According to the third embodiment, the first and the second offset voltages ΔVof1, ΔVof2 added by the offset-added signal generation circuit OFS (see FIG. 14) are fixed. The offset voltages are added to prevent a malfunction due to noise or the like and the magnitude of noise varies greatly depending on the environment in which the photo-electric pulse conversion circuit 300 is installed or other factors. It is therefore preferable that an arrangement that allows the first and the second offset voltages ΔVof1, ΔVof2 to be varied as necessary be provided.

Figure 28:
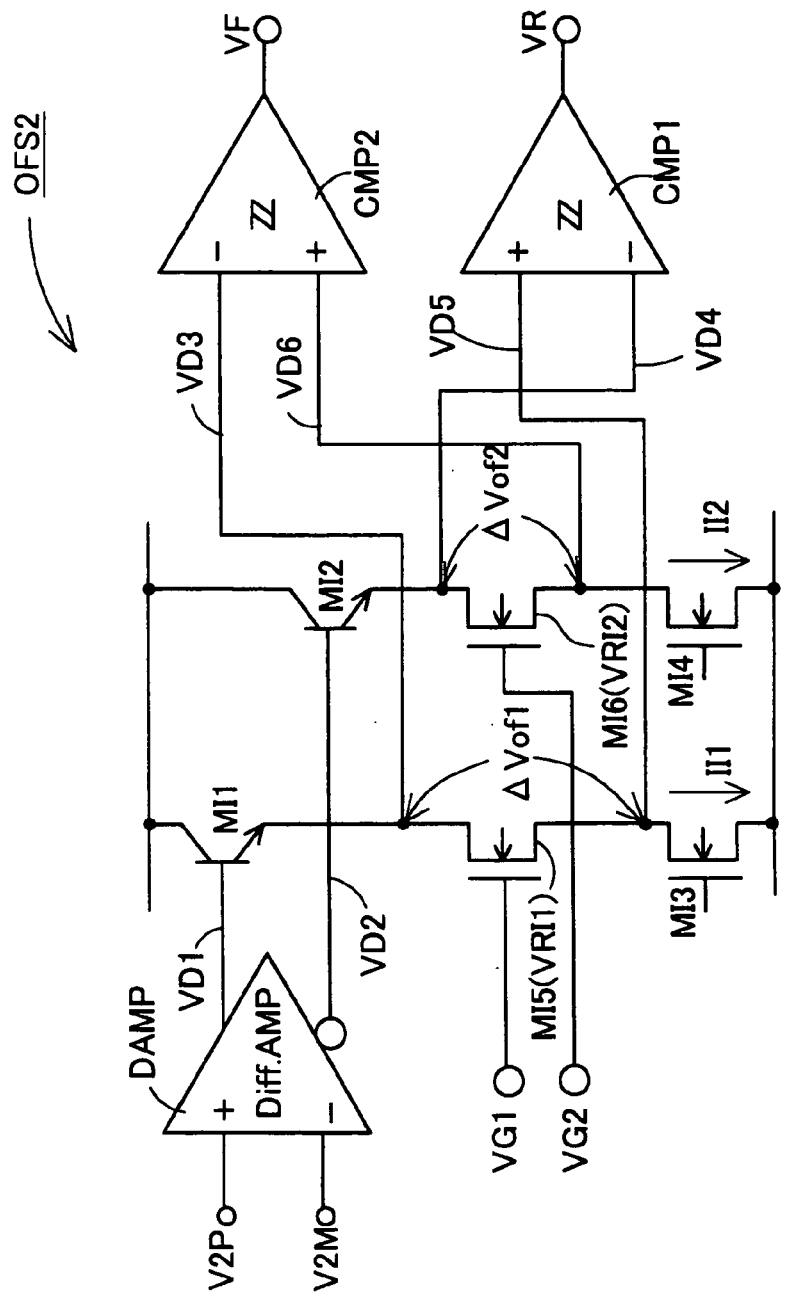
FIG. 28 is a circuit diagram showing a circuit configuration of an offset-added signal generation circuit OFS2 that allows a resistance value to be changed.

In an offset-added signal generation circuit OFS2 according to a second modification, variable resistors are used instead of the resistors RI1, RI2 employed in the offset-added signal generation circuit OFS (see FIG. 14) as shown in FIG. 28. More specifically, MOS type transistors MI5, MI6 are used and gate voltages VG1, VG2 thereof are controlled to change ON resistors VRI1, VRI2 of the MOS type transistors MI5, MI6.

This allows a potential difference (the first and the second offset voltages ΔVof1, ΔVof2) occurring between a source and a drain of the MOS type transistors MI5, MI6 due to constant currents II1, II2 flowing through the ON resistors VRI1, VRI2 to be continuously controlled using the gate voltages VG1 and VG2, respectively. As mentioned above, it is preferable to maintain the relation, Δvof1>Δvof2.

(Third Modification)

Figure 29:
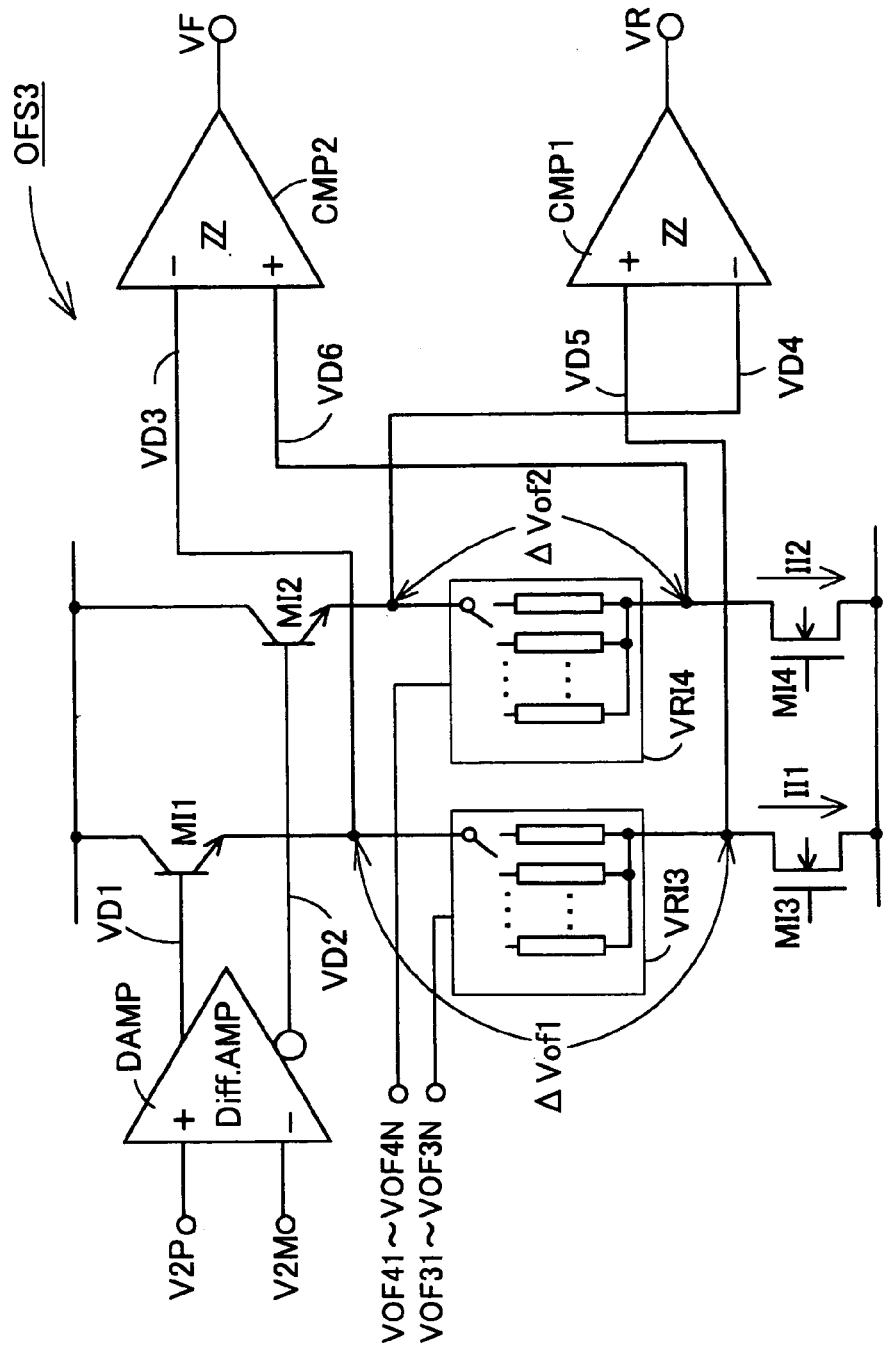
FIG. 29 is a circuit diagram showing a circuit configuration of an offset-added signal generation circuit OFS3 that allows a resistance value to be selected.

FIG. 29 shows a circuit configuration of an offset-added signal generation circuit OFS3 according to a third modification. According to the third modification, an N bit D/A converter is used as changeover variable resistors VRI3, VRI4 instead of the resistors RI1, RI2 in the offset-added signal generation circuit OFS (see FIG. 14). Namely, appropriate changeover among resistors built into the D/A converter VRI3 is performed by sending digital signals through N units of control terminals VOF31 through VOF3N. Similarly, appropriate changeover among resistors built into the D/A converter VRI4 is performed by sending digital signals through N units of control terminals VOF41 through VOF4N.

Thus, it is possible to change in steps a potential difference (the first and the second offset voltages ΔVof1, ΔVof2) occurring between both ends of the D/A converters VRI3, VRI4 due to constant currents II1, II2 flowing therethrough using the control terminals VOF31 through VOF3N and VOF41 through VOF4N, respectively.

Similarly, it is preferable to maintain the relation, Δvof1>Δvof2.

(Fourth Modification)

Figure 30:
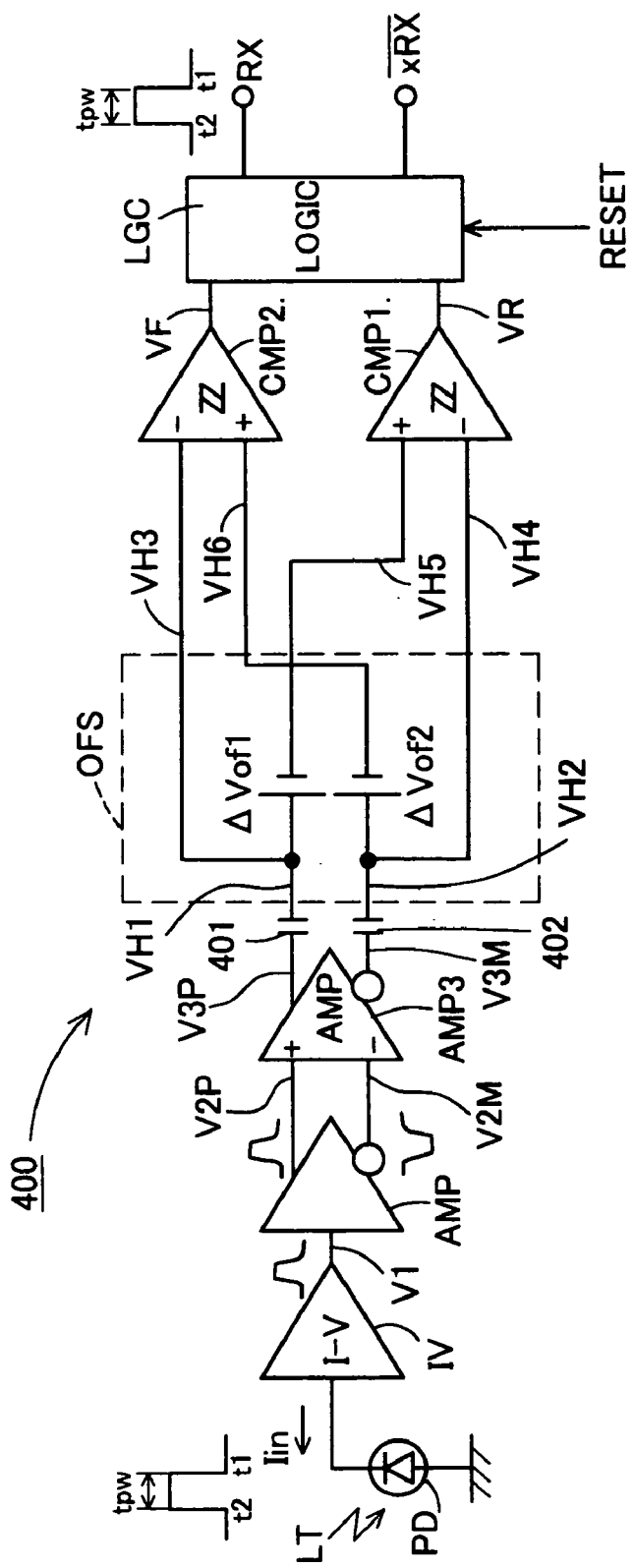
FIG. 30 is a circuit diagram showing a photo-electric pulse conversion circuit according to a fourth modification employing capacitive coupling.

A fourth modification will be explained with reference to FIG. 30. In the above-mentioned photo-electric pulse conversion circuit 300 according to the third embodiment, the voltage signal V1 is amplified by the differential amplification circuit AMP, and further, the differentiating differential amplification circuit DAMP is used to differentiate and amplify the second differential signals V2P, V2M, thereby outputting the differentiated differential signals VD1, VD2. On the other hand, in a photo-electric pulse conversion circuit 400 according to a fourth modification, a differential amplification circuit AMP3 is used instead of the differentiating differential amplification circuit DAMP to generate third differential signals V3P, V3M. These signals are then subjected to high-pass filtration through capacitive coupling capacitors 401, 402 to generate differential signals VH1, VH2 (a non-inversion first signal VH1, an inversion second signal VH2) having waveforms nearly similar to those of the differential signals VD1, VD2 in the third embodiment, and the differential signals VH1, VH2 are inputted to the offset-added signal generation circuit OFS.

Subsequently, as in the third embodiment, the first and the second offset voltages ΔVof1, ΔVof2 are added by the offset-added signal generation circuit OFS to generate a non-inversion third signal VH3, an inversion fourth signal VH4, a non-inversion fifth signal VH5, and an inversion sixth signal VH6. Thereafter, the non-inversion fifth signal VH5 and the inversion fourth signal VH4 are compared with each other by the first comparison circuit CMP1 and the non-inversion third signal VH3 and the inversion sixth signal VH6 are compared with each other by the second comparison circuit CMP2 to generate a seventh signal VR and an eighth signal VF which are then subjected to logic processing performed by the logic processing circuit LGC, thereby obtaining the non-inversion electrical pulse signal RX and the inversion electrical pulse signal xRX.

Even when high-pass filtration by means of capacitive coupling is used instead of differentiating signal waveforms as described above, it is still possible to generate the electrical pulse signals RX, xRX having the pulse width tpw of the optical pulse signal LT.

(Fifth Modification)

In the third embodiment and the first modification, the first and the second comparison circuits CMP1, CMP2 are used to obtain the seventh signal VR and the eighth signal VF, and the SR latch (flip-flop) circuit LGC is used to perform logic processing, thereby obtaining the non-inversion electrical pulse signal RX and the inversion electrical pulse signal xRX. However, the non-inversion input terminals C1P, C2P and the inversion input terminals C1M, C2M of the first and the second comparison circuits CMP1, CMP2 may be interchanged with each other to obtain an inversion seventh signal xVR and an inversion eighth signal xVF, and thereafter a logic processing circuit xLGC may be used to perform logic processing.

Figure 31:
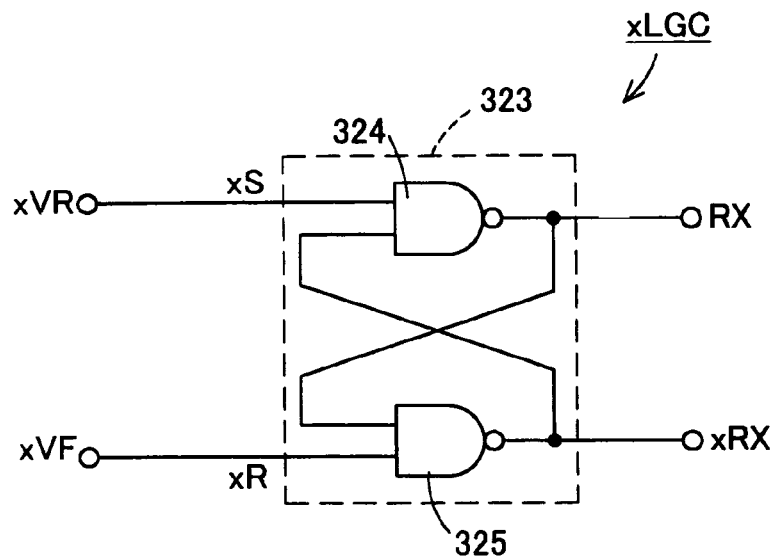
FIG. 31 is a circuit diagram showing a logic circuit of a logic processing circuit xLGC that performs logic processing on the inversion seventh signal and the inversion eighth signal.

An xSxR latch (flip-flop) circuit 323 including NAND devices 324, 325 (see FIG. 31) is an example circuit used as the logic processing circuit xLGC. By using this circuit, the circuit configuration of the logic processing circuit can be made simple.

Figure 32:
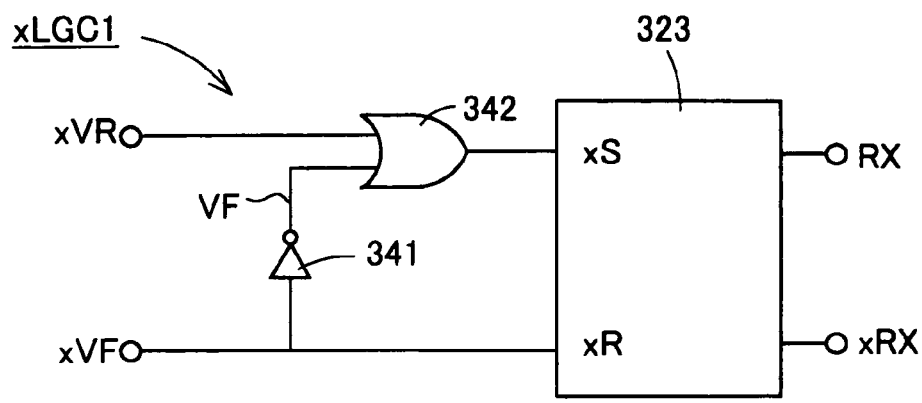
FIG. 32 is a circuit diagram showing a logic circuit of a logic processing circuit xLGC1, in which a measure of the xSxR latch (flip-flop) inhibit logic has been taken.

Another example is a logic processing circuit xLGC1. In the logic processing circuit xLGC1, to prevent a faulty condition due to inhibit logic of the xSxR latch (flip-flop) circuit (that is, both the inversion seventh signal xVR and the inversion eighth signal xVF are at LOW level) and to ensure that the non-inversion electrical pulse signal RX and the inversion electrical pulse signal xRX are correctly output, the inversion eighth signal xVF is inputted to the xR terminal of the xSxR latch (flip-flop) circuit 323, and the eighth signal VF generated by inverting the inversion eighth signal xVF using an inverter device 341, and the inversion seventh signal xVR are subjected to OR processing performed by an OR device 342 to be inputted to the xS terminal as shown in FIG. 32.

Figure 33:
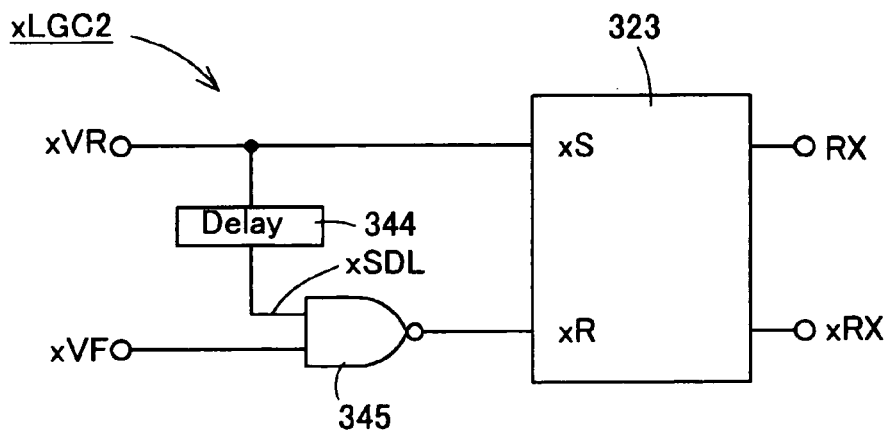
FIG. 33 is a circuit diagram showing a logic circuit of a logic processing circuit xLGC2, in which a measure has been taken against a malfunction of the inversion seventh signal.

A still another example is a logic processing circuit xLGC2. In the logic processing circuit xLGC2, the inversion seventh signal xVR is inputted to the xS terminal of the xSxR latch (flip-flop) circuit 323, and at the same time, the inversion seventh signal xVR is processed by a delay circuit 344 to generate a delayed inversion seventh signal xSDL which is then subjected, together with the inversion eighth signal xVF, to AND processing performed by an AND device 345 to be inputted to the xR terminal as shown in FIG. 33. Thus, even if the level of the inversion seventh signal xVR becomes LOW level due to noise or other reasons, setting the xSxR latch (flip-flop) circuit 323, the xSxR latch (flip-flop) circuit 323 can be forcibly reset after a lapse of a predetermined period of time. Therefore, since logical processing on the inversion seventh signal xVR and the inversion eighth signal xVF are correctly performed there after, it is possible to obtain the correct non-inversion electrical pulse signal RX and the inversion electrical pulse signal xRX.

Figure 34:
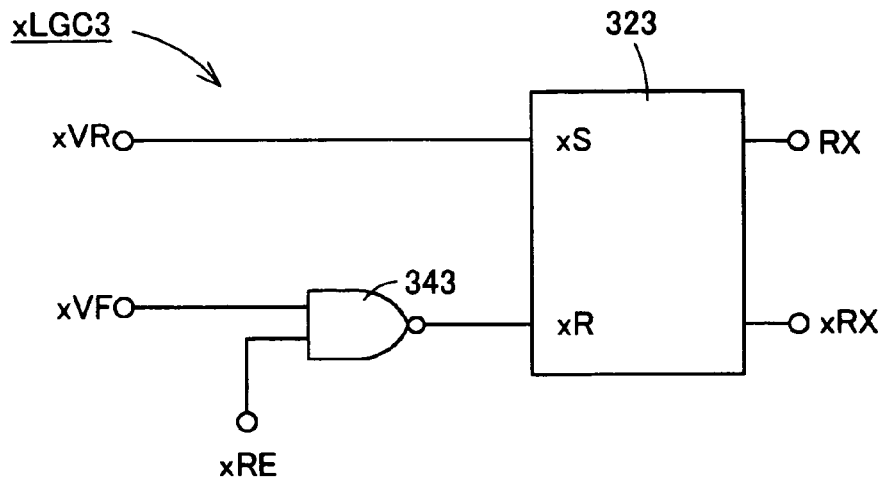
FIG. 34 is a circuit diagram showing a logic circuit of a logic processing circuit xLGC3 that allows an xSxR latch (flip-flop) circuit to be reset.

A further example is a logic processing circuit xLGC3. In the logic processing circuit xLGC3, the inversion seventh signal xVR is inputted to the xS terminal of the xSxR latch (flip-flop) circuit 323, and at the same time, the inversion eighth signal xVF and the inversion reset signal xRE are subjected to OR processing performed by an OR device 343 to be inputted to the xR terminal, as shown in FIG. 34. Thus, the logic processing circuit xLGC3 can be forcibly reset upon starting of the circuit by inputting the inversion reset signal xRE.

While the invention has been described with reference to embodiments and modifications thereof, it is to be understood that the invention is not limited to the embodiments herein and the like and that changes and modifications may be made within the spirit and scope of the invention.

For example, in the first and the second embodiments, the DC offset cancellation circuits 110, 210 are applied to the first differential amplification circuit AMP1 to obtain the inversion electrical pulse signal xRX as an output from the comparison circuit CMP. However, the purpose of the DC offset cancellation circuit according to the invention is not limited to generating a pulse signal through a comparison circuit or the like. That is, the third differential signals V3P, V3M outputted from the first differential amplification circuit AMP1 or the signal VO outputted from the second differential amplification circuit AMP2 may be used for other signal processing.

In the first and the second embodiments, the inversion electrical pulse signal xRX generated by the second differential amplification circuit AMP2, the reference voltage generation circuit REFG, or the comparison circuit CMP is used to perform changeover between the filtering state and the hold state of the function changeover filter LPHS or to perform changeover between the characteristics of the low-pass filter with the characteristics changeover function LPS. That is, the changeover timing is controlled in synchronization with a binary signal (the inversion electrical pulse signal xRX or the non-inversion electrical pulse signal RX) generated by binarizing the differential signals V3P, V3M or the differential signals VD3P, VD3M outputted from the differential amplification circuit using the comparison circuit or the like. Therefore, the changeover timing can be accurately synchronized with the rise and fall of the base pulse signal (the optical pulse signal LT, the current signal Iin, or the like).

However, there is no need of generating the changeover pulse signal xVC from the output from the differential amplification circuit which has performed DC offset cancellation, using the second differential amplification circuit AMP2, the reference voltage generation circuit REFG, or the comparison circuit CMP. A changeover instruction signal may be separately obtained from an inputted signal or the like.

In the second embodiment, the differentiating I–V conversion circuit DIV is used to output the pair of complementary differential voltage signals VD1P, VD1M having waveforms similar to a differentiated waveform of the current signal Iin. However, the current signal Iin may be once converted to a voltage waveform using an I–V conversion circuit IV and a differentiated waveform may be obtained thereafter using a differentiating circuit or a differentiating amplifier. Also, the output from the I–V conversion circuit may be outputted through capacitive coupling or through a high-pass filter to generate a high-pass waveform generally similar to a differentiated waveform which is then processed.

Furthermore, according to the first and the second embodiments, the DC offset voltage of a single-stage first differential amplification circuit AMP1 (the first embodiment) or the differential amplification circuit AMP (the second embodiment) is canceled. However, the DC offset voltage of a multi-stage differential amplification circuit may be canceled.

The invention claimed is:

1. A photo-electric pulse conversion circuit that converts an optical pulse signal to a corresponding electrical pulse signal, comprising:
   a light-current conversion circuit that converts the optical pulse signal to a corresponding current signal and outputs the current signal;
   either a high-pass I–V conversion circuit that converts the current signal to a pair of corresponding differential voltage signals and outputs the differential voltage signals through a capacitive coupling capacitor, or
   a differentiating I–V conversion circuit that converts the current signal to a pair of differential voltage signals with a waveform similar to that of signals which are obtained by differentiation of the current signal;
   a differential amplification circuit with a DC offset cancellation circuit that amplifies the differential voltage signals as a pair of differential input signals and outputs a pair of differential output signals; and
   a pulse generation circuit that outputs the electrical pulse signal based on the differential output signals;
   wherein the differential amplification circuit with the DC offset cancellation circuit comprises:
      a differential amplification circuit that amplifies the differential input signals inputted to a pair of differential input terminals and outputs the differential output signals from a pair of differential output terminals; and
      a DC offset cancellation circuit inserted between the differential output terminals and the differential input terminals of the differential amplification circuit, the DC offset cancellation circuit being adapted to cancel a-DC offset voltage between the differential output signals; and
      the DC offset cancellation circuit comprises:
         a low-pass filter that performs low-pass filtration on the differential output signals inputted thereto so as to output a filtered signal;
         a mixing circuit that outputs a pair, of mixed differential input signals, which are generated by mixing the filtered signal into the differential input signals such that a negative feedback-is performed, to the differential input terminals of the differential amplification circuit; and
         a characteristics changing circuit that changes a cutoff frequency and a slew rate of the low-pass filter.

2. A photo-electric pulse conversion circuit that converts an optical pulse signal of a generally square wave shape to at least either a non-inversion electrical pulse signal that falls at a first timing at which the optical pulse signal falls and rises at a second timing at which the optical pulse signal rises or an inversion electrical pulse signal that rises at the first timing and falls at the second timing, comprising:
   a light-current conversion circuit that converts the optical pulse signal to a corresponding current signal and outputs the current signal;
   ether a high-pass I–V conversion circuit that converts the current signal to a pair of corresponding differential voltage signals and outputs the differential voltage signals through a capacitive coupling capacitor or outputs the differential voltage signals after passing it through the capacitor and then amplifying it, or a differentiating I–V conversion circuit that converts the current signal to a pair of differential voltage signals with a waveform similar to differentiated waveform of the current signal and outputs the differential voltage signals;
   a differential amplification circuit that amplifies the differential voltage signals and outputs a pair of differential output signals; and
   a pulse generation circuit that outputs at last ether the non-inversion electrical pulse signal or the inversion electrical pulse signal based on the differential output signals;
   the differential amplification circuit comprising:
      a low-pass filter that performs low-pass filtration on the differential output signal inputted thereto so as to output a filtered signal;
      a mixing circuit that outputs a mixed differential input signal, which is generated by mixing the filtered signal into the differential voltage signals such that a negative feedback is performed, to a pair of differential input terminals of the differential amplification circuit; and
      a characteristics changeover circuit that performs changeover to a first state in which the cutoff frequency of the low-pass filter is a first cutoff frequency $fc1$ and the slew rate thereof is a first slew rate $SR1$ at the first timing and performs changeover to a second state in which the cutoff frequency of the low-pass filter is a second cutoff frequency $fc2$ and the slew rate thereof is a second slew rate $SR2$ at the second timing, according to the inputted non-inversion electrical pulse signal or the inversion electrical pulse signal.

3. The photo-electric pulse conversion circuit according to claim 2, wherein when the pulse signal has an average duty ratio $Da$, the first cutoff $fc1$ and the second cutoff frequency $fc2$ of the low-pass filter characteristics satisfy a relation expressed by an equation $fc2/fc1=(1-Da)/Da$.

4. The photo-electric pulse conversion circuit according to claim 2, wherein when the pulse signal has an average duty ratio $Da$, the first slew rate $SR1$ and the second slew rate $SR2$ of the low-pass filter characteristics satisfy a relation expressed by an equation $SR2/SR1=(1-Da)/Da$.

5. The photo-electric pulse conversion circuit according to claim 1,
   wherein the characteristics changing circuit is a characteristics changeover circuit that performs changeover either to a first state in which the cutoff frequency of the low-pass filter is a first cutoff frequency $fc1$ and the slew rate thereof is a first slew rate $SR1$, or to a second state in which the cutoff frequency of the low-pass filter is a second cutoff frequency fc2 and the slew rate thereof is a second slew rate SR2;

the DC offset cancellation circuit comprises a characteristics changeover instruction circuit that, when the differential input signals are a pair of pulse differentiated differential input signals obtained by subjecting a base pulse signal of a generally square wave, shape to differentiation or high-pass filtration, outputs a characteristics changeover pulse signal giving an instruction for changeover to the first state at a first timing at which the base pulse signal falls and a characteristics changeover pulse signal giving an instruction for changeover to the second state at a second timing at which the base pulse signal rises; and the characteristics changeover circuit is configured so as to change the state of the low-pass filter from the second state to the first state at the first timing and to change the state of the low-pass filter from the first state to the second state at the second timing according to the inputted characteristics changeover pulse signal.

6. The photo-electric pulse conversion circuit according to claim 5, wherein the characteristics changeover instruction circuit outputs the characteristics changeover pulse signal that rises or falls to invert a logic state thereof at the first timing and falls or rises to re-invert the logic state thereof at the second timing.

7. The photoelectric pulse conversion circuit according to claim 5, wherein when the base pulse signal has an average duty ratio Da, the first cutoff fc1 and the second cutoff frequency fc2 of the low-pass filter characteristics satisfy a relation expressed by an equation fc2/fc1=(1-Da)/Da.

8. The photo-electric pulse conversion circuit according to claim 5, wherein when the base pulse signal has an average duty ratio Da, the first slew rate SR1 and the second slew rate SR2 of the low-pass filter characteristics satisfy a relation expressed by an equation SR2/SR1=(1-Da)/Da.

* * * * *